(12) United States Patent
Morimoto et al.

(10) Patent No.: US 10,096,608 B2
(45) Date of Patent: Oct. 9, 2018

(54) SEMICONDUCTOR DEVICE INCLUDING MEMORY CELL ARRAY AND POWER SUPPLY REGION

(71) Applicant: Renesas Electronics Corporation, Tokyo (JP)

(72) Inventors: Masao Morimoto, Tokyo (JP); Noriaki Maeda, Tokyo (JP); Yasuhisa Shimazaki, Tokyo (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/616,633

(22) Filed: Jun. 7, 2017

(65) Prior Publication Data
US 2017/0271344 A1   Sep. 21, 2017

Related U.S. Application Data

(63) Continuation of application No. 15/165,651, filed on May 26, 2016, now Pat. No. 9,704,873, which is a (Continued)

(30) Foreign Application Priority Data

Jul. 26, 2011 (JP) ................................. 2011-162953

(51) Int. Cl.
*H01L 27/092* (2006.01)
*H01L 27/11* (2006.01)
(Continued)

(52) U.S. Cl.
CPC ...... *H01L 27/1116* (2013.01); *G06F 17/5072* (2013.01); *G11C 11/412* (2013.01);
(Continued)

(58) Field of Classification Search
CPC ............ H01L 27/0207; H01L 27/0922; H01L 27/0928; H01L 27/1104; H01L 27/1116; G06F 17/5072; G11C 11/412
See application file for complete search history.

(56) References Cited

U.S. PATENT DOCUMENTS 5,338,963 A   8/1994 Klassen et al.
6,347,062 B2  2/2002 Nii et al.
(Continued)

FOREIGN PATENT DOCUMENTS

JP   07-7089 A       1/1995
JP   2000-036543 A   2/2000
(Continued)

OTHER PUBLICATIONS

Japanese Office Action for related Japanese Application No. 2011-162953, dated Nov. 4, 2014.
(Continued)

*Primary Examiner* — Stephen W Smoot
(74) *Attorney, Agent, or Firm* — Shapiro, Gabor and Rosenberger, PLLC

(57) ABSTRACT

A semiconductor device having an SRAM which includes: a monolithic first active region in which a first transistor and a fifth transistor are disposed; a second active region separated from the first active region, in which a second transistor is disposed; a monolithic third active region in which a third transistor and a sixth transistor are disposed; and a fourth active region separated from the third active region, in which a fourth transistor is disposed. Each driver transistor is divided into a first transistor and a second transistor (or a third transistor and a fourth transistor) and these driver transistors are disposed over different active regions.

4 Claims, 63 Drawing Sheets

Related U.S. Application Data continuation of application No. 14/921,038, filed on Oct. 23, 2015, now Pat. No. 9,385,133, which is a continuation of application No. 14/579,898, filed on Dec. 22, 2014, now Pat. No. 9,196,622, which is a continuation of application No. 13/559,461, filed on Jul. 26, 2012, now Pat. No. 8,957,459.

(51) Int. Cl.
  *H01L 27/02* (2006.01)
  *G11C 11/412* (2006.01)
  *H01L 23/528* (2006.01)
  *G06F 17/50* (2006.01)

(52) U.S. Cl.
  CPC ........ *H01L 23/528* (2013.01); *H01L 27/0207* (2013.01); *H01L 27/0928* (2013.01); *H01L 27/1104* (2013.01)

(56) References Cited

U.S. PATENT DOCUMENTS

| | | | |
|---|---|---|---|
| 6,529,401 | B2 | 3/2003 | Nii |
| 6,677,649 | B2 | 1/2004 | Osada et al. |
| 6,909,135 | B2 | 6/2005 | Nii et al. |
| 7,113,421 | B2 | 9/2006 | Maeda et al. |
| 7,830,703 | B2 | 11/2010 | Takeda et al. |
| 7,994,583 | B2 | 8/2011 | Inaba |
| 8,315,084 | B2 * | 11/2012 | Liaw .................... G11C 11/413 365/154 |
| 8,604,557 | B2 | 12/2013 | Ohkawa |
| 2005/0094434 | A1 | 5/2005 | Wantanabe et al. |
| 2008/0197419 | A1 | 8/2008 | Liaw |
| 2008/0212392 | A1 | 9/2008 | Bauer |
| 2009/0016144 | A1 | 1/2009 | Masuo et al. |
| 2009/0052262 | A1 | 2/2009 | Nii |
| 2011/0222332 | A1 | 9/2011 | Liaw et al. |
| 2012/0086082 | A1 | 4/2012 | Malinge et al. |
| 2014/0232009 | A1 | 8/2014 | Liaw |

FOREIGN PATENT DOCUMENTS

| | | |
|---|---|---|
| JP | 2001-028401 A | 1/2001 |
| JP | 2002-043441 A | 2/2002 |
| JP | 2002-237539 A | 8/2002 |
| JP | 2002-353413 A | 12/2002 |
| JP | 2006-085786 A | 3/2006 |
| JP | 2008-288272 A | 11/2008 |
| JP | 2009-043304 A | 2/2009 |
| JP | 2009-147174 A | 7/2009 |
| JP | 2010-166056 A | 7/2010 |
| WO | WO 2005/119763 A1 | 12/2005 |
| WO | WO 2007/091541 A1 | 8/2007 |

OTHER PUBLICATIONS

Extended European Search Report dated May 28, 2013, in European Patent Application No. 12174559.0.
Office Action dated Dec. 22, 2015, in Japanese Application No. 2015-033918.
Office Action dated Jan. 31, 2017, in Japanese Patent Application No. 2016-076523.

* cited by examiner

FIG. 18

| F | ꓱ |
|---|---|
| F´ | `ꓱ |
| ⌶ | ⌷ |

SEMICONDUCTOR DEVICE INCLUDING MEMORY CELL ARRAY AND POWER SUPPLY REGION

CROSS-REFERENCE TO RELATED APPLICATIONS

The disclosure of Japanese Patent Application No. 2011-162953 filed on Jul. 26, 2011 including the specification, drawings and abstract is incorporated herein by reference in its entirety.

BACKGROUND

The present invention relates to semiconductor devices and more particularly to technology useful for semiconductor devices having SRAMs.

SRAM (Static Random Access Memory) is a kind of semiconductor memory which stores data using a flip-flop. Specifically, in an SRAM, data (1 or 0) is stored in two cross-coupled inverters comprised of four transistors. In addition, two access transistors are required for reading and writing, so in a typical SRAM, a memory cell is comprised of six transistors.

For example, Japanese Unexamined Patent Publication No. 2001-28401 discloses a semiconductor memory device having a static RAM memory cell comprised of six transistors (FIG. 1).

Also, Japanese Unexamined Patent Publication No. 2002-237539 discloses an SRAM memory cell (FIG. 32) in which NMOS transistors (N1 and N4) are formed in one P well region (PW0) and NMOS transistors (N2 and N3) are formed in the other P well region (PW1) with an N well region (NW) between the P well regions for the purpose of improving soft-error immunity.

Japanese Unexamined Patent Publication No. Hei7 (1995)-7089 discloses an SRAM memory cell in which two divided driver NMOS transistors (transistor regions N1', N1'', N2', and N2'') are disposed over different P wells (FIG. 5) in order to improve soft-error immunity. In addition, in this SRAM cell, the gate direction of word line access transistors (NA1 and NB1) is perpendicular to the gate direction of the driver NMOS transistors (transistor regions N1', N1'', N2', and N2'').

Japanese Unexamined Patent Publication No. 2002-43441 discloses an SRAM memory cell in which an N channel MOS transistor (N1) with the main axis of a polysilicon wiring layer (PL11) as a gate electrode and an N channel MOS transistor (N') with the fold-back axis of the polysilicon wiring layer (PL11) as a gate electrode are formed in a first P well region (PW1) (FIGS. 1 and 2 and paragraph [0062]).

Japanese Unexamined Patent Publication No. 2000-36543 discloses an SRAM memory cell in which two word lines (21a and 21b) are orthogonal to a p-type active region (13) around both ends thereof and parallel to each other and their length is short, or equivalent to about ½ bit, and common gate lines (22a and 22b) are orthogonal to both the p-type active region (13) and n-type active region (14) between the word lines (21a and 21b) and parallel to each other and equally spaced along with the word lines (21a and 21b) (FIG. 4). In the above explanation, the signs and numbers in parentheses are reference signs and drawing numbers which are used in the related art documents.

SUMMARY

As described in Japanese Unexamined Patent Publication No 2001-28401 (FIG. 1 and so on), SRAM memory cells have complicated patterns and the tendency toward the miniaturization of semiconductor devices is growing, posing various problems such as fluctuations in device characteristics (gate width variation, etc) and difficulties in simulating memory characteristics.

Fluctuations in device characteristics are attributable to the shape of active regions or the shape of gate electrodes as described later.

With this background, optimization of the active region shape and gate electrode shape is expected in order to improve the controllability of device characteristics and make characteristics simulations easier.

An object of the present invention is to provide a semiconductor device with good characteristics. In particular, the invention is intended to provide a cell layout which improves the characteristics of a semiconductor device having an SRAM memory cell.

The above and further objects and novel features of the invention will more fully appear from the following detailed description in this specification and the accompanying drawings.

According to a first aspect of the present invention, a semiconductor device has a memory cell which includes elements (a1) to (a8) as described below.

(a1) is a first conductivity type first MIS transistor coupled between a first voltage and a first node.

(a2) is a second conductivity type first MIS transistor coupled between the first node and a second voltage different from the first voltage.

(a3) is a second conductivity type second MIS transistor coupled between the first node and the second voltage in parallel with the second conductivity type first MIS transistor.

(a4) is a first conductivity type second MIS transistor coupled between the first voltage and a second node.

(a5) is a second conductivity type third MIS transistor coupled between the second node and the second voltage.

(a6) is a second conductivity type fourth MIS transistor coupled between the second node and the second voltage in parallel with the second conductivity type third MIS transistor.

(a7) is a second conductivity type fifth MIS transistor coupled between the first node and a first bit line.

(a8) is a second conductivity type sixth MIS transistor coupled between the second node and a second bit line.

The semiconductor device further includes active regions (b1) to (b4) as described below.

(b1) is a monolithic first active region in which the second conductivity type first MIS transistor and the second conductivity type fifth MIS transistor are disposed.

(b2) is a second active region separated from the first active region, in which the second conductivity type second MIS transistor is disposed.

(b3) is a monolithic third active region in which the second conductivity type third MIS transistor and the second conductivity type sixth MIS transistor are disposed.

(b4) is a fourth active region separated from the third active region, in which the second conductivity type fourth MIS transistor is disposed.

The first to fourth active regions are arranged side by side in a first direction and spaced from each other.

A first gate wiring extends in the first direction over the first active region.

A second gate wiring extends in the first direction over the first active region and the second active region.

A third gate wiring extends in the first direction over the third active region.

A fourth gate wiring extends in the first direction over the third active region and the fourth active region.

According to a second aspect of the invention, a semiconductor device also includes the above elements (a1) to (a8). The semiconductor device also includes active regions (b1) and (b2). In this case, (b1) is a monolithic first active region in which the second conductivity type first transistor, the second conductivity type fourth transistor, and the second conductivity type fifth transistor are disposed. (b2) is a monolithic second active region in which the second conductivity type third transistor, the second conductivity type second transistor, and the second conductivity type sixth transistor are disposed. The first active region and the second active region are arranged side by side in a first direction. Furthermore, a first gate wiring extends in the first direction over the first active region and a second gate wiring extends in the first direction over the first active region and the second active region. A third gate wiring extends in the first direction over the first active region and the second active region; and a fourth gate wiring extends in the first direction over the second active region.

According to a third aspect of the invention, a semiconductor device also includes the above elements (a1) to (a8). The semiconductor device also includes active regions (b1) and (b2). In this case, (b1) is a monolithic first active region in which the second conductivity type first transistor, the second conductivity type fourth transistor, and the second conductivity type fifth transistor are disposed and (b2) is a monolithic second active region in which the second conductivity type third transistor, the second conductivity type second transistor, and the second conductivity type sixth transistor are disposed. The first active region and the second active region are arranged side by side in a first direction. Furthermore, a first gate wiring extends in the first direction over the first active region and a second gate wiring extends in the first direction over the first active region and the second active region. A third gate wiring extends in the first direction over the first active region and the second active region and a fourth gate wiring extends in the first direction over the first active region.

According to the preferred embodiments of the present invention as described below, semiconductor device characteristics are improved.

BRIEF DESCRIPTION OF THE DRAWINGS

FIG. 18 is a plan view schematically showing SRAM memory cells and tap cell regions according to the first embodiment;

DETAILED DESCRIPTION

Figure 1:
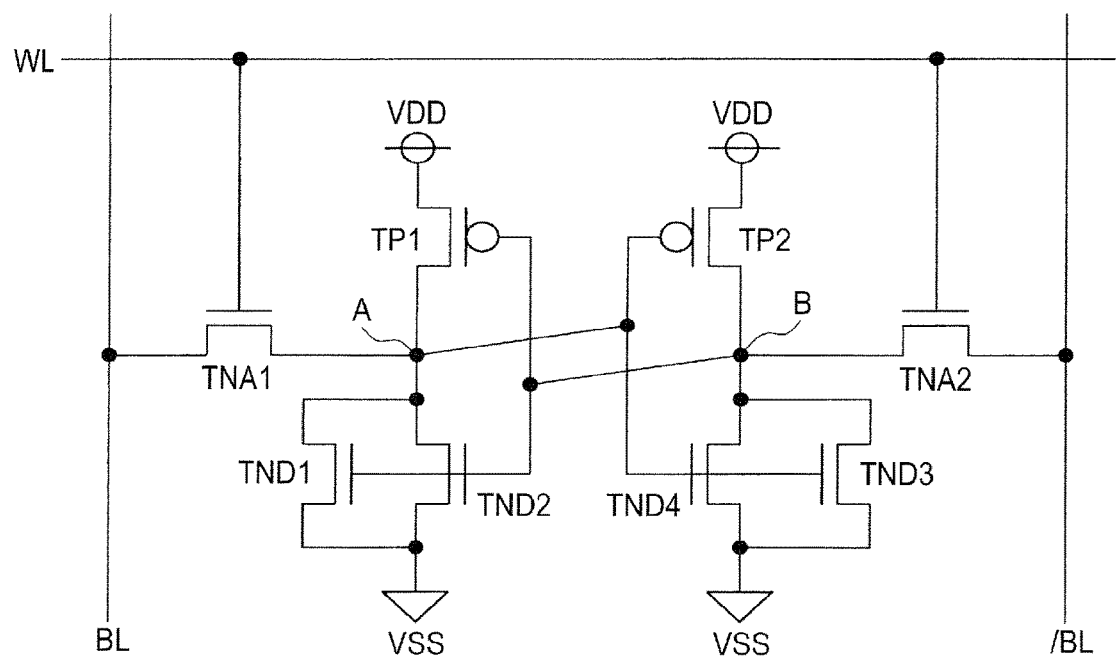
FIG. 1 is an equivalent circuit diagram showing an SRAM memory cell according to a first embodiment of the invention.

Descriptions of the preferred embodiments will be made below in different sections or separately as necessary, but such descriptions are not irrelevant to each other unless otherwise specified. One description may be, in whole or in part, a modified, applied, detailed or supplementary form of another. Also, regarding the preferred embodiments described below, even when a specific number (the number of pieces, numerical value, quantity, range, etc.) is indicated for an element, it should be interpreted that it is not limited to the specific number unless otherwise specified or theoretically limited to that number; it may be larger or smaller than the specific number.

In the preferred embodiments described below, constituent elements (including constituent steps) are not necessarily essential unless otherwise specified or theoretically essential. Similarly, in the preferred embodiments described below, even when a specific form or positional relation is indicated for an element, it should be interpreted to include a form or positional relation which is virtually equivalent or similar to the specific form or positional relation unless otherwise specified or theoretically limited to the specific form or positional relation. The same can be said of numerical data (the number of pieces, numerical value, quantity, range, etc.) as mentioned above.

Next, the preferred embodiments will be described in detail referring to the accompanying drawings. In all the drawings that illustrate the preferred embodiments, elements with like functions are designated by like reference numerals and repeated descriptions thereof are omitted. When a plurality of like members or portions are provided, a specific reference sign may be added to the generic reference sign for them in order to express a specific member or portion. Regarding the preferred embodiments below, basically descriptions of the same or similar elements are not repeated except when necessary.

Regarding the drawings that illustrate preferred embodiments, hatching may be omitted even in a sectional view for easy understanding and hatching may be used even in a plan view for easy understanding.

First Embodiment

[Circuit Configuration]

The semiconductor device (semiconductor memory device, semiconductor integrated circuit device) according to a first embodiment has SRAM memory cells. FIG. 1 is an equivalent circuit diagram showing an SRAM memory cell according to the first embodiment. As shown in the figure, the memory cell is located at the intersection of a pair of bit lines (bit line BL and bit line /BL) and a word line WL. The memory cell includes a pair of load transistors (load MOSs, load transistors, or load MISFETs) TP1 and TP2, a pair of access transistors (access MOSs, access transistors, access MISFETs, or transfer transistors) TNA1 and TNA2, and a pair of driver transistors (driver MOSs, driver transistors, or driver MISFETs) TND2 and TND4.

This embodiment has a driver transistor TND1 coupled in parallel with the driver transistor TND2. It also has a driver transistor TND3 coupled in parallel with the driver transistor TND4. Among the eight transistors of the memory cell, the load transistors (TP1 and TP2) are p-type (p-channel) transistors of the first conductivity type and the access transistors (TNA1 and TNA2) and driver transistors (TND1, TND2, TND3, and TND4) are n-type (n-channel) transistors of the second conductivity type.

MOS is an abbreviation for Metal Oxide Semiconductor and MISFET is an abbreviation for Metal Insulator Semiconductor Field Effect Transistor. Hereinafter, the load transistors, access transistors, and driver transistors are sometimes simply called "transistors." Also a transistor may be hereinafter indicated only by the reference sign for that transistor.

Among the eight transistors of the memory cell, TND2 and TP1 make up a CMOS (complementary MOS) inverter (or CMIS inverter) and TND4 and TP2 make up another CMOS inverter. The input/output terminals (storage nodes A and B) of this pair of CMOS inverters are cross-coupled, making up a flip-flop circuit as a data memory which stores data for one bit.

In the SRAM memory cell according to this embodiment, since TND1 and TND3 are located in parallel with TND2 and TND4 respectively, it can be considered that TND1, TND2, and TP1 make up a CMOS inverter and TND3, TND4, and TP2 make up the other CMOS inverter.

The interconnection arrangement of the eight transistors of the SRAM memory cell according to this embodiment is explained in detail below.

TP1 is coupled between the supply voltage (VDD, primary supply voltage) and the storage node A, and TND1 and TND2 are coupled in parallel with each other between the storage node A and grounding voltage (VSS, GND, reference voltage, secondary supply voltage lower than the primary supply voltage, or secondary supply voltage different from the primary supply voltage), and the gate electrodes of TP1, TND1, and TND2 are coupled to the storage node B.

TP2 is coupled between the supply voltage and the storage node B, and TND3 and TND4 are coupled in parallel with each other between the storage node B and grounding voltage, and the gate electrodes of TP2, TND3, and TND4 are coupled to the storage node A.

TNA1 is coupled between the bit line BL and storage node A, and TNA2 is coupled between the bit line /BL and storage node B, and the gate electrodes of TNA1 and TNA2 are coupled to the word line WL.

As can be understood from the above explanation, in the SRAM memory cell according to this embodiment, each driver transistor is considered as being divided into two transistors (TND1 and TND2, and TND3 and TND4).

Since TND1 and TND2 share a gate electrode, they may be thought to make up a single transistor, but in the explanation below, they will be treated as two different transistors. The same is true for TND3 and TND4.

[Circuit Operation]

Next, how the SRAM memory cell circuit operates will be described. When the voltage of the CMOS inverter storage node A is high (H), TND3 and TND4 are turned on, so the voltage of the storage node B of the other CMOS inverter is low (L). Therefore, TND1 and TND2 are turned off and the voltage of the storage node A is kept high (H). In other words, the latch circuit in which a pair of CMOS inverters are cross-coupled holds the state of each of the storage nodes A and B, so that while the supply voltage is applied, the data is saved.

On the other hand, the gate electrode of each of TNA1 and TNA2 is coupled to the word line WL. When the voltage of the word line WL is high (H), TNA1 and TNA2 are turned on and the flip-flop circuit and the bit lines (BL and /BL) are electrically coupled, so the voltage state (H or L) of the storage nodes A and B appears on the bit lines BL and /BL and is read as memory cell data.

In order to write data in the memory cell, the voltage of the word line WL should be high (H) and turn on TNA1 and TNA2 so that the flip-flop circuit and bit lines (BL and /BL) are electrically coupled to transfer data (a combination of H and L or a combination of L and H) of the bit lines (BL and /BL) to the storage nodes A and B to store the data as mentioned above.

[Configuration of the SRAM]
[Memory Cell Structure]

Figure 2:
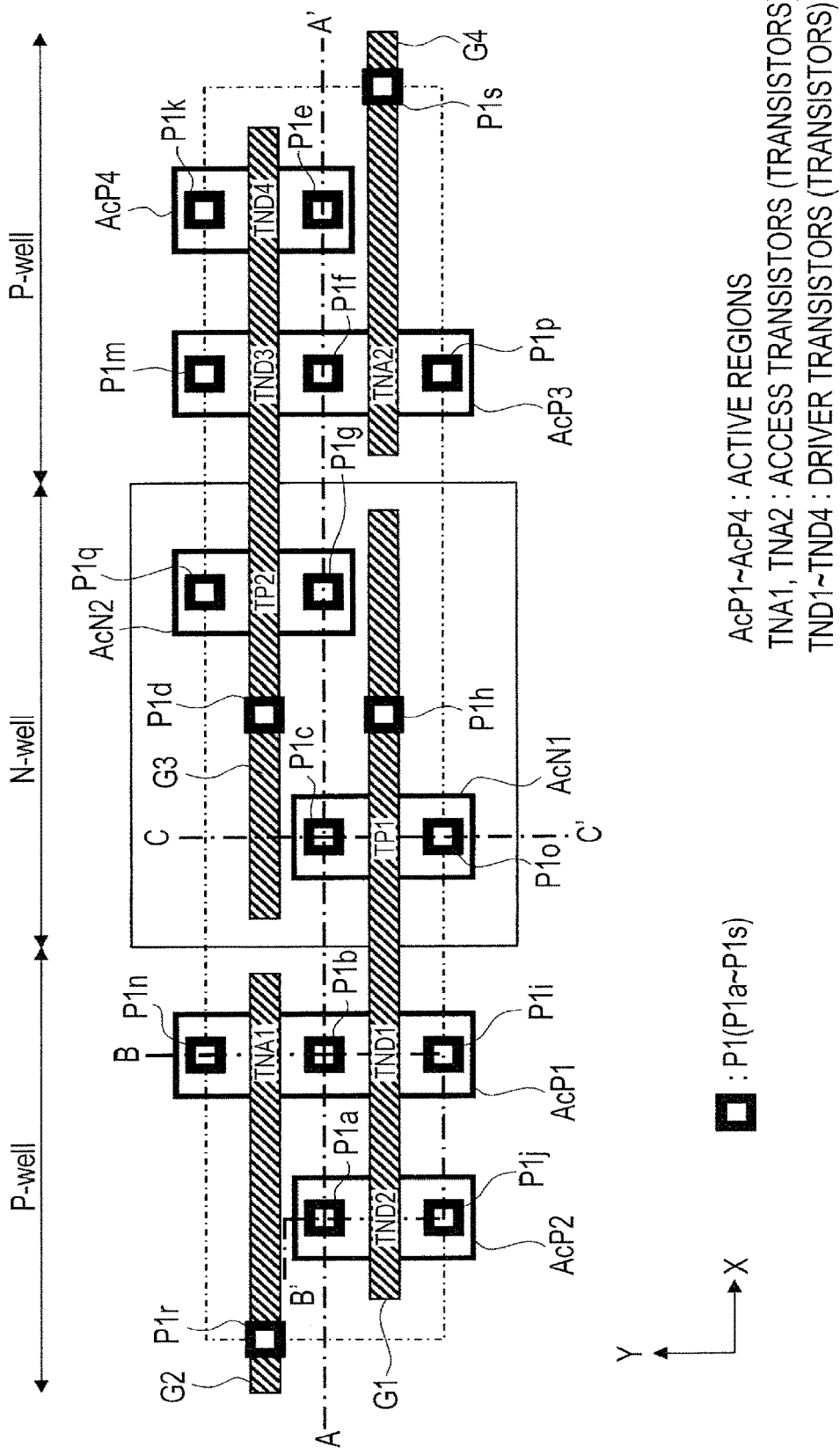
FIG. 2 is a plan view showing the SRAM memory cell structure according to the first embodiment.
Figure 3:
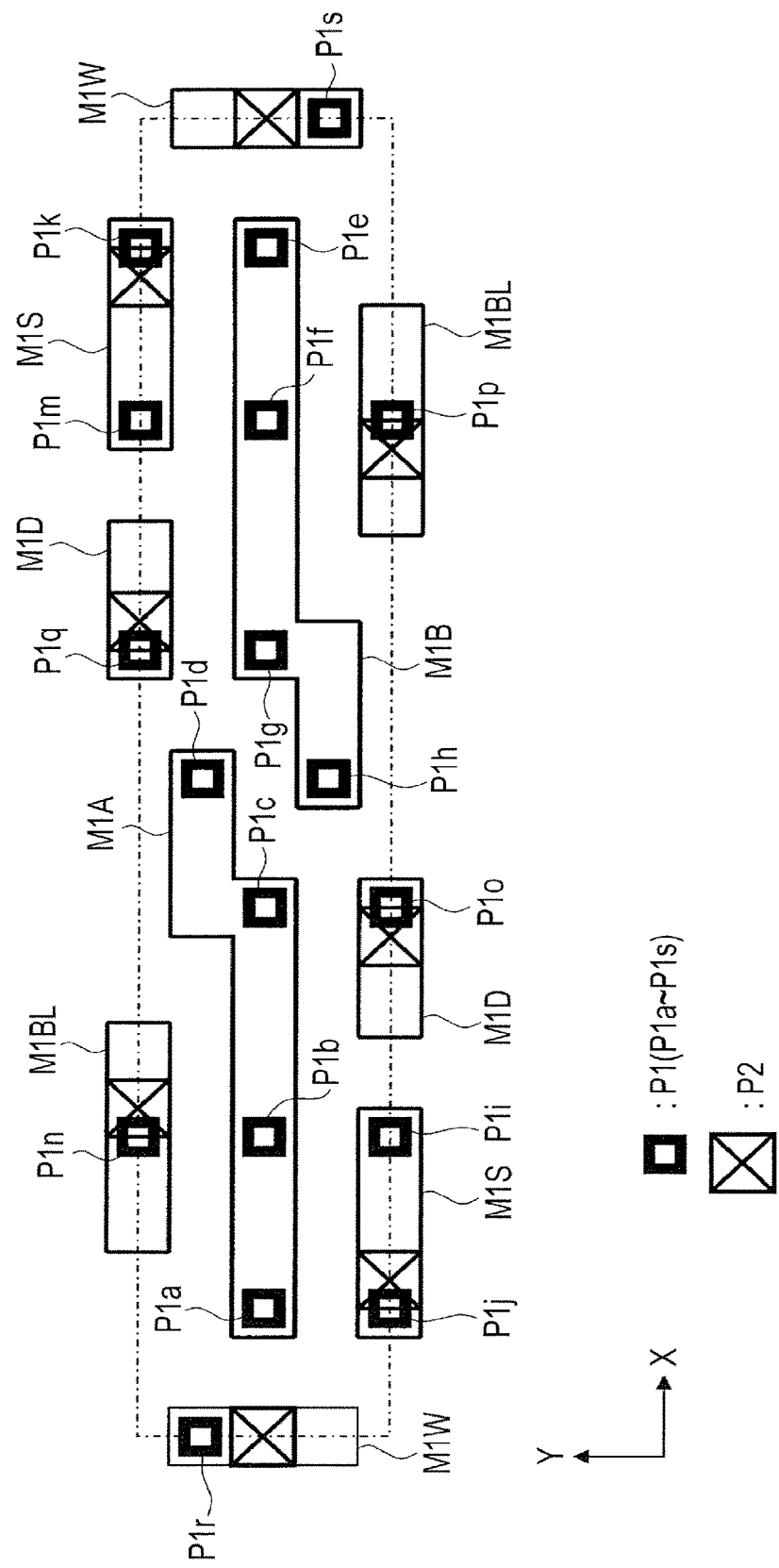
FIG. 3 is a plan view showing the SRAM memory cell structure according to the first embodiment.
Figure 4:
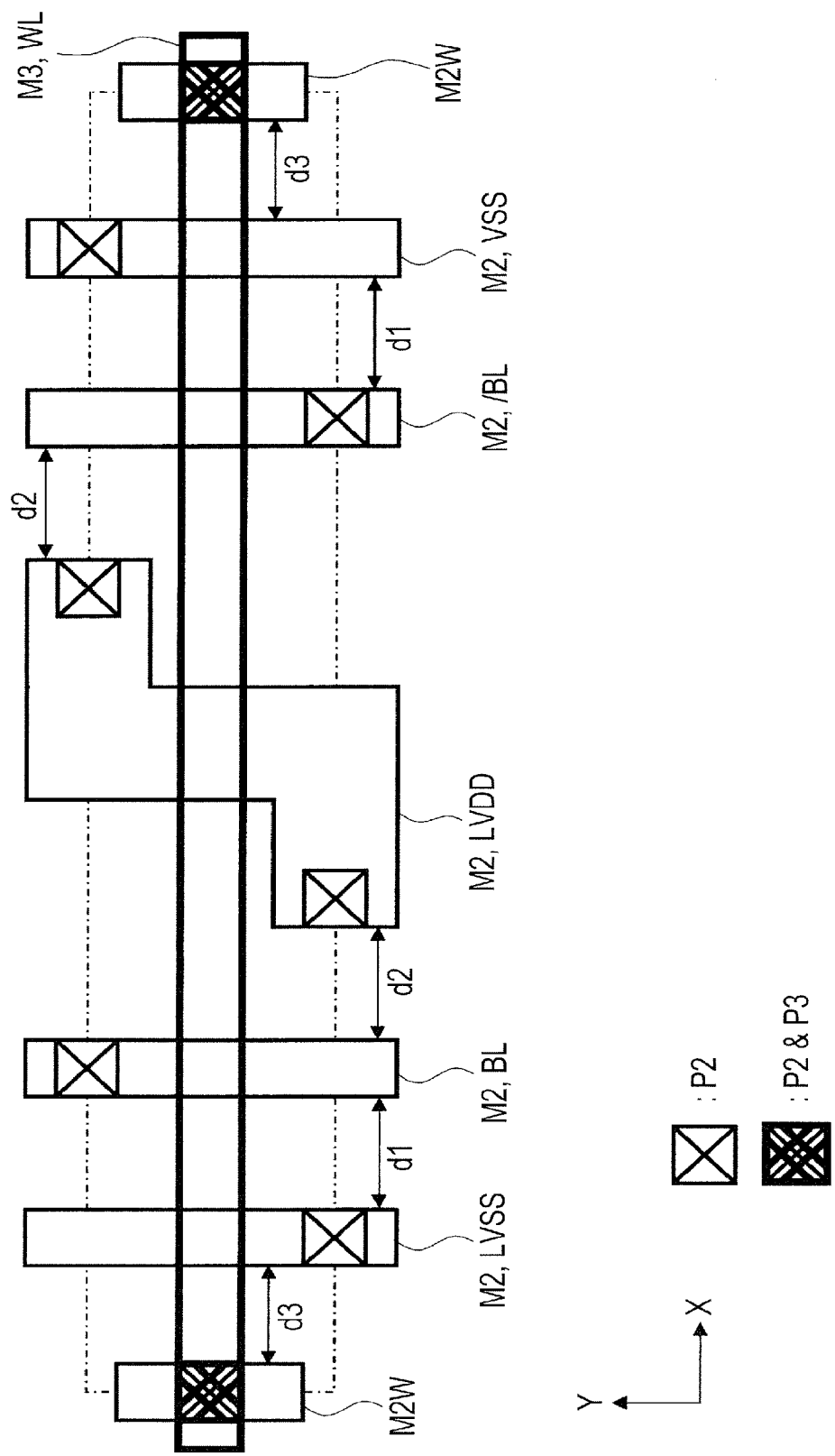
FIG. 4 is a plan view showing the SRAM memory cell structure according to the first embodiment.

FIGS. 2 to 4 are plan views showing the SRAM memory cell structure according to the first embodiment. FIG. 2 shows the arrangement of active regions Ac, gate electrodes G, and first plugs P1. FIG. 3 shows the arrangement of the first plugs P1, first layer wirings M1, and second plugs P2. FIG. 4 shows the arrangement of the second plugs P2, second layer wirings M2, third plugs P3, and third layer wiring M3. When the plan views of FIGS. 2 and 3 are placed one upon the other with reference to the first plugs P1, the positional relation between the patterns shown in FIGS. 2 and 3 becomes clear. When the plan views of FIGS. 3 and 4 are placed one upon the other with reference to the second plugs P2, the positional relation between the patterns shown in FIGS. 3 and 4 becomes clear. The rectangular area surrounded by the chain line in the figures denotes one memory cell region (for 1 bit).

Figure 6:
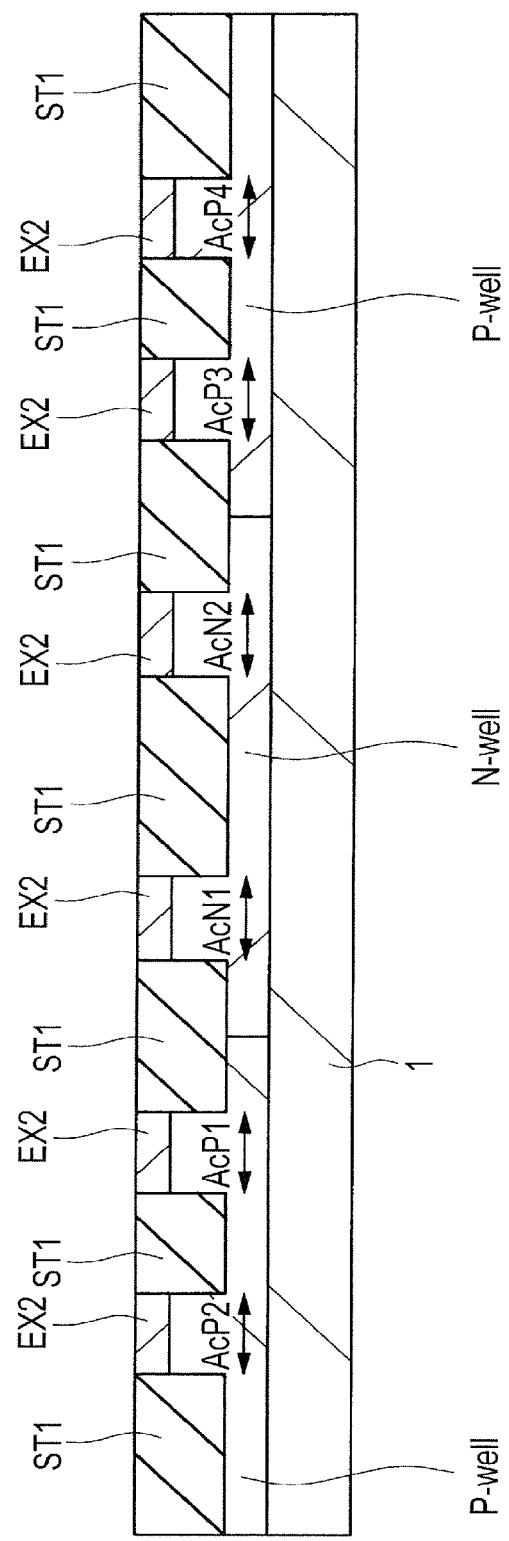
FIG. 6 is a sectional view of the SRAM memory cell structure according to the first embodiment.
Figure 7:
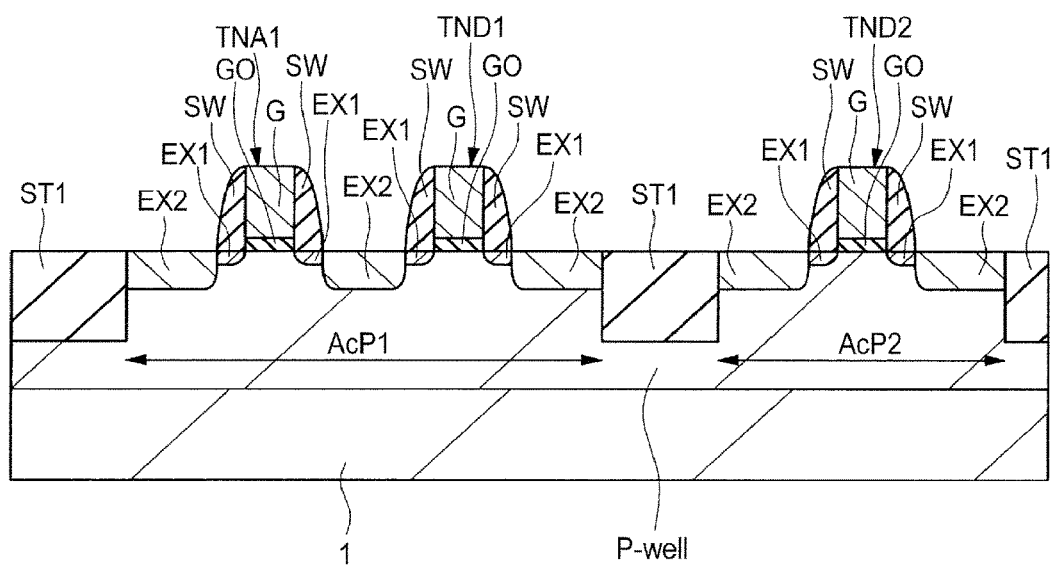
FIG. 7 is a sectional view of the SRAM memory cell structure according to the first embodiment.
Figure 8:
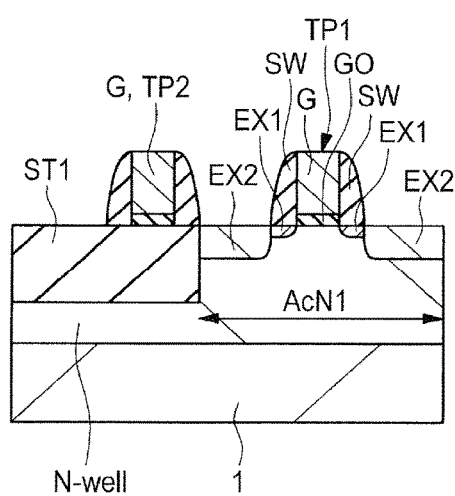
FIG. 8 is a sectional view of the SRAM memory cell structure according to the first embodiment.
Figure 9:
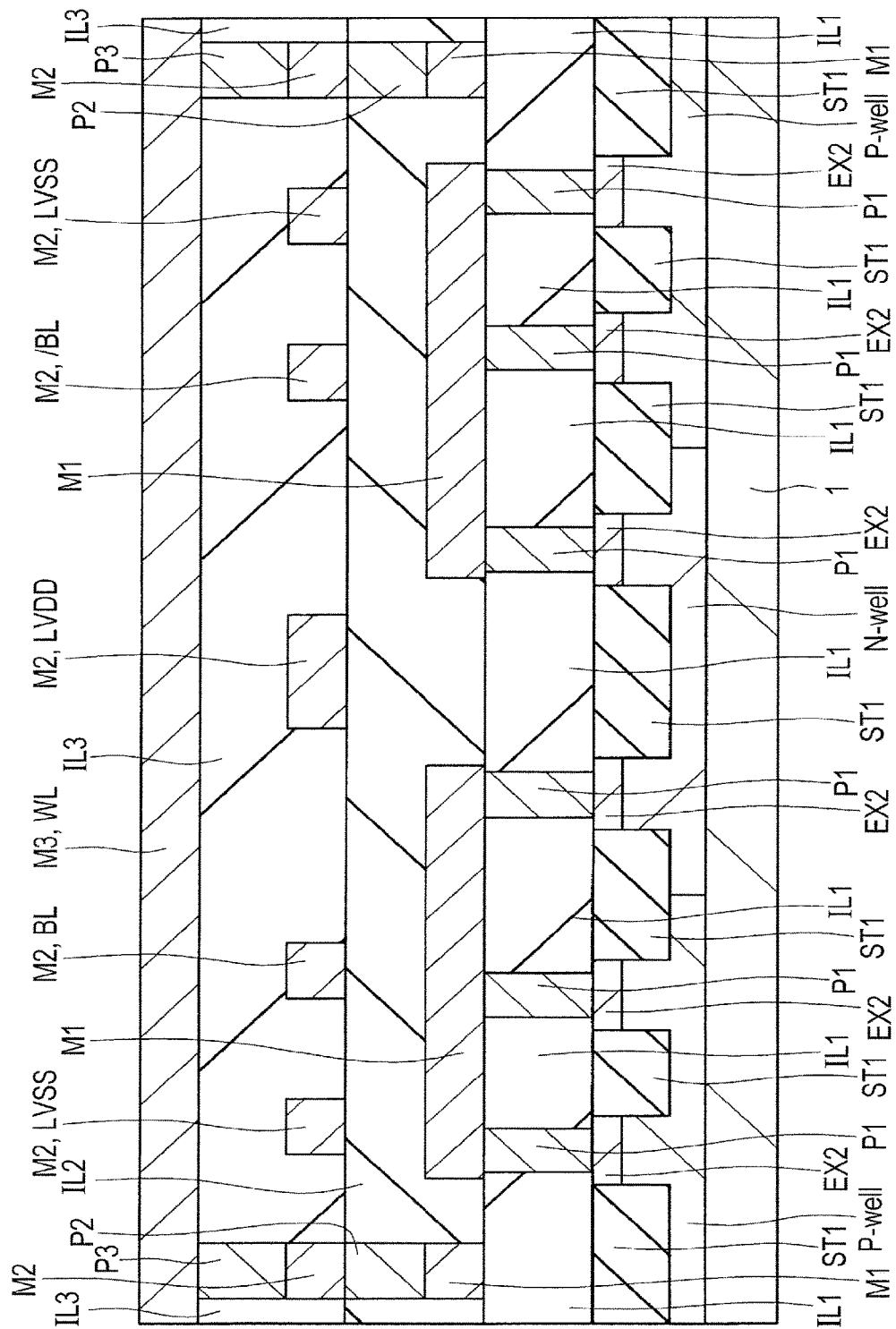
FIG. 9 is a sectional view of the SRAM memory cell structure according to the first embodiment.
Figure 10:
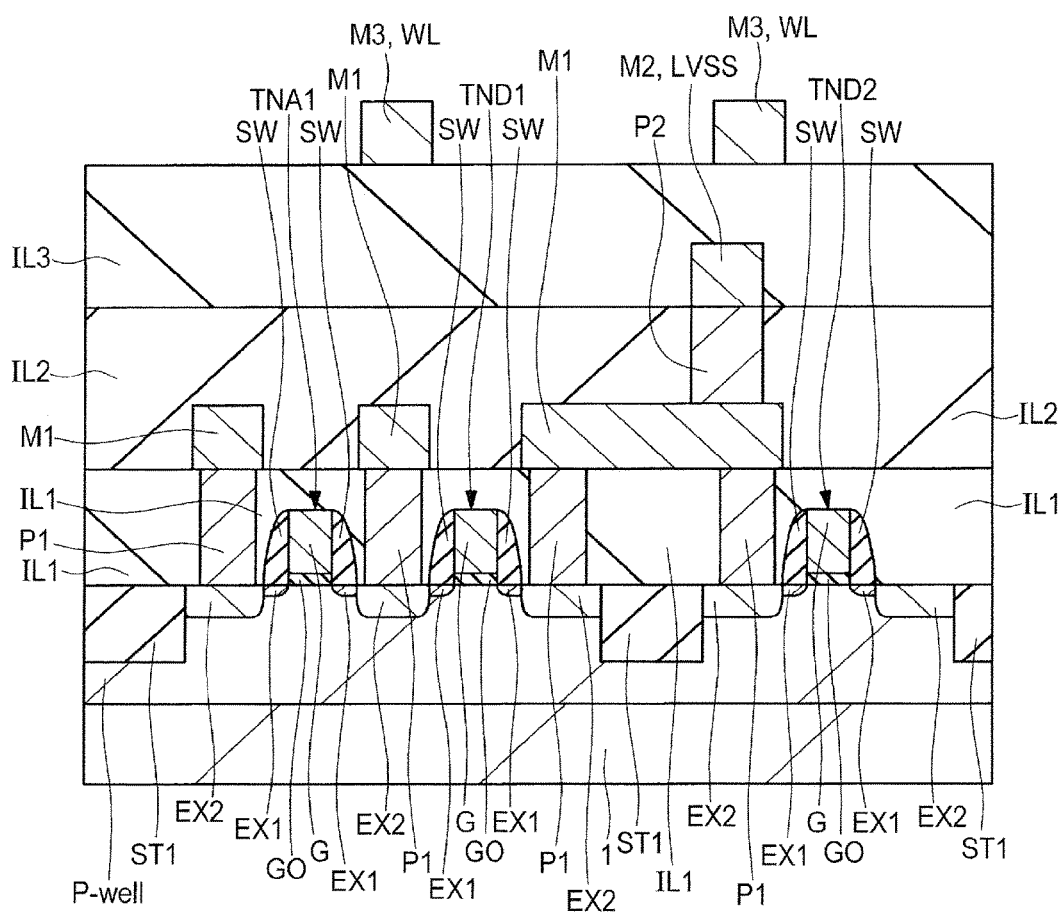
FIG. 10 is a sectional view of the SRAM memory cell structure according to the first embodiment.
Figure 11:
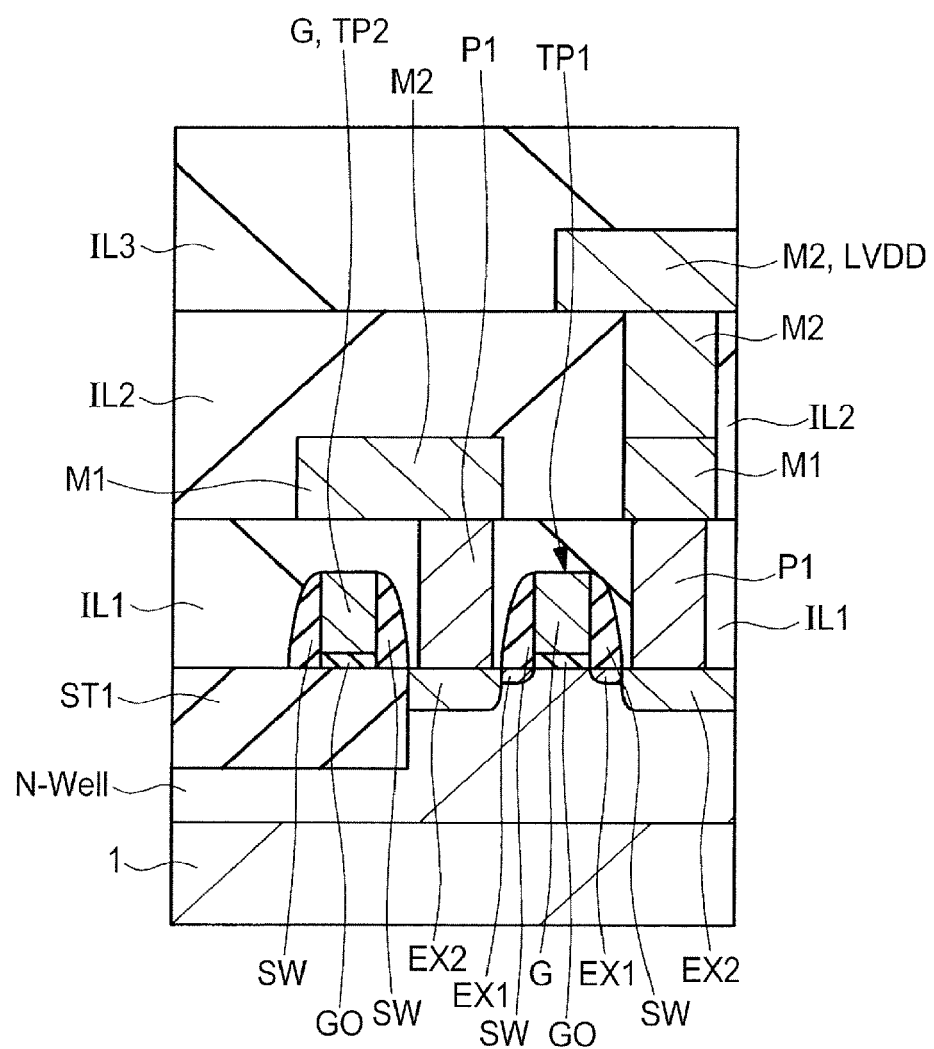
FIG. 11 is a sectional view of the SRAM memory cell structure according to the first embodiment.

FIGS. 6 to 11 are sectional views showing the SRAM memory cell structure according to the first embodiment. FIG. 6 is a sectional view taken along the line A-A' of FIG. 2, FIG. 7 is a sectional view taken along the line B-B' of FIG. 2, and FIG. 8 is a sectional view taken along the line C-C' of FIG. 2. FIG. 9 is a sectional view taken along the line A-A' of FIG. 2, FIG. 10 is a sectional view taken along the line B-B' of FIG. 2, and FIG. 11 is a sectional view taken along the line C-C' of FIG. 2. FIGS. 9 to 11 also show layers above the first plugs P1 shown in FIG. 2 and are sectional views taken along the line A-A', line B-B' and line C-C' respectively in which the patterns shown in the plan views of FIGS. 2 to 4 are placed one upon another.

[Memory Cell Pattern Layout]
[Ac, G, P1]

As shown in FIG. 2, a p-type well (P-well, first region, first conductivity type first well), an n-type well (N-well, second region, or second conductivity type second well) and a p-type well (P-well, third region, or first conductivity type third well) are arranged side by side in an X direction (first direction) over a semiconductor substrate. Although only one memory cell region (1 bit) is shown in FIG. 2, memory cells are repeatedly disposed in the X direction (first direction) and Y direction (second direction intersecting with the first direction) (see FIG. 12), so these wells (P-well, N-well and P-well) are considered to continuously extend in the Y direction. The exposed regions of these wells are active regions (transistor formation regions Ac).

Over the semiconductor substrate, six active regions (AcP2, AcP1, AcN1, AcN2, AcP3, and AcP4) are arranged side by side in the X direction. An element isolation region (STI) lies between active regions (Ac). In other words, the active regions (Ac) are marked out or separated by the element isolation regions (STI). The wells (P-well, N-well, P-well) are continuous with each other under the element isolation regions STI, as shown in FIG. 6.

In other words, AcP2 and AcP1 are arranged side by side in the X direction (first direction) and spaced from each other.

Similarly, AcN1 and AcN2, and AcP3 and AcP4 are arranged side by side in the X direction (first direction) and spaced from each other.

In further other words, AcP2 is located so as to sandwich an element isolation region with AcP1 in the X direction (first direction).

Similarly, AcN2 is located so as to sandwich an element isolation region with AcN1 in the X direction (first direction).

Similarly, AcP4 is located so as to sandwich an element isolation region with AcP3 in the X direction (first direction).

A further explanation of each active region is given below. The active region AcP2 is an exposed region of the p-type well (P-well) which is virtually rectangular with its long side in the Y direction. The active region AcP1 is located next to the active region AcP2 and is an exposed region of the p-type well (P-well) which is virtually rectangular with its long side in the Y direction. Although only one memory cell region (1 bit) is shown in FIG. 2 for illustration convenience, memory cells are repeatedly disposed in the X direction and Y direction (FIGS. 12 and 13), so the active region AcP1 is considered to extend in the Y direction linearly (FIG. 13) in the memory cell array, as described later. The expression "linearly" here may be interpreted to be equivalent to the expression "virtually rectangular with its long side in the Y direction."

The active region AcN1 is an exposed region of the n-type well (N-well) which is virtually rectangular with its long side in the Y direction. The active region AcN2 is an exposed region of the n-type well (N-well) which is virtually rectangular with its long side in the Y direction.

Figure 13:
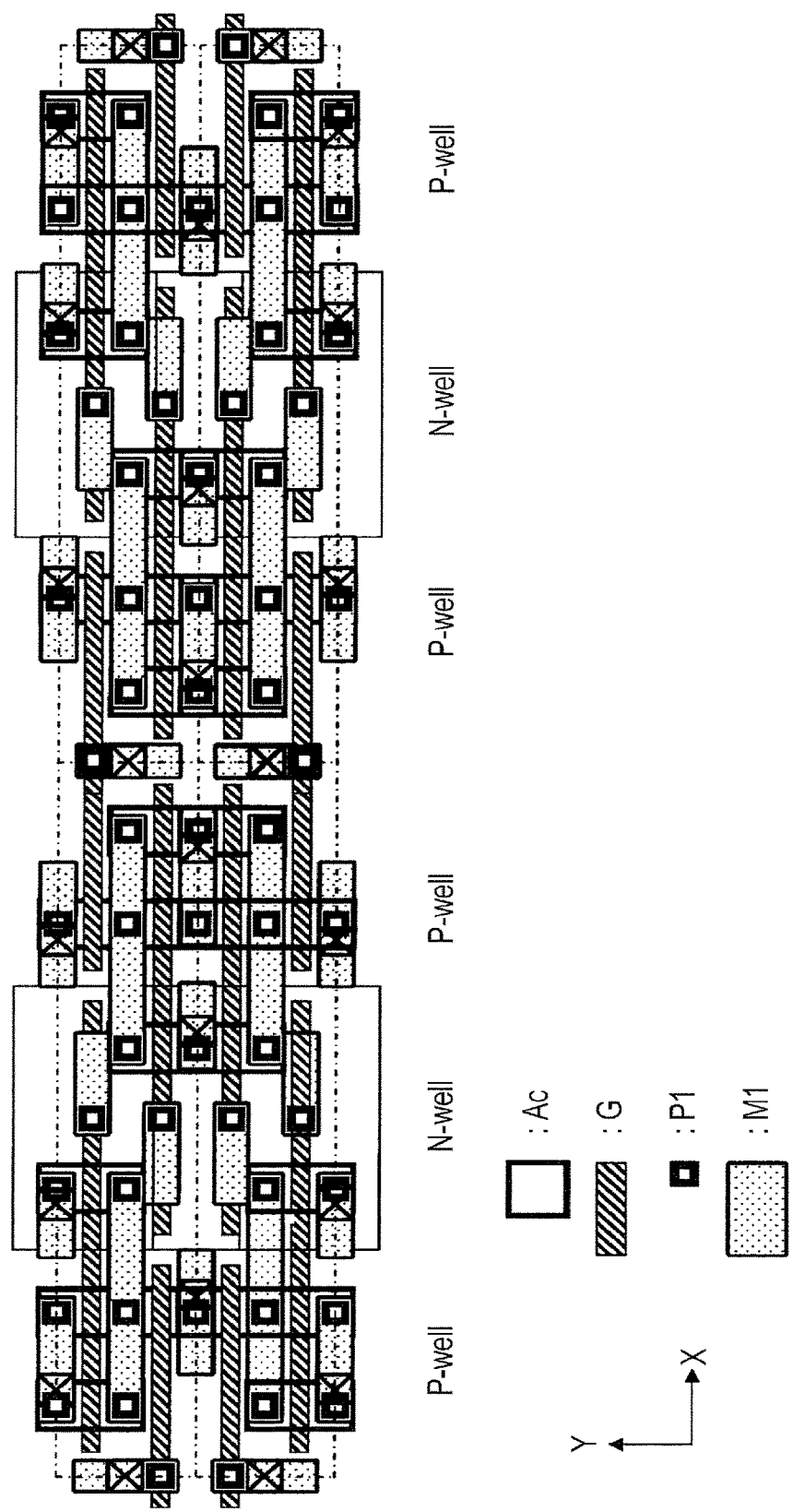
FIG. 13 is a plan view of the SRAM memory cell array structure according to the first embodiment.

The active region AcP3 is an exposed region of the p-type well (P-well) which is located on the right of the n-type well as seen in the figure and virtually rectangular with its long side in the Y direction. The active region AcP4 is an exposed region of the p-type well (P-well) which is located next to the active region AcP3 and virtually rectangular with its long side in the Y direction. In the memory cell array, the active region AcP3 extends in the Y direction linearly like AcP1 (FIG. 13).

Gate electrodes (gate wirings, linear gates) G extend over the six active regions (AcP2, AcP1, AcN1, AcN2, AcP3, and AcP4) through a gate insulating film (GO in FIG. 7, etc.) in a way to cross the active regions in the X direction, as components of the eight transistors as described above in the "Circuit Configuration" section. The active regions (Ac) on both sides of each gate electrode G function as transistor source/drain regions (FIG. 7 and so on).

Next, the gate electrodes G will be explained in detail. Hereinafter, the generic sign "G" is used to refer to the gate electrodes collectively but a specific reference numeral (1 to 4) is added to the sign "G" to indicate a specific gate electrode. In the relevant drawings, sometimes the generic sign is used and sometimes the generic sign "G" is followed by specific reference numerals (1 to 4). In this specification, not only the generic sign G (for gate electrodes) but also P1 (for first plugs), M1 (for first layer wirings), and M2 (for second layer wirings) are sometimes followed by specific reference signs (numerals and alphabetic characters).

Specifically, a common gate electrode G1 is disposed over the active regions AcP2, AcP1, and AcN1 in a way to cross them. Consequently TND2 is disposed over the active region AcP2, TND1 is located over the active region AcP1, and TP1 is located over the active region AcN1 and their gate electrodes (G) are coupled to each other. TP1 is disposed over the active region AcN1 and p-type source/drain regions are provided on both sides of the gate electrode G.

Another common gate electrode G2 is disposed over the active region AcP1 in parallel with the common gate electrode G1. Consequently, TNA1 is disposed over the active region AcP1 and an n-type source/drain region of TNA1 and an n-type source/drain region of TND1 are joined (into a common source/drain region).

Also, a common gate electrode G3 is disposed over the active regions AcP4, AcP3, and AcN2 in a way to cross them. Consequently TND4, TND3, and TP2 are disposed over the active regions AcP4, AcP3, and AcN2 respectively and their gate electrodes (G) are coupled to each other. TP2 is disposed over the active region AcN2 and p-type source/drain regions are provided on both sides of the gate electrode G.

Another common gate electrode G4 is disposed over the active region AcP3 in parallel with the common gate electrode G3. Consequently, TNA2 is disposed over the active region AcP3 and an n-type source/drain region of TNA2 and an n-type source/drain region of TND3 are joined (into a common source/drain region).

The above four gate electrodes G (G1 to G4) are arranged in line (linear form) on a basis of two electrodes per line. Specifically, the common gate electrode G1 overlying and crossing the active regions AcP2, AcP1, and AcN1 and the gate electrode G4 overlying the active region AcP3 are arranged in a line extending in the X direction. The common gate electrode G3 overlying and crossing the active regions AcP4, AcP3, and AcN2 and the gate electrode G2 overlying the active region AcP1 are arranged in a line extending in the X direction.

As mentioned above, in this embodiment, each driver transistor is divided into two transistors (TND1 and TND2 or TND3 and TND4) which are located over different active regions (AcP2 and AcP1 or AcP4 and AcP3). In addition, since these active regions (AcP2 and AcP1 or AcP4 and AcP3) extend in the Y direction, the layout can be simplified and higher patterning accuracy can be achieved.

Figure 64:
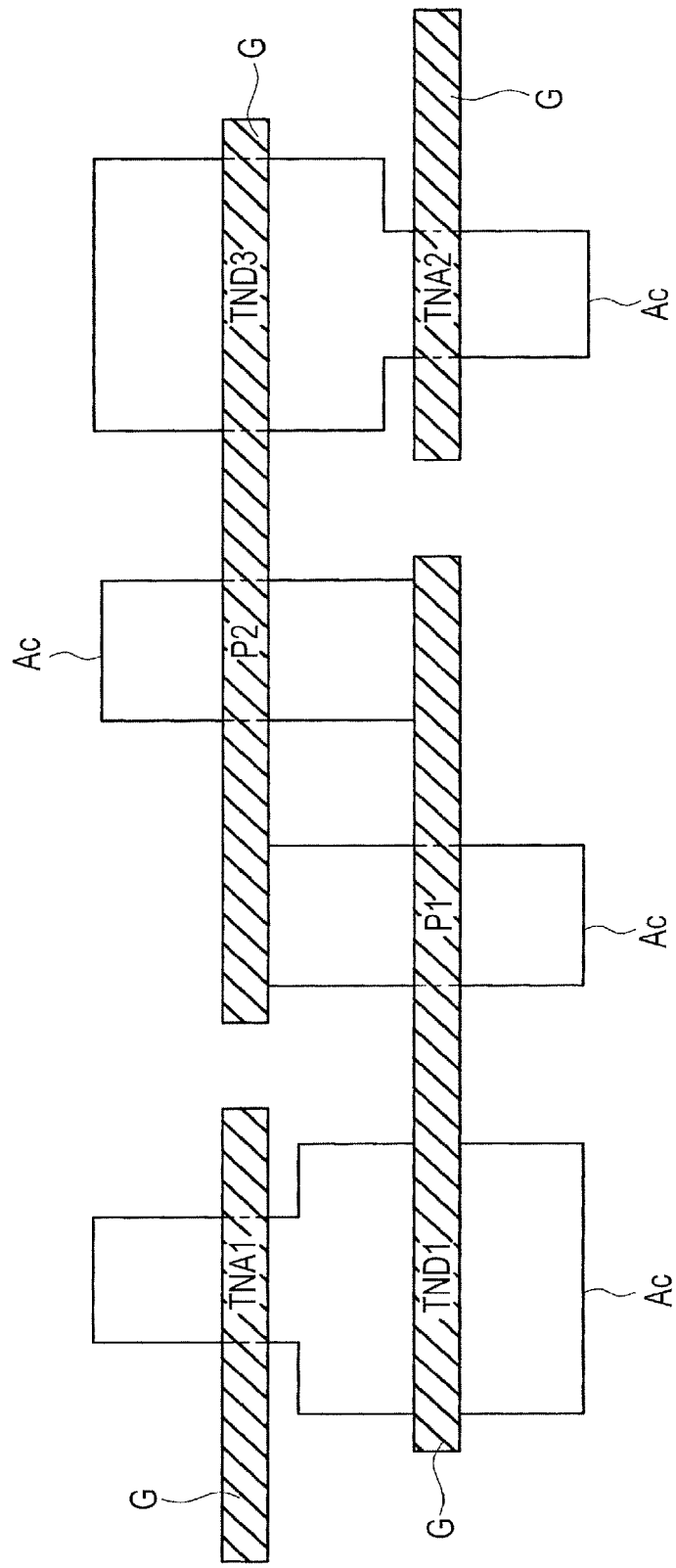
FIG. 64 is a plan view showing an SRAM memory cell as a comparative example.

FIG. 64 is a plan view showing an SRAM memory cell as a comparative example against the first embodiment. The equivalent circuit diagram for this memory cell is the same as the circuit diagram shown in FIG. 1 except that TND2 and TND4 are excluded. In this case, in order to increase the driving performance of the driver transistors TND1 and TND3, it is necessary to increase the active region width (gate width or channel width) or the gate length or take other measures.

Preferably the driving performance of the driver transistors (TND1 and TND3) should be larger than that of the access transistors (TNA1 and TNA2). For example, it is preferable that the gate width ratio between the access transistors and the driver transistors be 1:2. The driving performance ratio as expressed by a gate width ratio is called "β ratio." β ratio will be explained in detail later.

Figure 65:
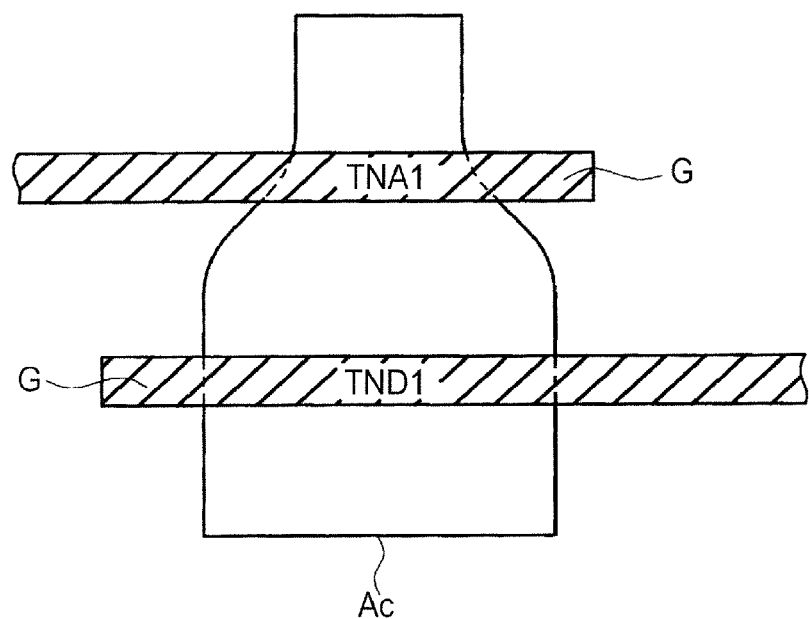
FIG. 65 is a plan view showing a portion of an SRAM memory cell as a comparative example.

In this case, each active region (Ac) is supposed to have a bent portion (bend or stepped portion) as shown in FIG. 64. However, actually, patterning according to a desired reticle pattern is difficult and as a result of failure to make the bent portions accurately, it may happen that the width of the active region is gradually increased as shown in FIG. 65. FIG. 65 is a plan view showing a portion of an SRAM memory cell as a comparative example against the first embodiment. In this case, the gate width of TNA1 is not constant, leading to deterioration in the transistor characteristics of TNA1. Furthermore, as for the memory cell array, it may often happen that patterning accuracy varies from one memory cell to another, resulting in unstable product quality. In this case, characteristics variation among memory bells may be significant and result in product defects. As the miniaturization of memory cells progresses, this tendency would grow.

On the other hand, in this embodiment, as mentioned above each driver transistor is divided into two transistors (TND1 and TND2 or TND3 and TND4) which are located over different active regions (AcP2 and AcP1 or AcP4 and AcP3). Therefore, it is possible to make the driving performance of the driver transistor (TND1, TND3) larger than that of the access transistor (TNA1, TNA2). For example, the gate width ratio between the access transistor and driver transistor can be easily made 1:2 by making the ratio in width (length in the X direction) between the active regions (AcP2 and ACP1 or AcP4 and AcP3) 1:1.

Since active regions are separated from each other (TND1 and TND2 or TND3 and TND4), each active region can be virtually rectangular, namely it is not supposed to have a bent portion as mentioned above. Consequently, patterning accuracy is improved and the characteristics of the transistors formed over the active regions (Ac) are improved. Furthermore, product quality instability is reduced and the performance characteristics of the SRAM memory cell array are improved. Also, production yield is improved.

Furthermore, since not only a driver transistor (TND1 or TND3) but also an access transistor (TNA1 or TNA2) are located over one (ACP1 or AcP3 in FIG. 2) of the active regions (for TND1 and TND2 or TND3 and TND4), the number of active regions is decreased. This permits simpler layout and contributes to reduction in memory cell region size.

Furthermore, since the active regions (Ac) extend in the Y direction, the gate electrodes (G) can extend in the X direction so not only the patterning accuracy of the active regions (Ac) but also that of the gate electrodes (G) can be improved. Particularly, the multiple exposure technique may be used in microfabrication for fine patterns. For example, after exposure is made in a linear form in the X direction, exposure in the Y direction, namely exposure for the regions to be separated, is made. By using such double exposure technique, the accuracy in pattering the photoresist film can be improved and the accuracy in patterning the underlying film to be etched can be improved. When this multiple exposure technique is employed, preferably the patterns should be linear. Therefore, since the active regions (Ac) and gate electrodes (G) are to be arranged in a linear form as mentioned above, it is easy to employ the multiple exposure technique and the patterning accuracy can be improved. In addition, it is easy to create a simulation model, thereby contributing to improvement in inspection accuracy.

[P1, M1, P2]

As shown in FIG. 3, first plugs P1 are disposed over the source/drain regions of the eight transistors (TND2, TNA1, TND1, TP1, TP2, TND3, TNA2, TND4) described above referring to FIG. 2. Also, first plugs P1 are disposed over the four gate electrodes described above referring to FIG. 2.

First layer wirings M1 are disposed over the first plugs P1 for electrical couplings between first plugs P1.

Specifically, a first plug P1$a$ over one source/drain region of TND2, a first plug P1$b$ over the common source/drain region of TND1 and TNA1, a first plug P1$c$ over one source/drain region of TP1, and a first plug P1$d$ over the common gate electrode G3 of TP2, TND3, and TND4 are coupled by a first layer wiring (first node wiring) M1A. This first layer wiring M1A (first node wiring) corresponds to the storage node A shown in FIG. 1. In the above explanation, "one" means the upper source/drain region of each relevant transistor (TND2, TP1) as seen in FIG. 2.

A first plug P1$e$ over one source/drain region of TND4, a first plug P1$f$ over the common source/drain region of TND3 and TNA2, a first plug P1$g$ over one source/drain region of TP2, and a first plug P1$h$ over the common gate electrode G1 of TP1, TND1, and TND2 are coupled by a first layer wiring (second node wiring) M1B. This first layer wiring (second node wiring) M1B corresponds to the storage node B shown in FIG. 1. The first wiring M1 (M1A or M1B) corresponding to the storage node (A or B) generally extends in the X direction. In the above explanation, "one" means the lower source/drain region of each relevant transistor (TND4, TP2) as seen in FIG. 2.

Also a first plug P1$i$ over the other source/drain region of TND1 and a first plug P1$j$ over the other source/drain region of TND2 are coupled by a first layer wiring M1S. This first layer wiring M1S corresponds to a grounding voltage (VSS) in FIG. 1 and is coupled to a grounding voltage line (LVSS) as described later.

A first plug P1$k$ over the other source/drain region of TND4 and a first plug P1$m$ over the other source/drain region of TND3 are coupled by a first layer wiring M1S. This first layer wiring M1S corresponds to a grounding voltage (VSS) in FIG. 1 and is coupled to a grounding voltage line (LVSS) as described later.

Also, first layer wirings M1 (M1BL and M1D) are disposed over a first plug P1$n$ over the other source/drain region of TNA1, and a first plug P1$o$ over the other source/drain region of TP1 respectively. Also, first layer wirings M1 (M1BL and M1D) are disposed over a first plug P1$p$ over the other source/drain region of TNA2 and a first plug P1$q$ over the other source/drain region of TP2 respectively.

Also, a first layer wiring M1W is disposed over a first plug P1$r$ over the gate electrode G2 of TNA1 and a first layer wiring M1W is disposed over a first plug P1$s$ over the gate electrode G4 of TNA2. While the first layer wirings M1W coupled to these gate electrodes G (G2 and G4) extend in the Y direction at the ends of the memory cell region in the X direction, other first layer wirings M1 (M1S, M1D, and M1BL) generally extend in the X direction like the first layer wirings M1 (M1A and M1B) corresponding to the storage nodes (A and B).

The couplings between first plugs P1 by the first layer wirings M1 may be modified in various ways as far as the interconnection structure shown in the circuit diagram of FIG. 1 is satisfied. However, it should be noted that the layout can be simplified when the first layer wirings M1 at the ends of the memory cell region extend in the Y direction and the first layer wirings M1 inside the memory cell region extend in the X direction as mentioned above.

[P2, M2, P3, M3]

As shown in FIG. 4, second plugs P2 are disposed over the first layer wirings M1 (M1S, M1D, M1BL, and M1W), among the first layer wirings M1 described above referring to FIG. 3, other than the first layer wirings M1 (M1A and M1B) corresponding to the storage nodes (A and B), and second layer wirings M2 are disposed over them.

Specifically, the first layer wiring M1W coupled to the gate electrode G (G2) of TNA1 is coupled to a second layer wiring M2W through a second plug P2. The first layer wiring M1W coupled to the gate electrode G (G4) of TNA2 is coupled to a second layer wiring M2W through a second plug P2. These two second layer wirings M2W extend in the Y direction at the ends of the memory cell region in the X direction. Furthermore, third plugs P3 are disposed over the two second layer wirings M2W and a third layer wiring M3 (WL) extends in the X direction so as to couple the two third plugs P3. This third layer wiring M3 (WL) is a word line. For this reason, the above second layer wirings M2W may be referred to as the "second layer wirings coupled to the word line."

The first layer wiring MIS coupled to the other source/drain region of TND2 and the other source/drain region of TND1 is coupled to a second layer wiring M2 (LVSS) through a second plug P2. This second layer wiring M2 (LVSS) is a grounding voltage line (secondary supply voltage line supplied with the secondary supply voltage). The first layer wiring M1S coupled to the other source/drain region of TND4 and the other source/drain region of TND3 is coupled to a second layer wiring M2 (LVSS) through a second plug P2. This second layer wiring M2 (LVSS) is a grounding voltage line. These two grounding voltage lines extend in the Y direction between the above two second layer wirings M2 (M2W) located at the ends of the memory cell region.

The first layer wiring M1BL coupled to the other source/drain region of TNA1 is coupled to a second layer wiring M2 (BL, first bit line) through a second plug P2. This second layer wiring M2 (BL) is one bit line of the bit line pair. The first layer wiring M1BL coupled to the other source/drain region of TNA2 is coupled to a second layer wiring M2 (/BL, second bit line) through a second plug P2. This second layer wiring M2 (/BL) is the other bit line of the bit line pair. These two bit lines (BL and /BL, or a bit line pair) extend in the Y direction between the two grounding voltage lines (LVSS).

A second layer wiring M2 (LVDD) is disposed so as to couple the second plug P2 over the first layer wiring M1D coupled to the other source/drain region of TP1 and the second plug P2 over the first layer wiring M1D coupled to the other source/drain region of TP2. This second layer wiring M2 (LVDD) is a supply voltage line (primary supply voltage line supplied with the primary supply voltage). This supply voltage line generally extends in the Y direction between the two bit lines (BL, /BL) and includes a linear portion extending in the Y direction and portions which protrude from this linear portion and cover the second plugs P2.

Figure 14:
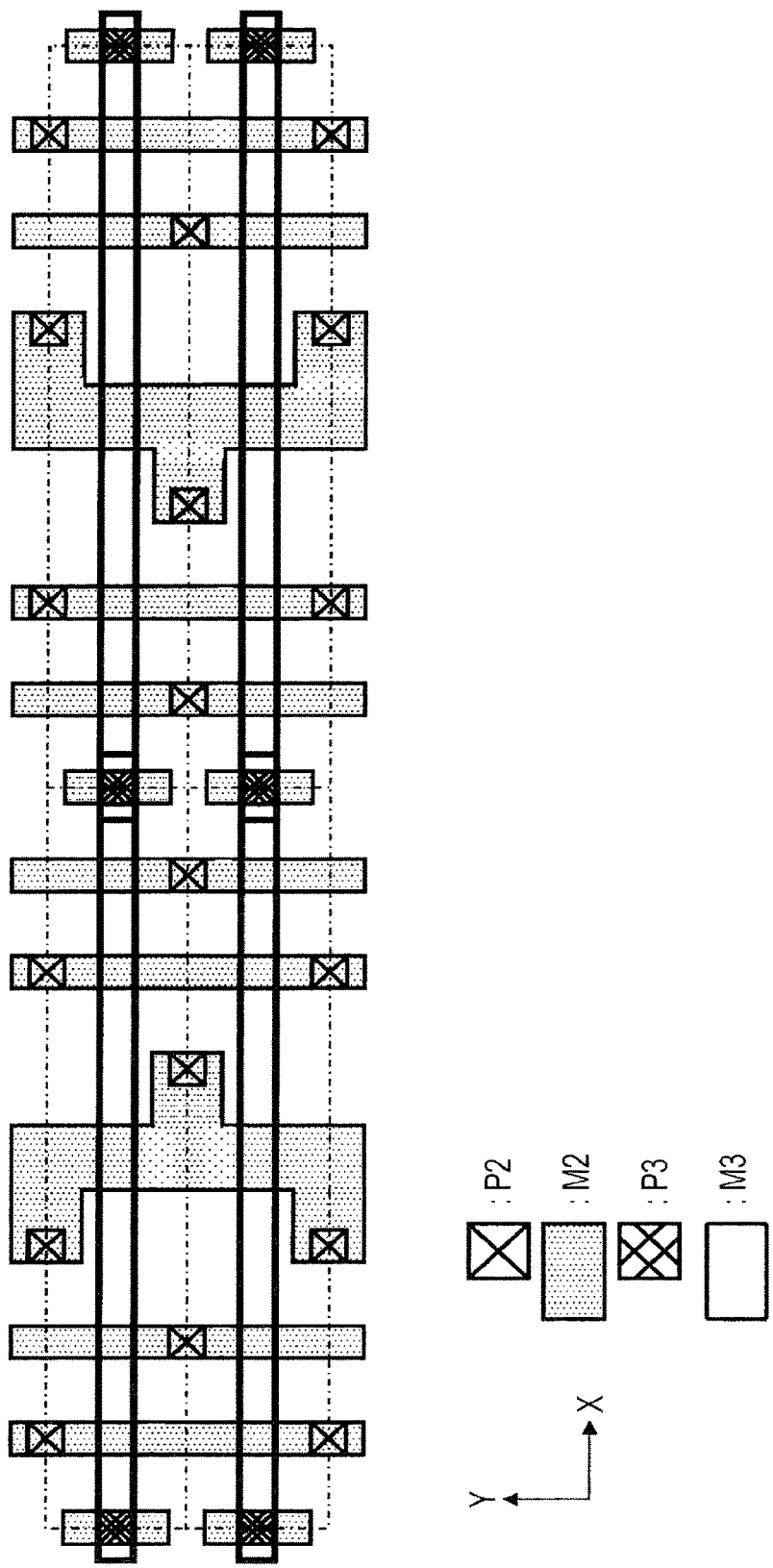
FIG. 14 is a plan view of the SRAM memory cell array structure according to the first embodiment.

The couplings of the second plugs P2, second layer wirings M2, third plugs P3 and third layer wiring M3 may be modified in various ways as far as the interconnection structure shown in the circuit diagram of FIG. 1 is satisfied. However, it should be noted that the layout can be simplified when the second layer wirings M2 generally extend in the Y direction and the third layer wiring M3 generally extends in the X direction as mentioned above. Although only one memory cell region (1 bit) is shown in FIGS. 2 to 4 for illustration convenience, memory cells are repeatedly disposed in the X direction and Y direction as described later, so in the memory cell array, the grounding voltage lines (LVSS), bit lines (BL, /BL) and supply voltage lines (LVDD) continuously extend in the Y direction and the word lines (WL) continuously extend in the X direction (FIG. 14).

In this embodiment, active regions are separated from each other (AcP2 and AcP1 or AcP4 and AcP3), so the area for the formation of the driver transistors (TND1 and TND2 or TND3 and TND4) is increased because of the existence of the element isolation region (STI) between the active regions. Using this area, a grounding voltage line (LVSS) can be disposed between the second layer wiring M2W (second layer wiring coupled to the word line) and bit line (BL, /BL) as mentioned above. Consequently, interaction (crosstalk noise) between the second layer wiring M2W (second layer wiring coupled to the word line) and the bit line (BL, /BL) is reduced due to the shielding effect of the grounding voltage line (LVSS).

Furthermore, the distance (d1) between the grounding voltage line (LVSS) and bit line (BL, /BL) can be increased to reduce the wiring capacitance between these lines. Also the distance (d2) between the supply voltage line (LVDD) and bit line (BL, /BL) can be increased to reduce the wiring capacitance between these lines. Especially, since the bit lines (BL, /BL) play an important role in reading or writing data, change in voltage due to noise may affect the memory performance seriously. By increasing the distance (d1) between the grounding voltage line (LVSS) and bit line (BL, /BL) or the distance (d2) between the supply voltage line (LVDD) and bit line (BL, /BL), the memory performance characteristics can be improved. For example, the memory performance characteristics can be improved by satisfying the relations of d3<d1 and d3<d2, where d3 represents the distance between the second layer wiring M2W (second layer wiring coupled to the word line) and bit line (BL, /BL).

The patterns described above referring to FIGS. 2 to 4 are symmetrical with respect to the center point of the memory cell region.

Figure 5:
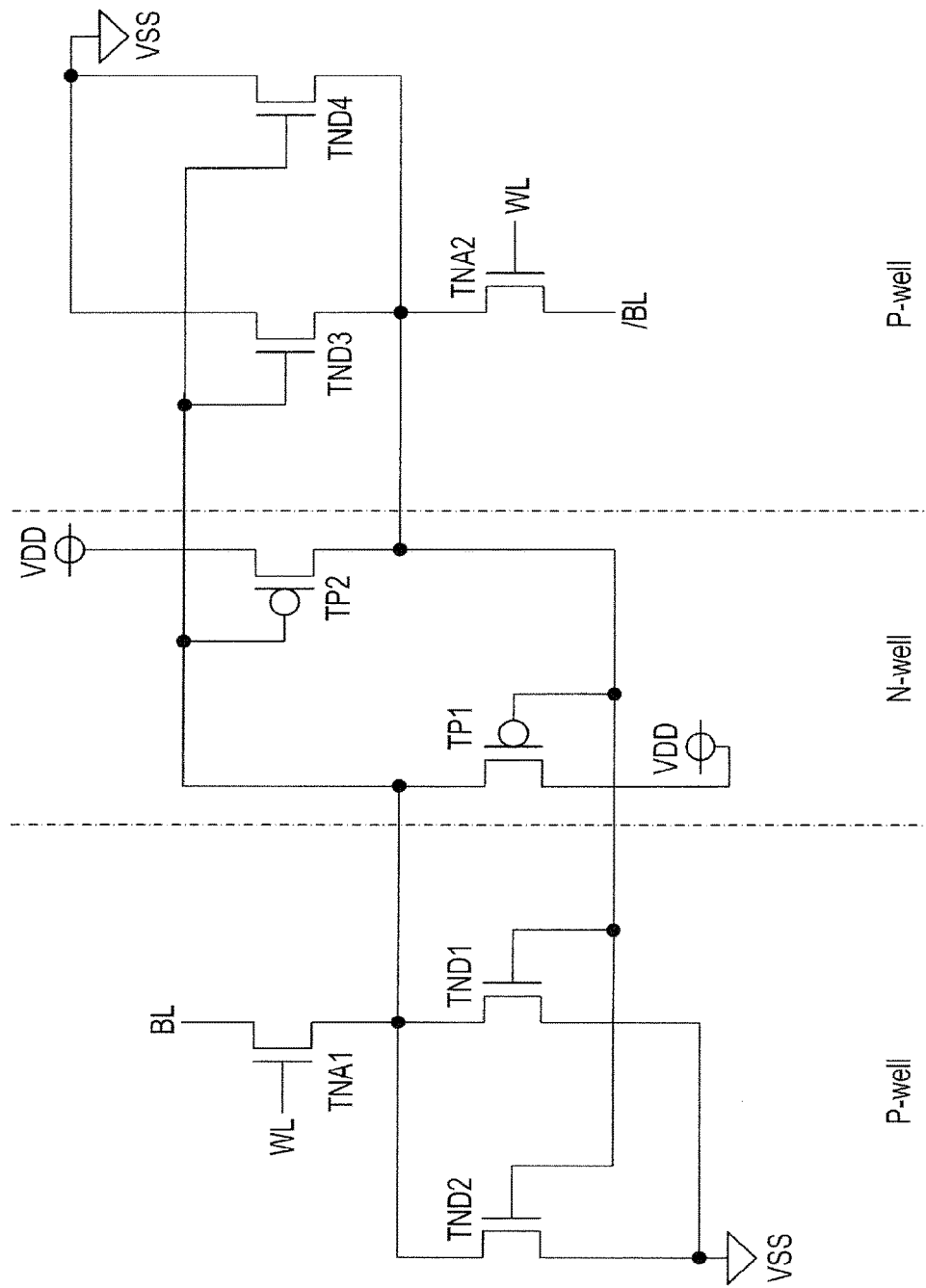
FIG. 5 is a circuit diagram showing that transistors are arranged in line with an SRAM memory cell layout according to the first embodiment.

For reference, FIG. 5 is a circuit diagram showing how the eight transistors (TND2, TNA1, TND1, TP1, TP2, TND3, TNA2, and TND4) are arranged and interconnected in accordance with the above "Memory Cell Pattern Layout."

[Memory Cell Sectional Structure]

Next, the sectional structure of the above layout will be described referring to the sectional views of FIGS. 6 to 11 in order to clarify more the SRAM memory cell structure according to this embodiment.

As shown in FIGS. 6 to 8, element isolation regions STI are formed in a semiconductor substrate 1. Active regions (Ac) are marked out by the element isolation regions STI. In other words, an area surrounded by element isolation regions STI is an active region (Ac). As mentioned earlier, six active regions (AcP2, AcP1, AcN1, AcN2, AcP3, and AcP4) are arranged side by side in the X direction, as can be understood from the sectional views of FIG. 6 and so on.

The element isolation regions STI can be formed by the STI (shallow trench isolation) technique. Specifically element isolation trenches are made in the semiconductor substrate 1 by photolithography or etching. An oxide silicon film is formed over the semiconductor substrate in a way to fill the element isolation trenches and then unwanted portions of the oxide silicon film portions are removed by CMP (chemical mechanical polishing). As a result, element isolation regions STI are formed as element isolation trenches filled with oxide silicon film. Alternatively the element isolation regions STI may be formed by LOCOS (local oxidation of silicon).

Figure 12:
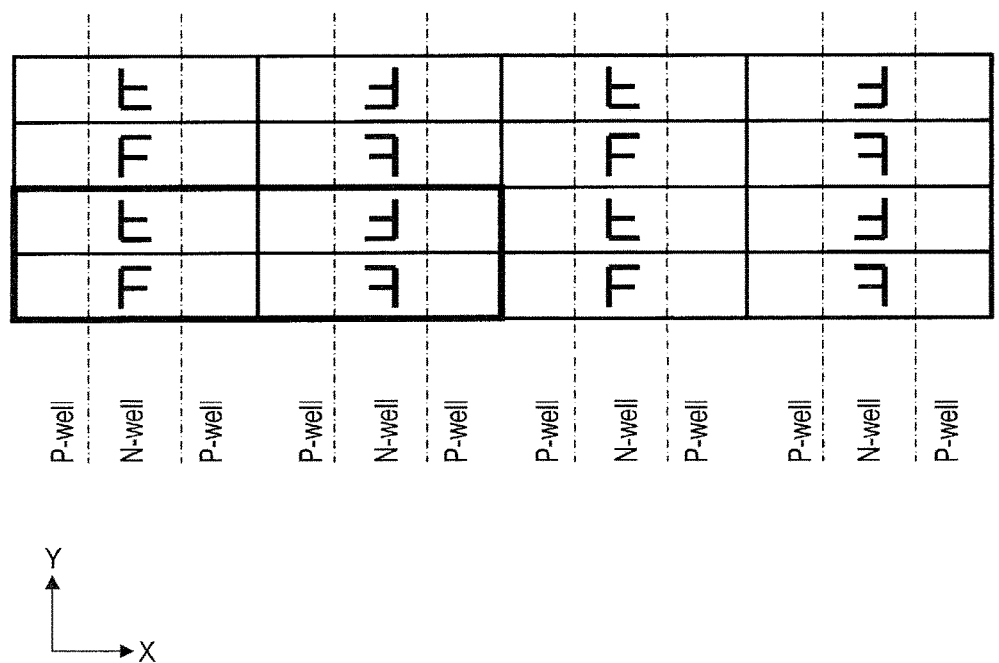
FIG. 12 is a plan view schematically showing the SRAM memory cell array according to the first embodiment.

A p-type well (P-well) doped with p-type impurities (for example, boron) and an n-type well (N-well) doped with n-type impurities (for example, phosphorous or arsenic) are formed in the semiconductor substrate 1. A p-type well (P-well) can be formed, for example, by implanting p-type impurities into an active region (Ac) using an ion implantation technique and an n-type well (N-well) can be formed, for example, by implanting n-type impurities into an active region (Ac) using an ion implantation technique. As mentioned above, these wells are continuous with each other under the element isolation regions STI, extending in the Y direction with a given width (FIG. 6, FIG. 12 and so on.). Three wells (P-well, N-well, and P-well) are arranged side by side in the X direction. Specifically, the p-type wells (P-well) are located on both sides of the n-type well (N-well). A semiconductor region (not shown) for the formation of a channel may be formed over the surface of each well. This semiconductor region for the formation of a channel is intended to adjust the threshold voltage in the formation of a channel.

A gate insulating film GO is formed over the main surface of each active region (Ac). For example, an oxide silicon film may be used for the gate insulating film GO. The gate insulating film GO can be formed, for example, by thermal oxidation or CVD (chemical vapor deposition).

Gate electrodes G are formed over the gate insulating film GO (FIGS. 7 and 8). For example, a polycrystalline silicon film may be used for gate electrodes G. Gate electrodes G can be formed, for example, by depositing a polycrystalline silicon film over the semiconductor substrate including the gate insulating film GO by using CVD or a similar technique and patterning it. Alternatively the gate electrodes G may be formed as a laminated film of polycrystalline silicon film and metal film.

Alternatively a high-k film may be used for the gate insulating film and the gate electrodes may have a metal gate structure.

"Patterning" here means a process in which a photoresist film over the film to be processed is made into a desired pattern by exposure and development and then the film to be processed is etched using the photoresist film as a mask. By using the double exposure technique as mentioned above in patterning for gate electrodes G, gate electrodes (G) can be formed accurately with microscopic line width and spacing. The double exposure technique can be easily applied to the abovementioned layout according to this embodiment (see FIG. 2 and so on).

In the p-type well (P-well), n-type low-doped regions EX1 are formed on both sides of each gate electrode G (FIGS. 7 and 8). The n-type low-doped regions EX1 can be formed by implanting n-type impurity ions in the active regions (AcP) using the gate electrodes G as a mask. In the n-type well (N-well), p-type low-doped regions EX1 are formed on both sides of each gate electrode G (FIGS. 7 and 8). The p-type low-doped regions EX1 can be formed by implanting p-type impurity ions in the active regions (AcN) using the gate electrodes G as a mask.

Sidewalls SW are formed on both sides of each gate electrode G (FIGS. 7 and 8). The sidewalls SW are, for example, a nitride silicon film. For example, an insulating film such as a nitride silicon film is deposited over the semiconductor substrate 1 including the gate electrodes G, by CVD and then anisotropic etching is done to leave some portions of insulating film on both sides of the gate electrodes G as sidewalls SW.

In the p-type well (P-well), p-type high-doped regions EX2 are formed on both sides of each gate electrode G combined with sidewalls SW (FIGS. 7 and 8). The n-type high-doped regions EX2 can be formed by implanting n-type impurity ions using the gate electrode-sidewall combination as a mask. In the n-type well (N-well), p-type high-doped regions EX2 are formed on both sides of the electrode-sidewall combination (FIGS. 7 and 8). The p-type high-doped regions EX2 can be formed by implanting p-type impurity ions using the gate electrode-sidewall combination as a mask. The high-doped regions EX2 are higher in impurity concentration and larger in depth than the low-doped regions EX1. The low-doped regions EX1 and high-doped regions EX2 make up LDD (lightly doped drain) type source/drain regions. A source/drain region refers to a region which becomes a source or drain. Such a source/drain region may be referred to as "one end" or "the other end" of a transistor region.

As mentioned above, in this embodiment, a driver transistor is divided into two transistors (TND1 and TND2 or TND3 and TND4) which are disposed over different active regions (AcP2 and AcP1 or AcP4 and AcP3), as apparent from the sectional view of FIG. 7 and so on. Also, in this embodiment, the access transistor TNA1 (TNA2) is located in the active region for TND1 and TND2 (TND3 and TND4), as apparent from the sectional view of FIG. 7 and so on.

Alternatively the transistors may be formed by the so-called gate-last process in which metal gates are formed after making gate pattern trenches using dummy gates.

As shown in FIGS. 9 to 11, a plug P1 is disposed over the high-doped region EX2 (source/drain region) of each transistor (TNA1, TND1, TND2, TP1 and so on). Although not shown in the sectional views of FIGS. 9 to 11, plugs P1 are formed over the gate electrodes G (FIG. 2). Plugs P1 can be formed by the following process. As an interlayer insulating film ILL a laminated film of nitride silicon film and oxide silicon film, is formed over the semiconductor substrate 1 including the transistors (TNA1, TND1, TND2, TP1 and so on). Then, contact holes are made in the interlayer insulating film IL1 and a conductive film is deposited over the interlayer insulating film IL1 including the inner surfaces of the contact holes. A laminated film of barrier film and metal film may be used for the conductive film. For example, a Ti (titanium) film or TiN (nitride titanium) film or a laminated film of these films may be used for the barrier film. For example, a W (tungsten) film may be used for the metal film. By removing the conductive film except its contact hole portions by CMP or a similar technique, the contact holes remain filled with the conductive film.

A first layer wiring M1 is disposed over plugs P1. The first layer wirings M1 can be formed by patterning a conductive film. Alternatively the first layer wirings M1 may be buried wirings (damascene wirings).

Second layer wirings M2 (LVSS, BL, /BL, LVDD and so on) are disposed over the first layer wirings M1 through second plugs P2. In other words, these wirings lie in the same layer. The second plugs P2 can be formed in the interlayer insulating film IL2 in the same way as the first plugs P1. The second layer wirings M2 can be formed in the same way as the first layer wirings M1. The second layer wirings M2 may be buried wirings. If that is the case, the so-called dual damascene process may be used in which a conductive film is filled in the contact holes and wiring trenches simultaneously to form the second plugs P2 and second layer wirings M2 simultaneously.

Third layer wirings M3 (WL) are disposed over the second layer wirings M2 through third plugs P3. The third plugs P3 can be formed in the interlayer insulating film IL3 in the same way as the first plugs P1. The third layer wirings M3 can be formed in the same way as the first layer wirings Ni. The third layer wirings M3 may be buried wirings. If that is the case, the so-called dual damascene process may be used in which a conductive film is filled in the contact holes and wiring trenches simultaneously to form the third plugs P3 and third layer wirings M3 simultaneously.

Although the process for making the patterns of the above sectional structure is not limited, the patterns may be made in the following order. First, element isolation regions STI are formed in the semiconductor substrate 1 before wells (P-well, N-well, P-well) are formed. Then, the gate insulating film GO and gate electrodes G are formed and the low-doped regions EX1 are formed before the sidewalls SW are formed and the high-doped regions EX2 are formed to make the various transistors (TNA1, TND1, TND2, TP1 and so on) (FIG. 7 and so on). After that, the steps of forming interlayer insulating films, plugs, and wirings are repeated to form the first to third layer wirings (M1 to M3) and so on. After that, further layers of wirings may be formed. Also, patterns for tap cells (power supply cells) which will be described later may be made at the same time. Also, a peripheral circuit such as a decoder for driving the SRAM may be formed at the same time.

In the explanation of the other embodiments given below, descriptions of various manufacturing steps and relevant sectional views are omitted, but the sectional structures of their transistors are similar to those of this embodiment and can be formed by the same process as mentioned above.
[Memory Cell Array]

FIG. 12 is a plan view schematically showing the SRAM memory cell array according to this embodiment. FIG. 13 and are plan views showing the structure of the SRAM memory cell array according to this embodiment. FIG. 13 shows the layout of the pattern for the lower layers up to the second plugs P2 and FIG. 14 shows the layout of the pattern above the second plugs p2. What is shown in FIGS. 13 and 14 corresponds to the four cells (2 by 2) in the lowest and second lowest rows and the first and second columns from left as seen in FIG. 12.

In the memory cell array shown in FIG. 12 in which "F" denotes a memory cell region described above referring to FIGS. 2 to 4, in the vertical direction (Y direction) memory cell regions are repeatedly disposed axially symmetrically with respect to each line (X axis) extending in the X direction (mirroring with respect to the X axis) and in the horizontal direction (X direction) memory cell regions are repeatedly disposed axially symmetrically with respect to each line (Y axis) extending in the Y direction (mirroring with respect to the Y axis).

The arrangement and sectional structure of the memory cell regions as expressed by "F" in FIG. 12 (rectangular areas surrounded by the chain lines in FIGS. 13 and 14) have been as detailed above referring to the plan views of FIGS. 2 to 4 and the sectional views of FIGS. 6 to 11. The patterns of the other memory cell regions as well as those expressed by "F" are axially symmetrical to each line extending in the X or Y direction (FIGS. 13 and 14).

As mentioned above, the wells (P-well, N-well, P-well) of each memory cell region extend in the Y direction (FIG. 13). One p-type well of a memory cell region adjoins a p-type well of a memory cell adjacent to that cell, so when the memory cell array is viewed as a whole, p-type wells (P-well) and n-type wells (N-well) are alternately arranged in the X direction.
[Tap Cell Region]

While a plurality of cell regions (m×n cell regions) are disposed in a memory cell array as described above referring to FIG. 12, the memory cell array also includes tap cell regions (power supply regions). Prescribed voltages (for example, grounding voltage VSS and supply voltage VDD) are supplied to the wells through the tap cell regions.

Figure 15:
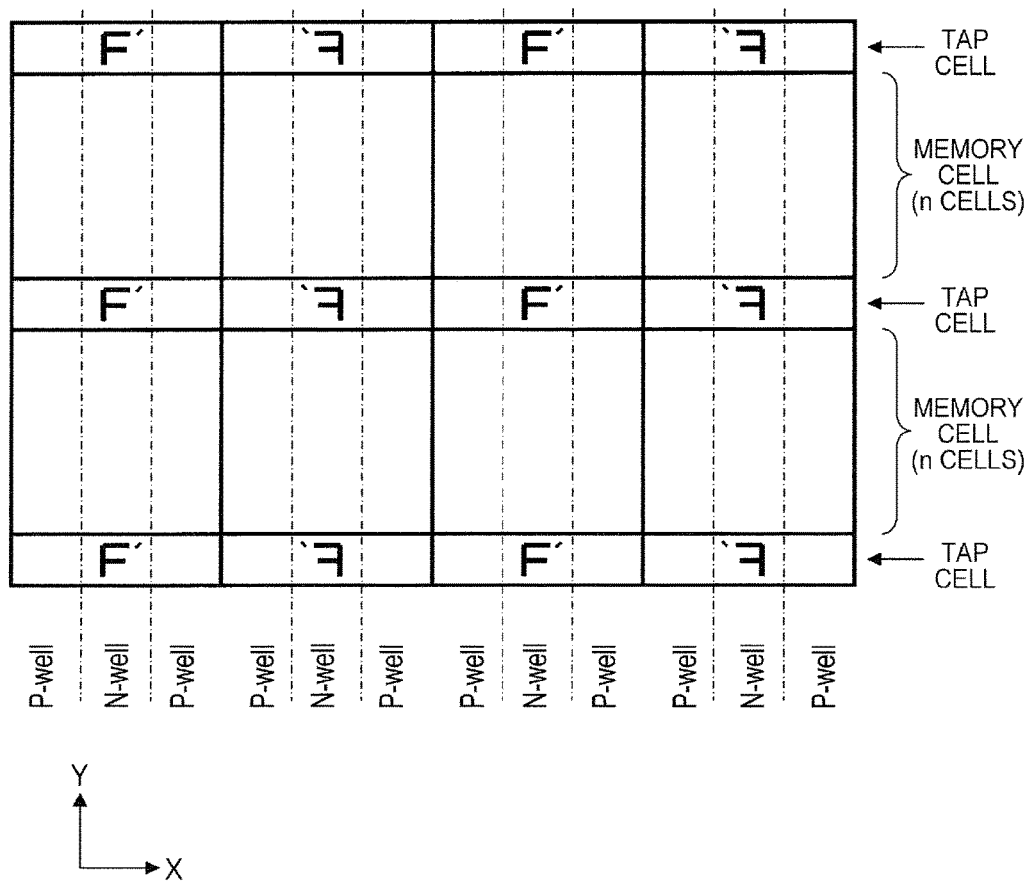
FIG. 15 is a plan view schematically showing the positions of tap cell regions in the SRAM memory cell array according to the first embodiment.

FIG. 15 schematically shows the positions of tap cell regions in the SRAM memory cell array according to this embodiment. As illustrated, tap cells (power supply cells) are provided on the basis of one tap cell per n memory cell regions arranged in the Y direction and repeatedly disposed in the X direction axially symmetrically with respect to each line extending in the Y direction. In other words, a tap cell region is provided in the Y direction for every array of m×n memory cell regions and a plurality of tap cells are arranged in the X direction. The tap cells arranged in X direction are each expressed by "F'."

Figure 16:
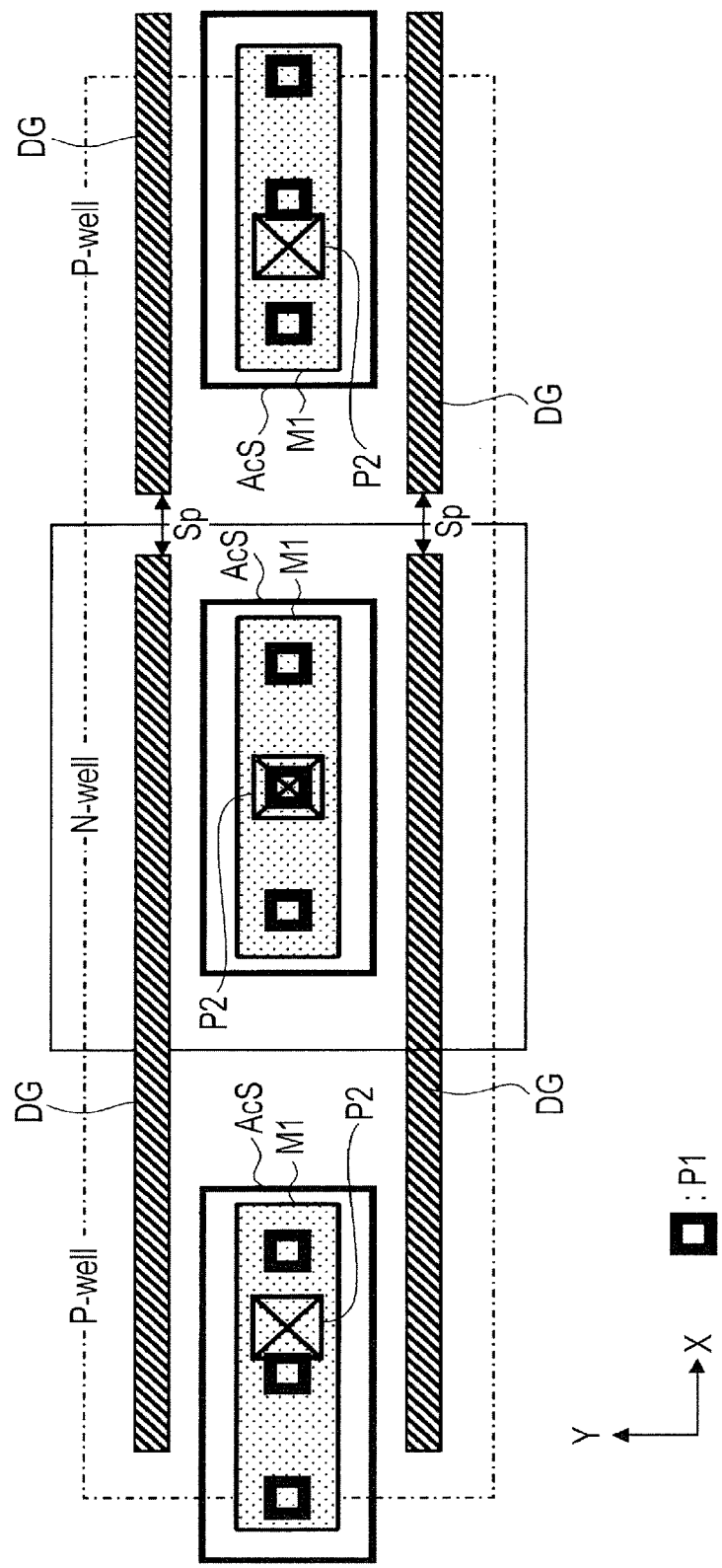
FIG. 16 is a plan view of the tap cell (F') structure of the SRAM according to the first embodiment.
Figure 17:
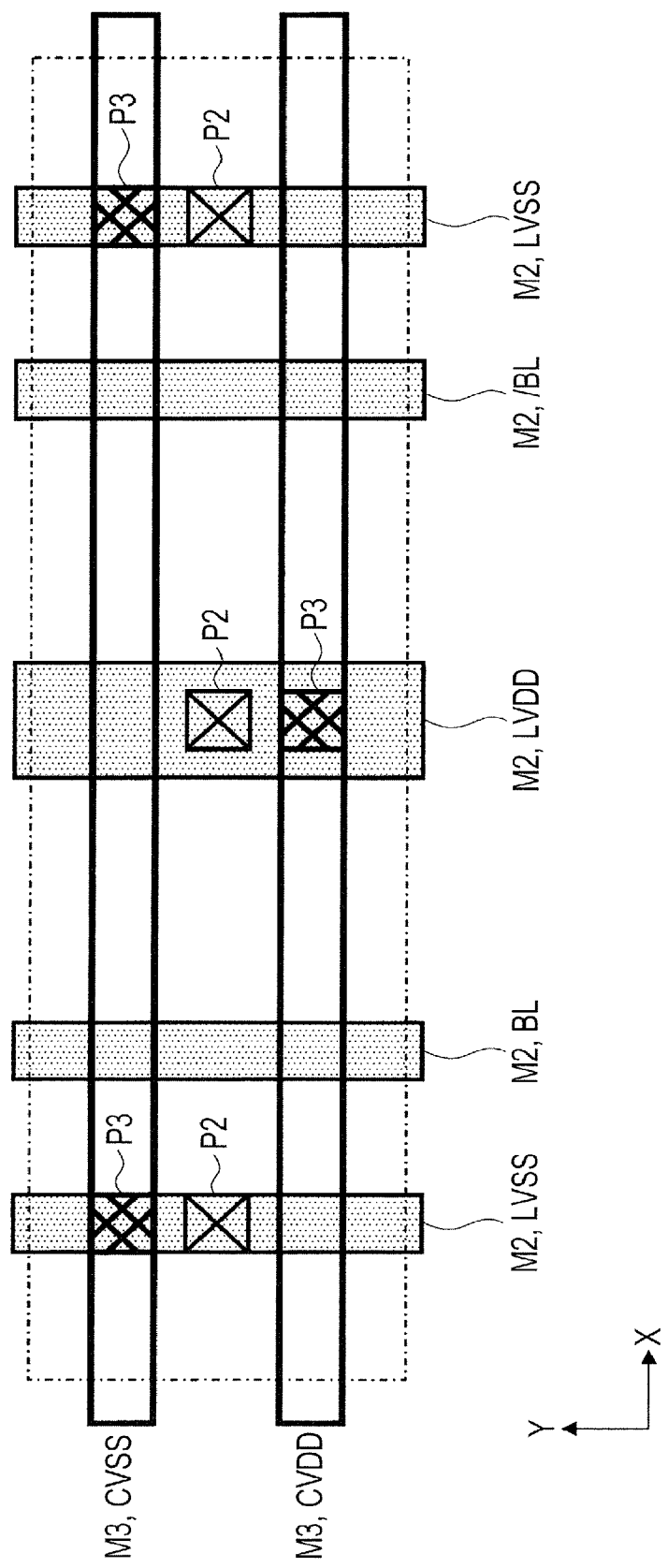
FIG. 17 is a plan view of the tap cell (F') structure of the SRAM according to the first embodiment.

FIGS. 16 and 17 are plan views showing the structure of the SRAM tap cell (F') according to this embodiment. FIG. 16 shows the arrangement of active regions (power supply or voltage supply regions) AcS, dummy gate electrodes DG, first plugs P1, first layer wirings M1 and second plugs P2. FIG. 17 shows the arrangement of the second plugs P2, second layer wirings M2, third plugs P3, and third layer wirings M3. When the plan views of FIGS. 16 and 17 are placed one upon the other with reference to the second plugs P2, the positional relation between the patterns shown in FIGS. 16 and 17 becomes clear. The rectangular area surrounded by the chain line in the figures denotes one tap cell region which may be equal in size to a memory cell region.

As in the memory cell region in which the wells (P-well, N-well, P-well) extend in the Y direction, in the tap cell shown in FIG. 16 the wells also extend in the Y direction, in which the p-type well (P-well), n-type well (N-well), and p-type well (P-well) are arranged side by side in the X direction.

In the tap cell region, three active regions AcS for power supply are arranged side by side in the X direction. The area between active regions AcS is an element isolation region (STI).

Specifically, each active region AcS is an exposed region of a well (P-well, N-well, P-well) and in this case, it is virtually rectangular with its long side in the X direction. The three active regions AcS are arranged in a line extending in the X direction.

Over the left p-type well (P-well) in FIG. 16, first plugs P1 are disposed over the active region AcS and a first layer wiring M1 is disposed over the first plugs P1. A second plug P2 is disposed over the first layer wiring M1. A second layer wiring M2 (LVSS) is disposed over the second plug P2 (FIG. 17). This second layer wiring M2 (LVSS) is the grounding voltage line described above in the "Memory Cell Pattern Layout" section. Furthermore, in the tap cell region, a third plug P3 is disposed over the second layer wiring M2 (LVSS) and a third layer wiring M3 (CVSS) is disposed over it. This third layer wiring. M3 (CVSS) is a common grounding voltage line which is coupled to the grounding voltage lines of the tap cells arranged in the X direction (FIG. 17).

Over the n-type well (N-well), first plugs P1 are disposed over the active region AcS and a first layer wiring M1 is disposed over the first plugs P1. A second plug P2 is disposed over the first layer wiring M1. A second layer wiring M2 (LVDD) is disposed over the second plug P2 (FIG. 17). This second layer wiring M2 (LVDD) is the supply voltage line described above in the "Memory Cell Pattern Layout" section. Furthermore, in the tap cell region, a third plug P3 is disposed over the second layer wiring M2 (LVDD) and a third layer wiring M3 (CVDD) is disposed over it. This third layer wiring M3 (CVDD) is a common supply voltage line which is coupled to the grounding voltage lines of the tap cells arranged in the X direction (FIG. 17).

Over the right p-type well (P-well) in FIG. 16, first plugs P1 are disposed over the active region AcS and a first layer wiring M1 is disposed over the first plugs P1. A second plug P2 is disposed over the first layer wiring M1. A second layer wiring M2 (LVSS) is disposed over the second plug P2 (FIG. 17). This second layer wiring M2 (LVSS) is the grounding voltage line described above in the "Memory Cell Pattern Layout" section. Furthermore, in the tap cell region, a third plug P3 is disposed over the second layer wiring M2 (LVSS) and a third layer wiring M3 (CVSS) is disposed over it. This third layer wiring M3 (CVSS) is a common grounding voltage line which is coupled to the grounding voltage lines of the tap cells arranged in the X direction (FIG. 17).

The bit lines (second layer wiring M2 (BL) and second layer wiring M2 (/BL)), described above in the "Memory Cell Pattern Layout" section, extend over the tap cell region (FIG. 17).

As shown in FIG. 16, in the tap cell region, dummy gate electrodes (dummy gate wirings, dummy gates) DG extend in the X direction over element isolation regions STI. A dummy gate electrode is a conductive film which lies over an element isolation region (STI) and cannot work for transistor operation. This conductive film is made of the same material with the same process as the gate electrodes G.

Due to the existence of these dummy gate electrodes DG, the gate electrode convex-concave profile is regularly repeated, leading to increased layout regularity. This reduces product quality instability and improves the device characteristics. The dummy gate electrodes DG are arranged in a linear form like a line extending in the X direction; in this embodiment, a separator area Sp is provided as appropriate to separate the dummy electrodes (FIG. 16).

Figure 18:
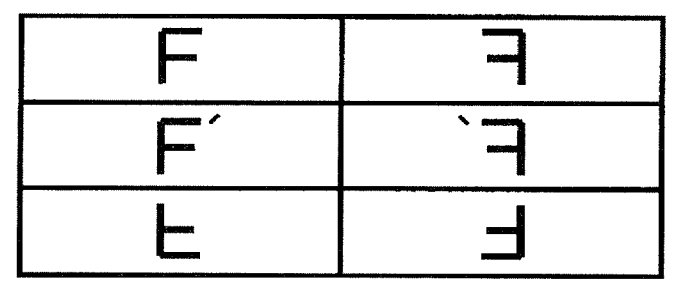
Figure 19:
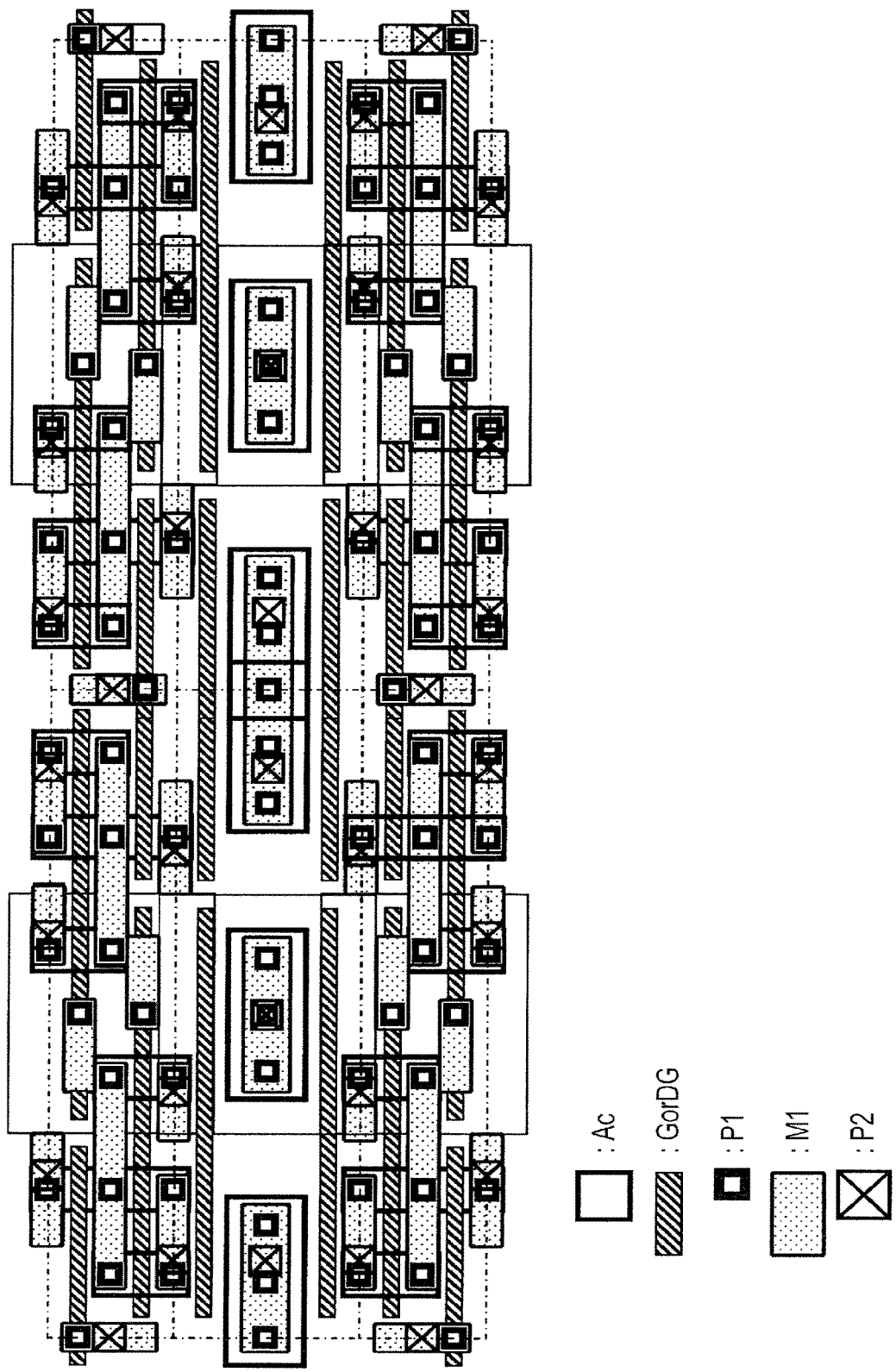
FIG. 19 is a plan view showing how SRAM memory cells and tap cell regions are arranged according to the first embodiment.
Figure 20:
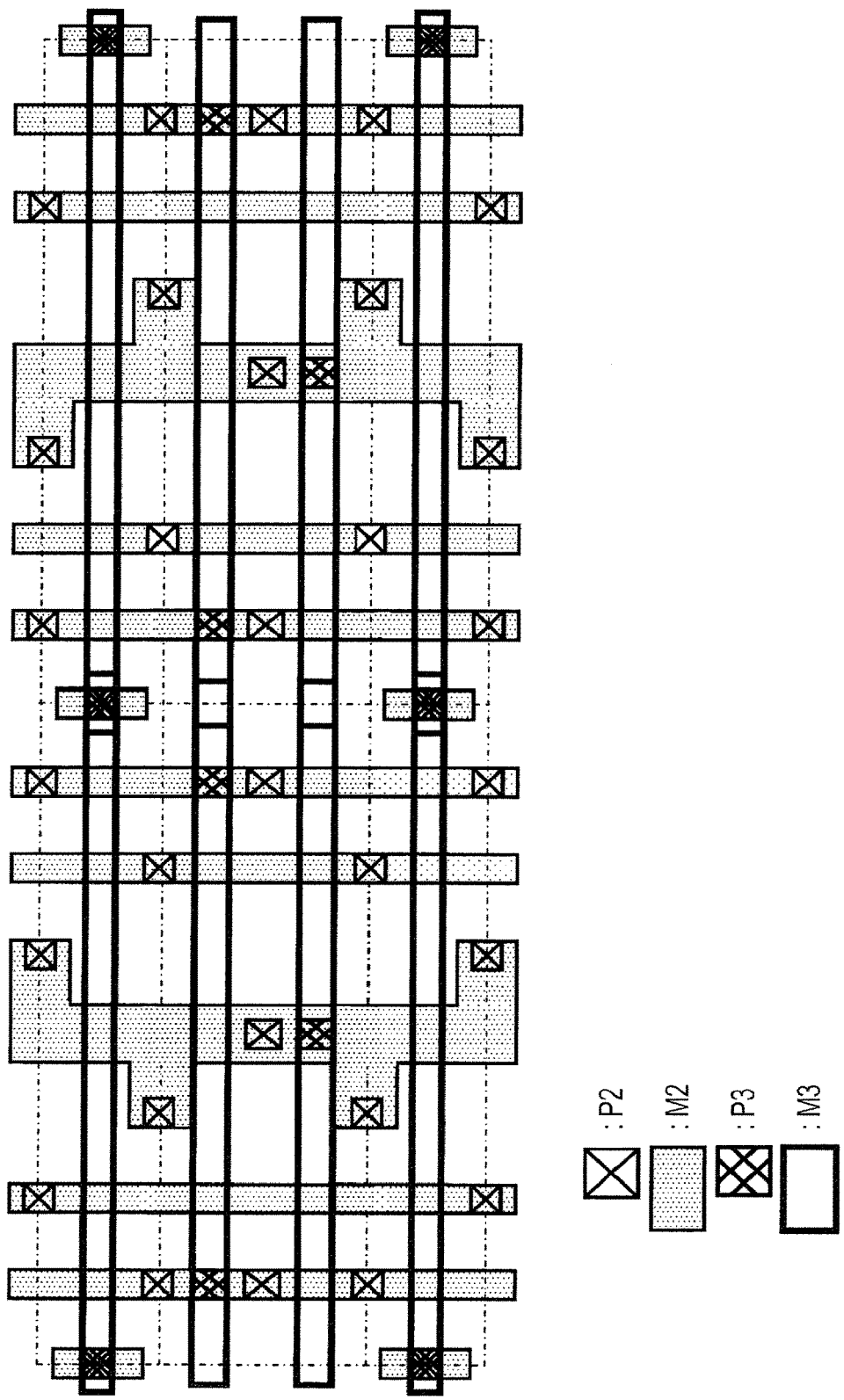
FIG. 20 is a plan view showing how SRAM memory cells and tap cell regions are arranged according to the first embodiment.

FIG. 18 is a plan view schematically showing SRAM memory cells and tap cell regions according to this embodiment. FIGS. 19 and 20 are plan views showing how SRAM memory cells and tap cell regions are arranged according to this embodiment. FIG. 19 shows the layout of the pattern for the lower layers up to the second plugs P2 and FIG. 20 shows the layout of the pattern above the second plugs p2. FIGS. 18 to 20 show 2×3 cell regions, in which the tap cells lie in the second lowest or center row in the figures.

As shown in FIGS. 18 to 20, the dummy gate electrodes DG of each tap cell (F') are located at both ends of the tap cell in the Y direction in a way to sandwich the active region (AcS). The dummy gate electrodes DG may extend in the X direction in a way to form a continuous line; however; in this embodiment, the dummy gate electrodes DG are cut or separated so as to be adjusted to the gate electrodes G of adjacent memory cells. Specifically, separator areas (Sp) are provided as appropriate. Since the dummy gate electrodes DG are arranged in this way, the regularity in the arrangement of the gate electrodes G and dummy gate electrodes DG is increased and device characteristics are improved.

The various patterns of the tap cell (for AcS, DG, P1 to P3, M1 to M3 and so on) can be formed in the same way as those of the memory cell.

Second Embodiment

In the first embodiment, among the six active regions (AcP2, AcP1, AcN1, AcN2, AcP3, and AcP4) arranged side by side in the X direction, AcP2 and AcP1 in which the driver transistors TND1 and TND2 are located are equal in the X length (width in the X direction). Also, AcP3 and AcP4 in which the driver transistors TND3 and TND4 are located are equal in the X length (width in the X direction). However, it is also acceptable that they have different lengths (widths). The width in the X direction of these active regions (Ac) corresponds to the gate width of the relevant transistors. Specifically, in the first embodiment, the gate width of the driver transistor TND1 is equal to the gate width of the driver transistor TND2 and the gate width of the driver transistor TND3 is equal to the gate width of the driver transistor TND4.

By contrast, in a second embodiment, the gate width of the driver transistor TND1 is different from the gate width of the driver transistor TND2 and the gate width of the driver transistor TND3 is different from the gate width of the driver transistor TND4.

Figure 21:
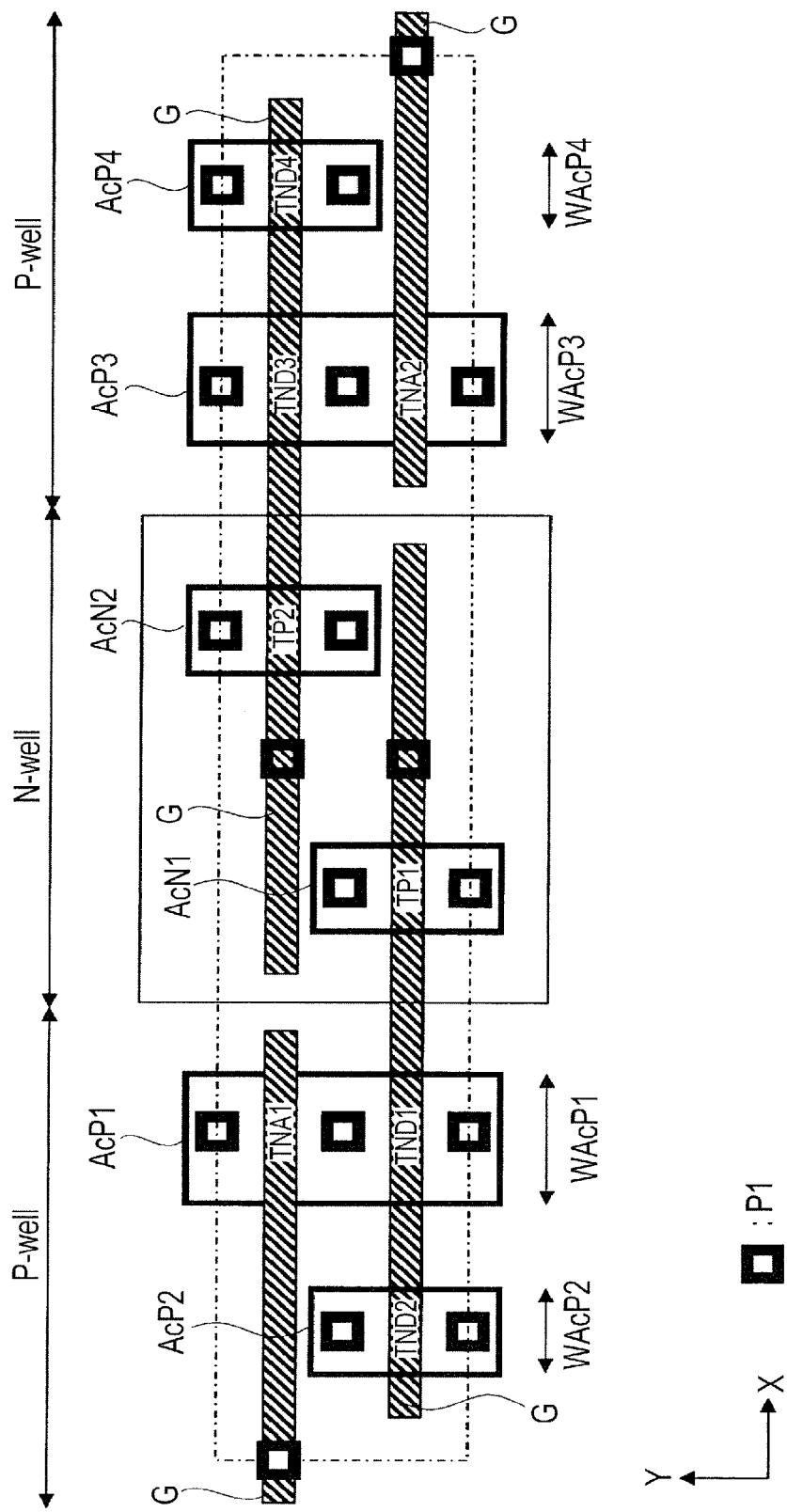
FIG. 21 is a plan view of the SRAM memory cell structure according to a second embodiment of the invention.
Figure 22:
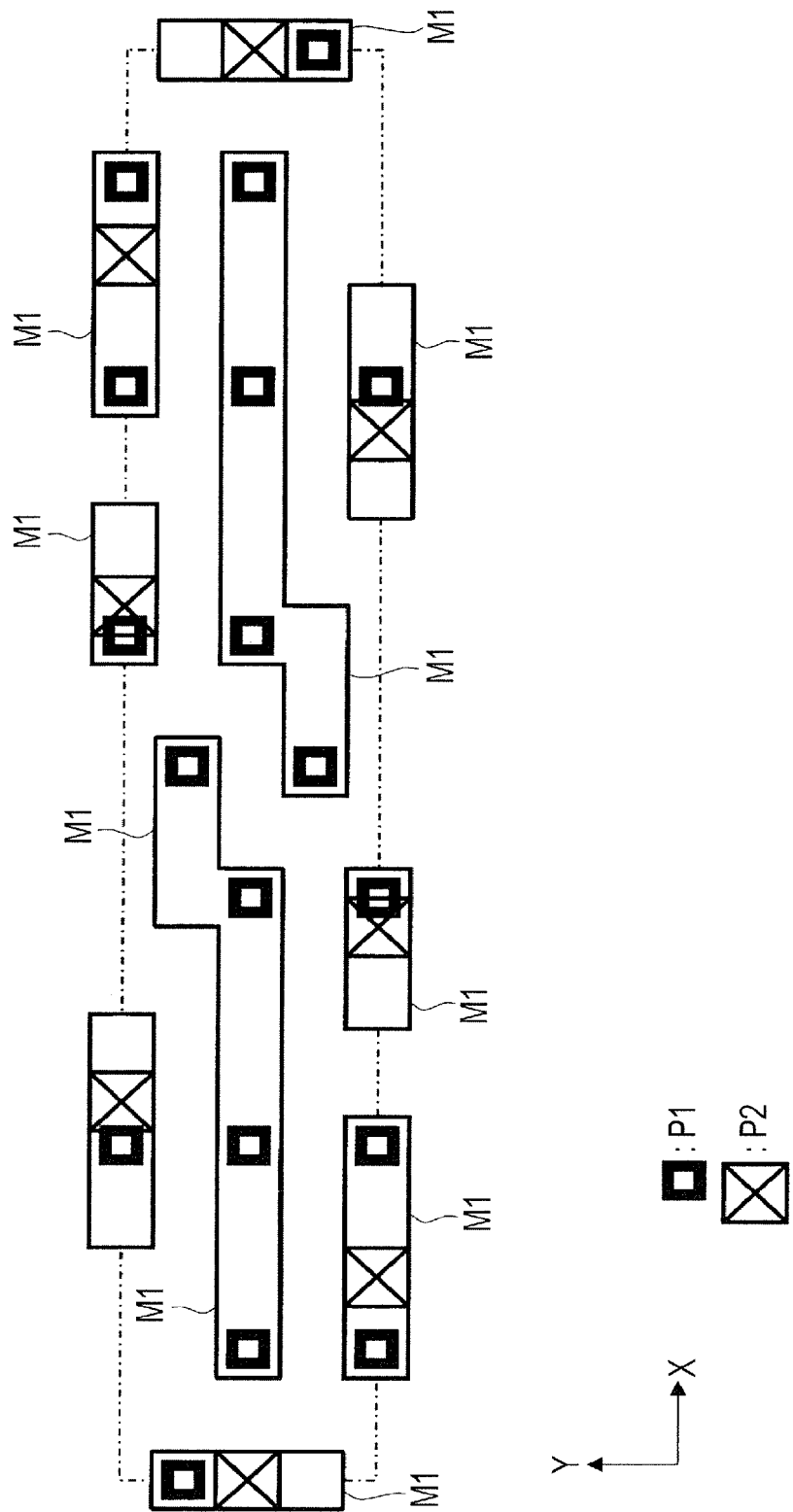
FIG. 22 is a plan view of the SRAM memory cell structure according to the second embodiment.

FIGS. 21 and 22 are plan views showing the SRAM memory cell structure according to the second embodiment. FIG. 21 shows the arrangement of active regions Ac, gate electrodes G, and first plugs P1. FIG. 22 shows the arrangement of the first plugs P1, first layer wirings M1, and second plugs P2. When the plan views of FIGS. 21 and 22 are placed one upon the other with reference to the first plugs P1, the positional relation between the patterns shown in FIGS. 21 and 22 becomes clear. The structure above the second plugs P2, namely the arrangement of second layer wirings M2, third plugs P3, and third layer wirings M3, is the same as that in the first embodiment which has been described referring to FIG. 4. The rectangular area surrounded by the chain line in the figures denotes one memory cell region (for 1 bit).

The memory cell structure is the same as in the first embodiment except the X lengths (widths in the X direction) of AcP2 and AcP1 and the X lengths (widths in the X direction) of AcP4 and AcP3, so detailed description thereof is omitted.

As shown in FIG. 21, the relation of WAcP2<WacP1 may hold, where WAcP2 and WAcP1 denote the widths of the active regions AcP2 and AcP1 respectively. Also, the relation of WAcP4<WacP3 may hold, where WAcP3 and WAcP4 denote the widths of the active regions AcP3 and AcP4 respectively.

Thus, in this embodiment, the driving performance ratio between the driver transistors (TND1 and TND2 or TND3 and TND4) and the access transistor (TNA1 or TNA2) can be easily controlled. In other words, the β ratio can be easily controlled simply by changing the widths of the active regions (AcP2 and AcP1 or AcP4 and AcP3).

In the first embodiment, the ratio between the access transistor (TNA1 or TNA2) gate width and the driver transistor gate width (the sum of the gate widths of TND1 and TND2 or the sum of the gate widths of TND3 and TND4) is 1:2, but this ratio is adjusted according to the SRAM characteristics. It may be necessary to change the performance ratio between the access transistor and driver transistor depending on the type of device or application purpose; for example, there may be a case that reading performance should be better than writing performance. When the gate width of the access transistor (TNA1 or TNA2) is expressed by "a" and the driver transistor gate width (the sum of the gate widths of TND1 and TND2 or the sum of the gate widths of TND3 and TND4) is expressed by "b" and "a" is assumed to be 1, the value b can be easily adjusted to change the ratio of a:b (b/a is sometimes called "β ratio"). Preferably, b/a is 1.1 or more and 3 or less, and more preferably it is 1.5 or more and 2.5 or less.

If b/a=1.1 and the gate width of the driver transistor TND1 and the gate width of the access transistor TNA1 are equal and both expressed by 1, theoretically the gate width of the driver transistor TND2 should be 0.1. This means that the gate width of TND2 is very small, which would cause a problem of pattern instability.

Therefore, the gate width of the driver transistors TND1 and TND2 should be 0.75 or so.

On the other hand, if b/a=1.5, the gate width of the driver transistor TND2 should be 0.5 and in that case it is possible to create the patterns. Alternatively, the gate width of the driver transistor TND1 and that of the access transistor NA1 can be almost equal.

If b/a=3 and the gate width of the access transistor TNA1 is 1, both the driver transistor TND1 and driver transistor TND2 may have a gate width of 1.5.

However, it is more preferable that the gate width of the access transistor TNA1 be 1 and the gate width of both the driver transistors TND1 and TND2 be 1.25 because the gate width difference between the access transistor TNA1 and driver transistor TND1 is smaller than in the above case of b/a=3.

Although the width of the other active regions (AcN1, AcN2) is not limited, in this embodiment their width is the same as the width of the active regions AcP2 and AcP4.

Although the above relation in active region width may be reversed (WAcP2>WAcP1, WAcP4>WAcP3) to change the β ratio, product quality instability is lower and characteristics controllability is higher when the active regions AcP1 and AcP3 which each hold two transistors are larger than the active regions AcP2 and AcP4.

The arrangement of the gate electrodes G and first plugs P1 is the same as in the first embodiment (FIG. 2) so description thereof is omitted. Also, the arrangement of the first plugs P1, first layer wirings M1, and second plugs P2 as shown in FIG. 22 is the same as in the first embodiment (FIG. 3), so description thereof is omitted.

Therefore, this second embodiment brings about the above advantageous effects in addition to the same advantageous effects as those brought about by the first embodiment.

Third Embodiment

In the tap cell according to the first embodiment, the active region AcS over each p-type well (P-well) is coupled to the second layer wiring M2 (LVSS) and the active region AcS over the n-type well (N-well) is coupled to the second layer wiring M2 (LVDD). The second layer wiring M2 (LVSS) is the grounding voltage line described above in the "Memory Cell Pattern Layout" section and the second layer wiring M2 (LVDD) is the supply voltage line described above in the "Memory Cell Pattern Layout" section. In other words, in the first embodiment, power is supplied to the wells through the grounding voltage line and supply voltage line coupled to the memory cell, but instead, wirings (third voltage wiring) other than the grounding voltage line and supply voltage line may be used to supply power to the wells. In a third embodiment, second grounding voltage lines (LVSSB) are used to supply power to the p-type wells (P-well).

[Tap Cell Region]

Figure 23:
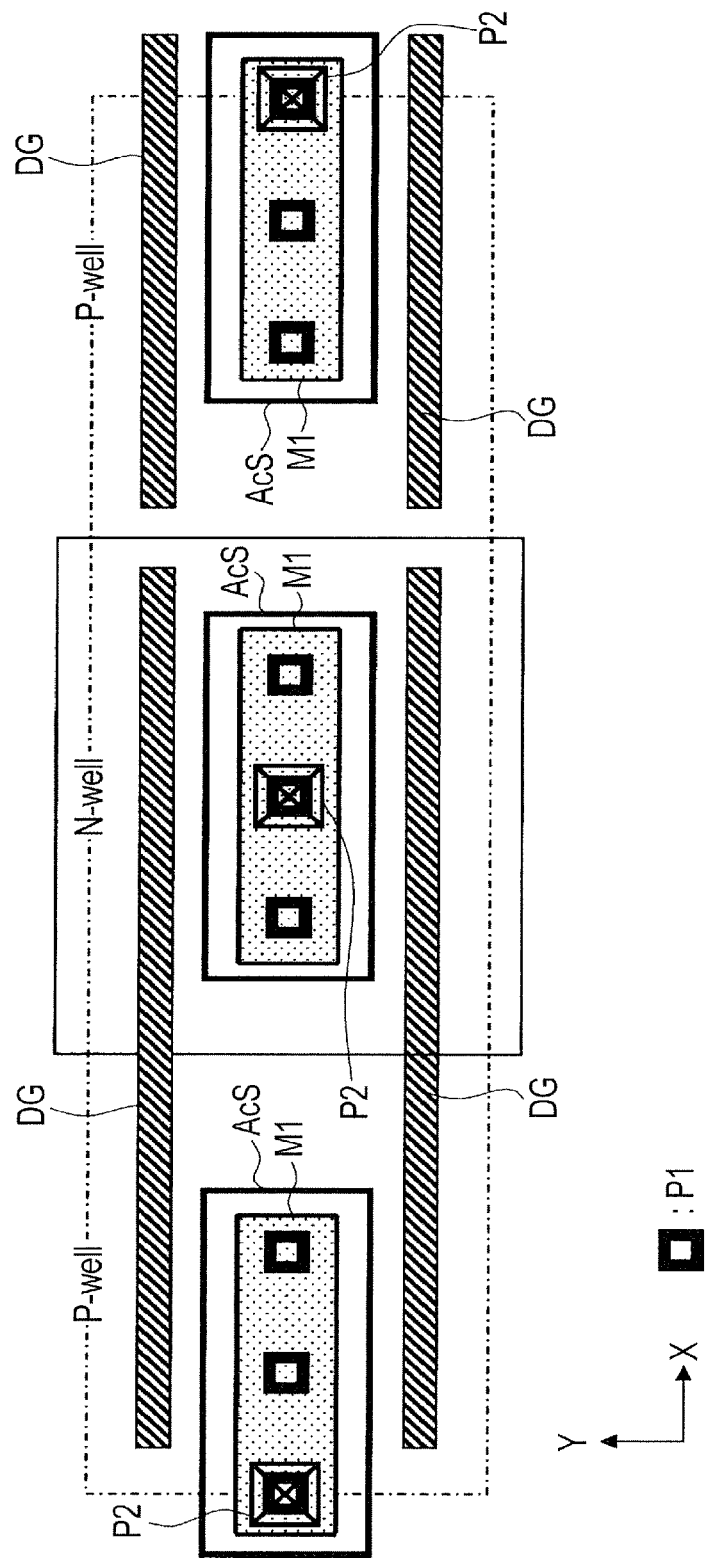
FIG. 23 is a plan view of the SRAM memory tap cell structure according to a third embodiment of the invention.
Figure 24:
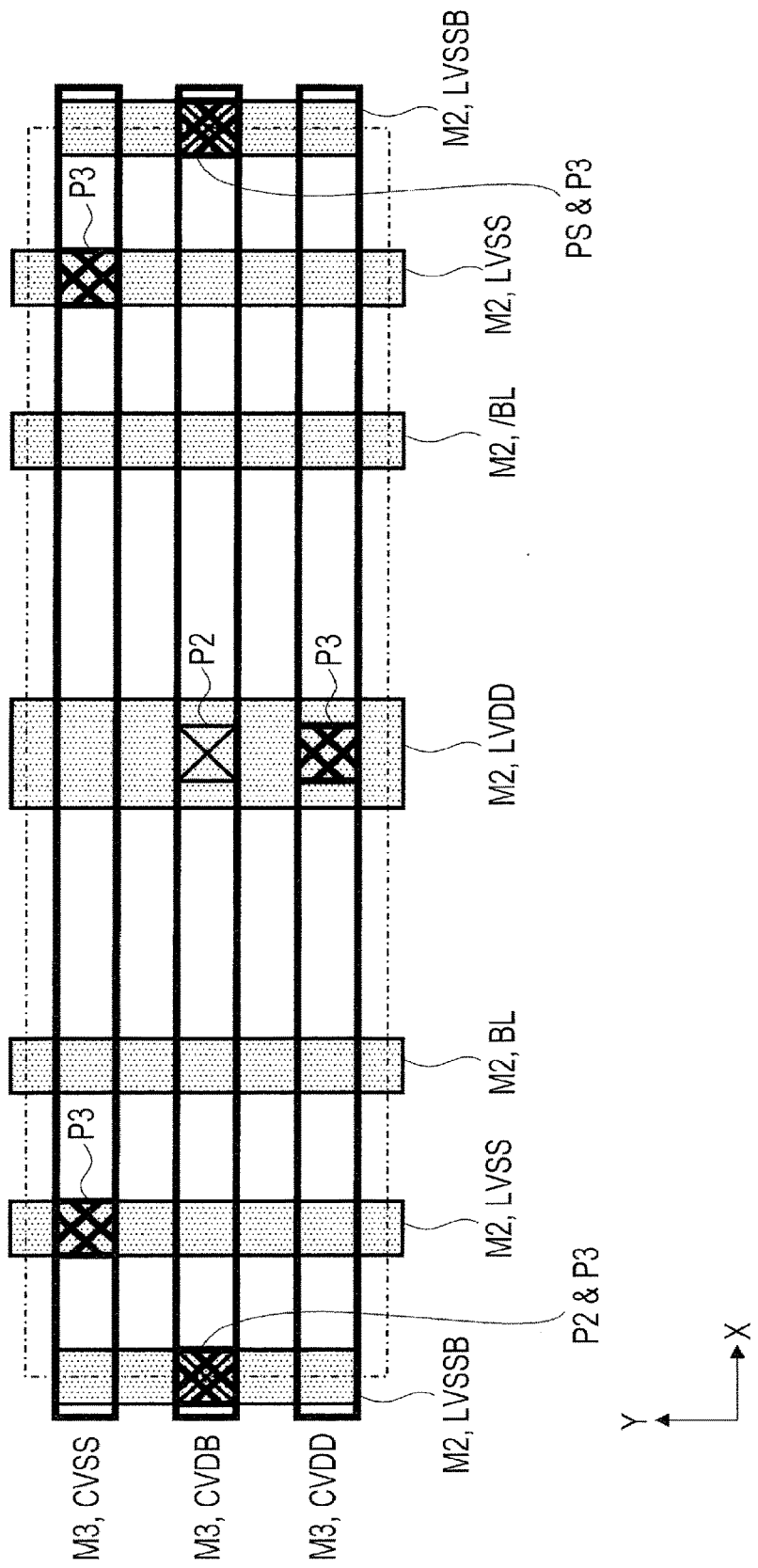
FIG. 24 is a plan view of the SRAM memory tap cell structure according to the third embodiment.

FIGS. 23 and 24 are plan views showing the SRAM tap cell structure according to this embodiment. FIG. 23 shows the arrangement of active regions AcS, dummy gate electrodes DG, first plugs P1, first layer wirings M1, and second plugs P2. FIG. 24 shows the arrangement of the second plugs P2, second layer wirings M2, third plugs P3, and third layer wirings M3. When the plan views of FIGS. 23 and 24 are placed one upon the other with reference to the second plugs P2, the positional relation between the patterns shown in FIGS. 23 and 24 becomes clear. The rectangular area surrounded by the chain line in the figures denotes one tap cell region (equivalent to F' in FIG. 18) which may be equal in size to a memory cell region.

Like the wells (P-well, N-well, P-well) extending in the Y direction in each memory cell region, the wells in the tap cell shown in FIG. 23 extend in the Y direction, in which the p-type well (P-well), n-type well (N-well), and p-type well (P-well) are arranged side by side in the X direction.

In the tap cell region, three active regions AcS for power supply are arranged side by side in the X direction. An area between active regions AcS is an element isolation region (STI).

Specifically, each active region AcS is an exposed region of a well (P-well, N-well, P-well) and in this case, it is virtually rectangular with its long side in the X direction. The three active regions AcS are arranged in a line extending in the X direction.

Over the left p-type well (P-well) in FIG. 23, first plugs P1 are disposed over the active region AcS and a first layer wiring. M1 is disposed over the first plugs P1. A second plug P2 is disposed over the first layer wiring M1 (FIG. 23). A second layer wiring M2 (LVSSB) is located over the second plug P2 (FIG. 24).

This second layer wiring M2 (LVSSB) is a second grounding voltage line which is different from the grounding voltage line described above in the "Memory Cell Pattern Layout" section. Furthermore, in the tap cell region, a third plug P3 is disposed over the second layer wiring M2 (LVSS) and a third layer wiring M3 is disposed over it. This third layer wiring M3 functions as a common second grounding voltage line which is coupled to the second grounding voltage lines of the tap cells arranged in the X direction (FIG. 24).

Similarly, over the right p-type well (P-well) in FIG. 23, first plugs P1 are disposed over the active region AcS and a first layer wiring M1 is disposed over the first plugs P1. A second plug P2 is disposed over the first layer wiring M1. A second layer wiring M2 (LVSSB) is disposed over the second plug P2.

This second layer wiring M2 (LVSSB) is a second grounding voltage line which is different from the grounding voltage line described above in the "Memory Cell Pattern Layout" section. Furthermore, in the tap cell region, a third plug P3 is disposed over the second layer wiring M2 (LVSS) and a third layer wiring M3 is disposed over it. This third layer wiring M3 functions as the above common second grounding voltage line which is coupled to the second grounding voltage lines of the tap cells arranged in the X direction (FIG. 24).

As in the first embodiment, over the n-type well (N-well), first plugs P1 and a first layer wiring M1 are disposed over the active region AcS and a second layer wiring M2 (LVDD) is disposed through a second plug P2. This second layer wiring M2 (LVDD) is the supply voltage line described above in the "Memory Cell Pattern Layout" section. Furthermore, in the tap cell region, a third plug P3 is disposed over the second layer wiring M2 (LVDD) and a third layer wiring M3 (CVDD) is disposed over it. This third layer wiring M3 (CVDD) is a common supply voltage line which is coupled to the grounding voltage lines of the tap cells arranged in the X direction (FIGS. 24 and 17).

Furthermore, in the tap cell region, a common grounding voltage line (third layer wiring M3 (CVSS)) is disposed through the third plug P3 over the grounding voltage lines (second layer wirings M2 (LVSS) extending from the memory cell region (FIGS. 24 and 17).

As explained above, in this embodiment, since power is supplied to each p-type well (P-well) through a wiring different from the grounding voltage line coupled to the memory cell, the fixed voltage (transistor back-gate voltage) of the p-type well (P-well) and the voltage of the grounding voltage line coupled to the memory cell can be specified separately.

For example, the voltage of the grounding voltage line coupled to the memory cell and the fixed voltage (transistor back-gate voltage) of the p-type well (P-well) can be set to about 0.1 V and 0 V respectively. When the fixed voltage of the p-type well is lower than the voltage of the grounding voltage line coupled to the memory cell like this, a back bias effect will occur, resulting in reduction in leakage current. When the grounding voltage line coupled to the memory cell and the wiring for power supply to the p-type well (P-well) are provided separately like this, fine adjustments of transistor characteristics can be made to improve the device characteristics.

Figure 25:
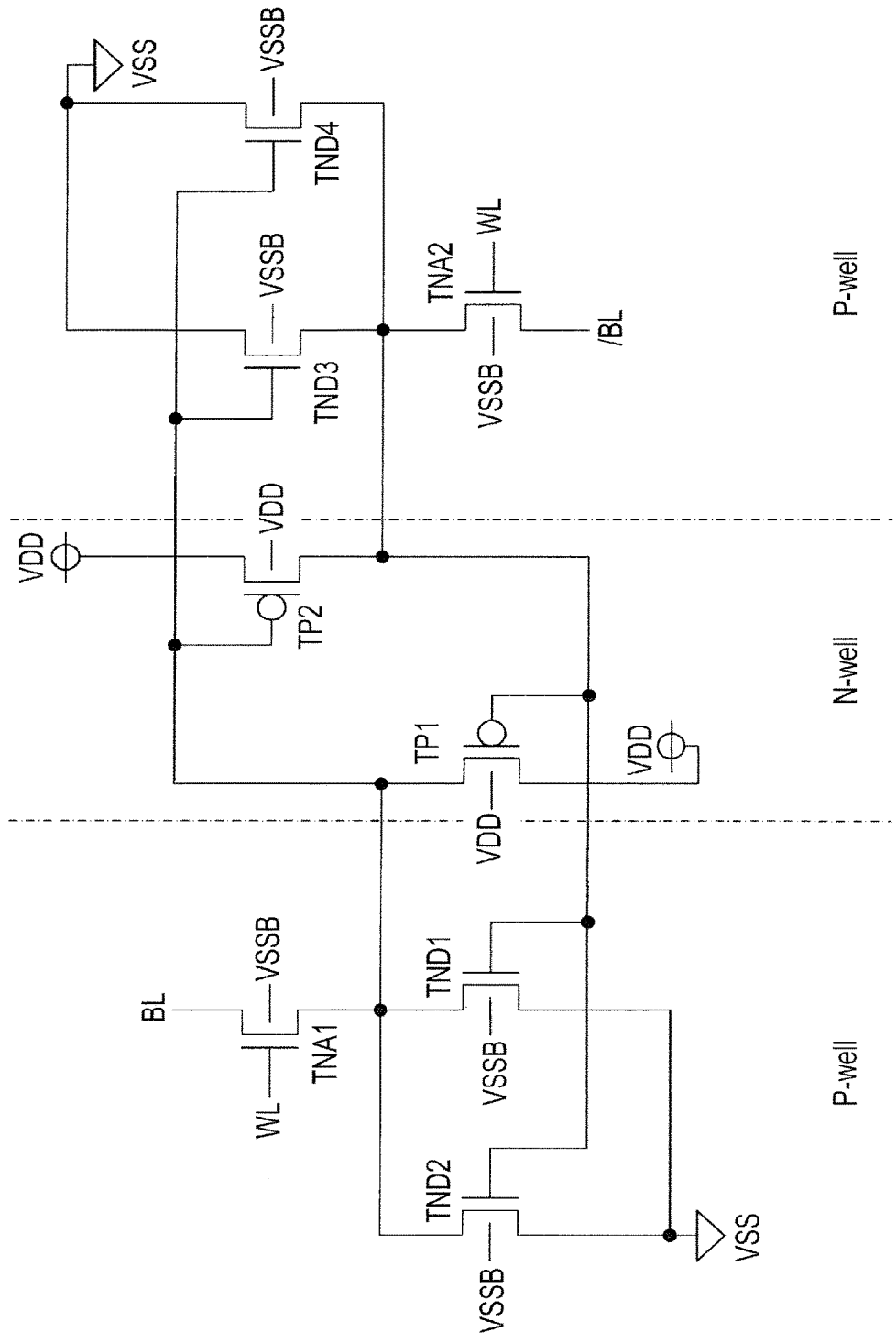
FIG. 25 is a circuit diagram of the SRAM memory cell according to the third embodiment.

FIG. 25 is a circuit diagram showing the SRAM memory cell according to the third embodiment. The memory cell structure and circuit operation are the same as in the first embodiment. While the coupling arrangement of the transistors is the same as in the circuit diagrams shown in FIGS. 1 and 5, the back-gate voltages of the transistors (TND2, TNA1, TND1, TND3, TNA2, and TND4) of the SRAM memory cell are different (VSSB in FIG. 25).

Although not shown in FIG. 5 (first embodiment), the back-gate voltage of the n-type transistors (TND2, TNA1, TND1, TND3, TNA2, and TND4) is the grounding voltage (VSS) and the back-gate voltage of the p-type transistors (TP1 and TP2) is the supply voltage (VDD). On the other hand, in FIG. 25 (third embodiment), the back-gate voltage of the n-type transistors (TND2, TNA1, TND1, TND3, TNA2, and TND4) is the second grounding voltage (VSSB). The back-gate voltage of the p-type transistors (TP1 and TP2) is the supply voltage (VDD).

Although in this embodiment the grounding voltage line is provided separately, it is also possible that the supply voltage line is provided separately.

For example, over the same n-type well (N-well) as shown in FIG. 16, first plugs P1 are disposed over the active region AcS and a first layer wiring M1 is disposed over the first plugs P1 as in the first embodiment. A second plug P2 is disposed over the first layer wiring M1 and a second layer wiring M2 is disposed over it. This second layer wiring is located on the right of the same supply voltage line (LVDD) as shown in FIG. 16 and functions as a secondary supply voltage line (LVDDB). In other words, the left one of the two second layer wirings is used as the supply voltage line (LVDD) and the right one is used as the secondary supply voltage line (LVDDB). Then, the supply voltage line (LVDD) and secondary supply voltage line (LVDDB) are coupled to different third layer wirings (common supply voltage line and common secondary supply voltage line) through the third plugs P3 respectively.

According to the above structure, the back-gate voltage of the p-type transistors (TP1, TP2) may be used as the secondary supply voltage (VDDB). For example, a latch-up phenomenon can be prevented by providing a p-type transistor with a relatively high conduction resistance between the secondary supply voltage line (LVDDB) and the supply voltage line (LVDD) coupled to the memory cell.

As discussed above, a second line for grounding voltage (VSS) may be added or a second line for supply voltage (VDD) may be added. It is needless to say that second lines may be added for both grounding voltage (VSS) and supply voltage (VDD).

Fourth Embodiment

Figure 26:
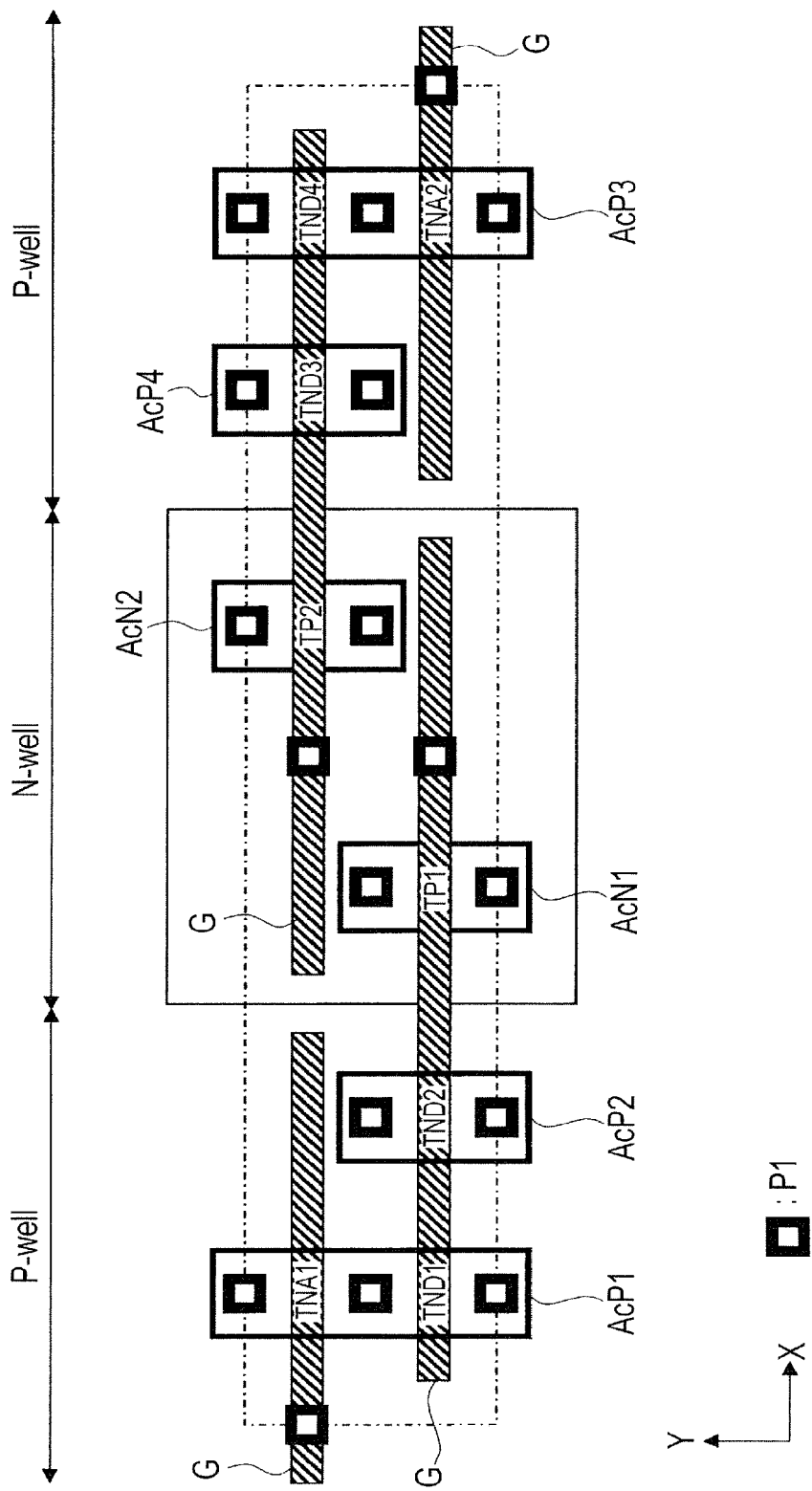
FIG. 26 is a plan view of the SRAM memory cell structure according to a fourth embodiment of the invention.

Although six active regions (AcP2, AcP1, AcN1, AcN2, AcP3, and AcP4) are arranged side by side in the X direction in the order of mention (FIG. 2) in the memory cell according to a first embodiment, it is also acceptable to exchange the positions of AcP2 and AcP1 and exchange the positions of AcP3 and AcP4 (FIG. 26).

[Memory Cell Structure]
[Memory Cell Pattern Layout]

Figure 27:
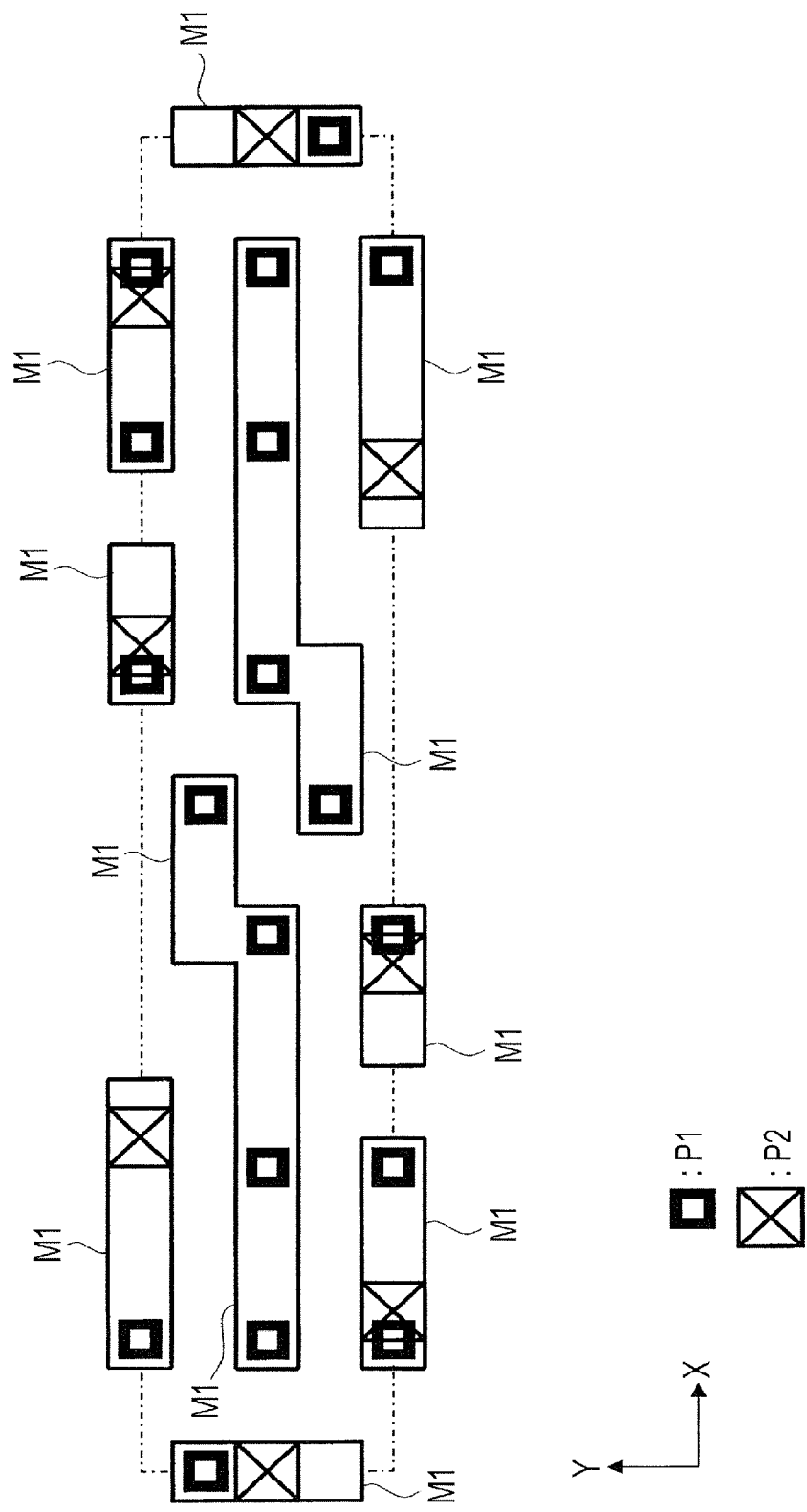
FIG. 27 is a plan view of the SRAM memory cell structure according to the fourth embodiment.
Figure 28:
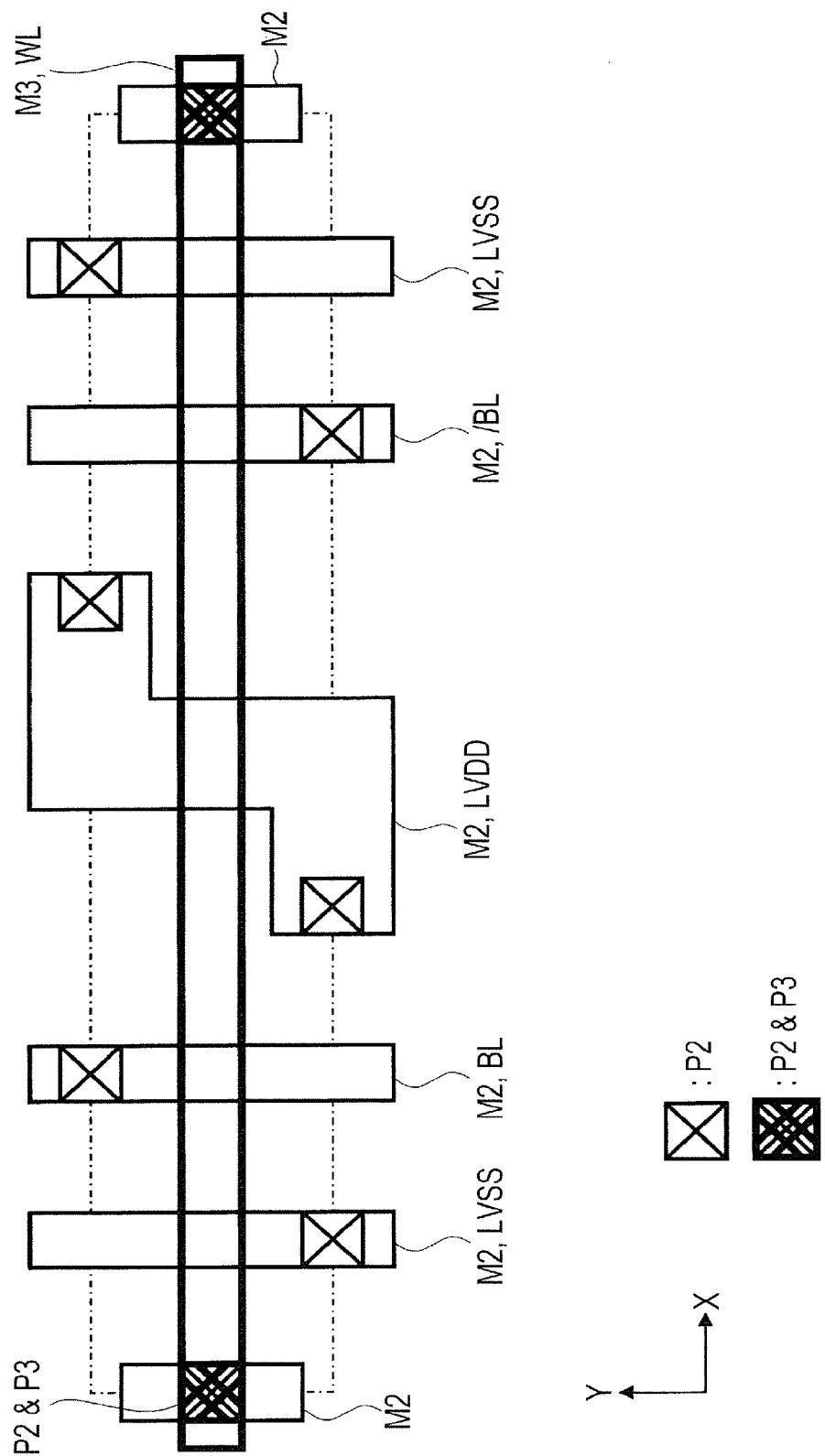
FIG. 28 is a plan view of the SRAM memory cell structure according to the fourth embodiment.

FIGS. 26 to 28 are plan views showing the SRAM memory cell structure according to the fourth embodiment. FIG. 26 shows the arrangement of active regions Ac, gate electrodes G, and first plugs P1. FIG. 27 shows the arrangement of the first plugs P1, first layer wirings M1, and second plugs P2. FIG. 28 shows the arrangement of the second plugs P2, second layer wirings M2, third plugs P3, and third layer wiring M3. When the plan views of FIGS. 26 and 27 are placed one upon the other with reference to the first plugs P1, the positional relation between the patterns shown in FIGS. 26 and 27 becomes clear. When the plan views of FIGS. 27 and 28 are placed one upon the other with reference to the second plugs P2, the positional relation between the patterns shown in FIGS. 27 and 28 becomes clear. The rectangular area surrounded by the chain line in the figures denotes one memory cell region (for 1 bit).

As shown in FIG. 26, a p-type well (P-well), an n-type well (N-well) and a p-type well (P-well) are arranged side by side in the X direction over the semiconductor substrate. Although only one memory cell region (1 bit) is shown in FIG. 26, memory cells are repeatedly disposed in the X direction and Y direction (FIGS. 12 to 14), so these wells (P-well, N-well, and P-well) are considered to continuously extend in the Y direction. The exposed regions of these wells are active regions (Ac).

Over the semiconductor substrate, six active regions are arranged side by side in the X direction. Unlike the first embodiment, in this embodiment the active regions are arranged in the following order: AcP1, AcP2, AcN1, AcN2, AcP4, and AcP3.

The other constituent elements (G, P1 and so on) are the same as in the first embodiment, so detailed description thereof is omitted. Also the arrangements of the first plugs P1, first layer wirings M1, second plugs P2, second layer wirings M2, third plugs P3, and third layer wirings M3 as shown in FIGS. 27 and 28 are the same as those in the first embodiment as described above referring to FIGS. 3 and 4, so detailed description thereof is omitted.

In this embodiment, concerning the locations of the virtually rectangular active regions AcP1 and AcP2 with their long sides in the Y direction in the memory cell region, AcP1 with the larger long side is remoter from the n-type well (N-well). Also, concerning the locations of the virtually rectangular active regions AcP4 and AcP3 with their long sides in the Y direction in the memory cell region, AcP3 with the larger long side is remoter from the n-type well (N-well). This reduces the well proximity effect.

The well proximity effect refers to a phenomenon that, for example, when a photoresist film is formed in a region other than a region doped with n-type impurities to prevent intrusion of n-type impurities for the formation of an n-type well, the n-type impurities implanted at an edge of the photoresist film (for example, an element isolation region STI) spreads to the gate electrode or source/drain region of an n-type transistor formed in the p-type well and causes deterioration in the characteristics of the n-type transistor. Similarly, the p-type transistor may be affected by p-type impurities for the formation of a p-type well. In other words, fluctuations in transistor characteristics are likely to occur in the boundary between an n-type well and a p-type well due to the well proximity effect and as the miniaturization of memory cells progresses, this problem becomes more serious.

In this embodiment, each active region with the larger long side, namely an active region in which a larger number of transistors are located (AcP1 and AcP3), is remoter from the boundary between the n-type well (N-well) and p-type well (P-well) so that the well proximity effect is reduced and the transistor characteristics are improved.

Figure 29:
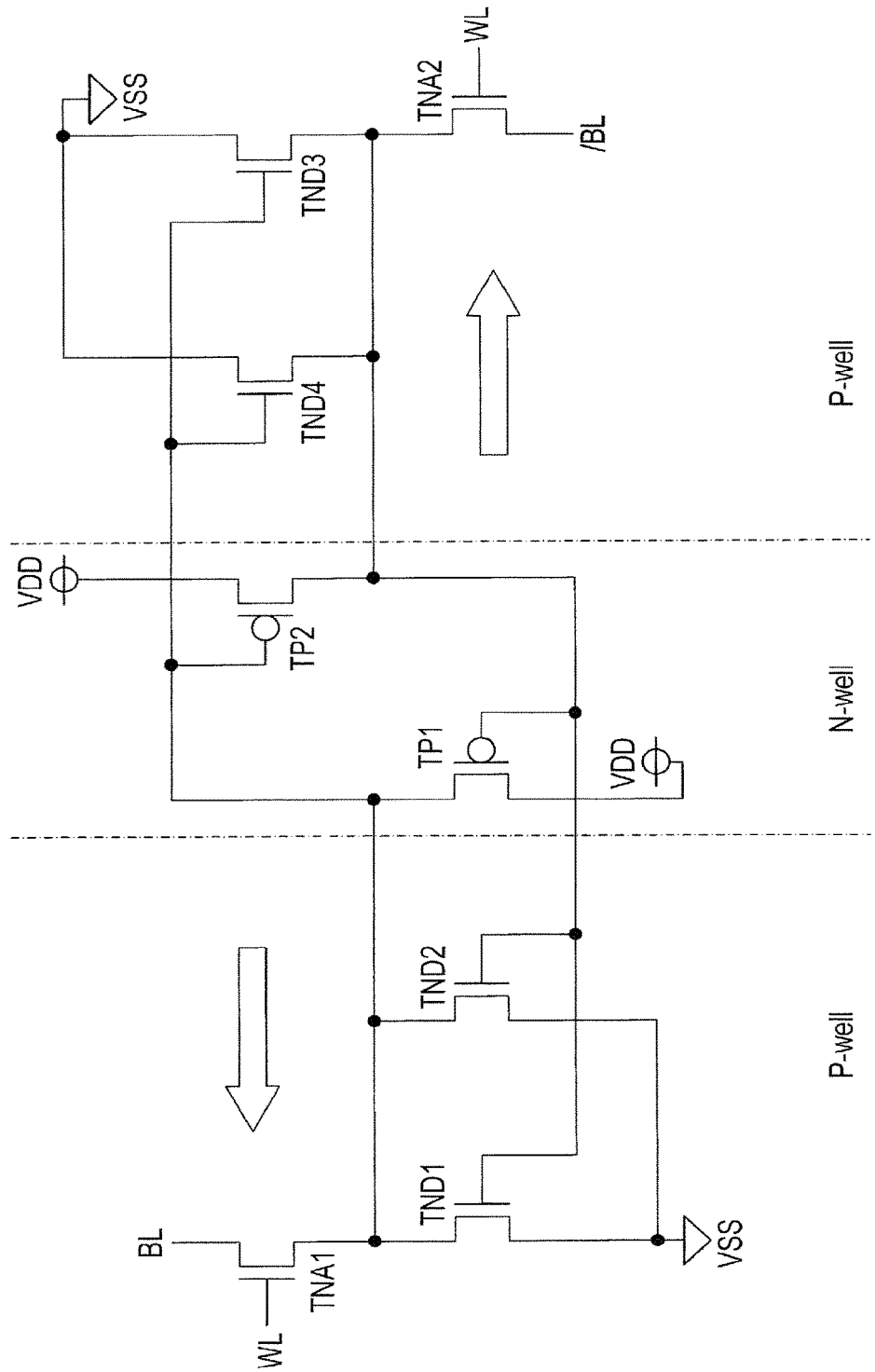
FIG. 29 is a circuit diagram showing that transistors are arranged in line with an SRAM memory cell layout according to the fourth embodiment.

For reference, FIG. 29 is a circuit diagram showing how the eight transistors (TND2, TNA1, TND1, TP1, TP2, TND3, TNA2, TND4) are arranged and interconnected in accordance with the above "Memory Cell Pattern Layout."

As apparent from FIG. 29, each of the transistors TNA1 and TNA2 is remote from the boundary between the n-type well (N-well) and p-type well (P-well) (see the arrows in FIG. 29).

Thus the well proximity effect is reduced and the transistor characteristics (for example, the characteristics of TNA1 and TNA2) are improved.

Therefore, this fourth embodiment brings about the above advantageous effects in addition to the same advantageous effects as those brought about by the first embodiment.

Fifth Embodiment

Although in the memory cell according to the first embodiment, the first plugs P1 are disposed over the source/drain regions of the transistors and the gate electrodes G, and the wirings in the layers over the plugs are used to couple them, instead it is possible to use shared plugs (shared contacts) SP1 to couple them.

Figure 30:
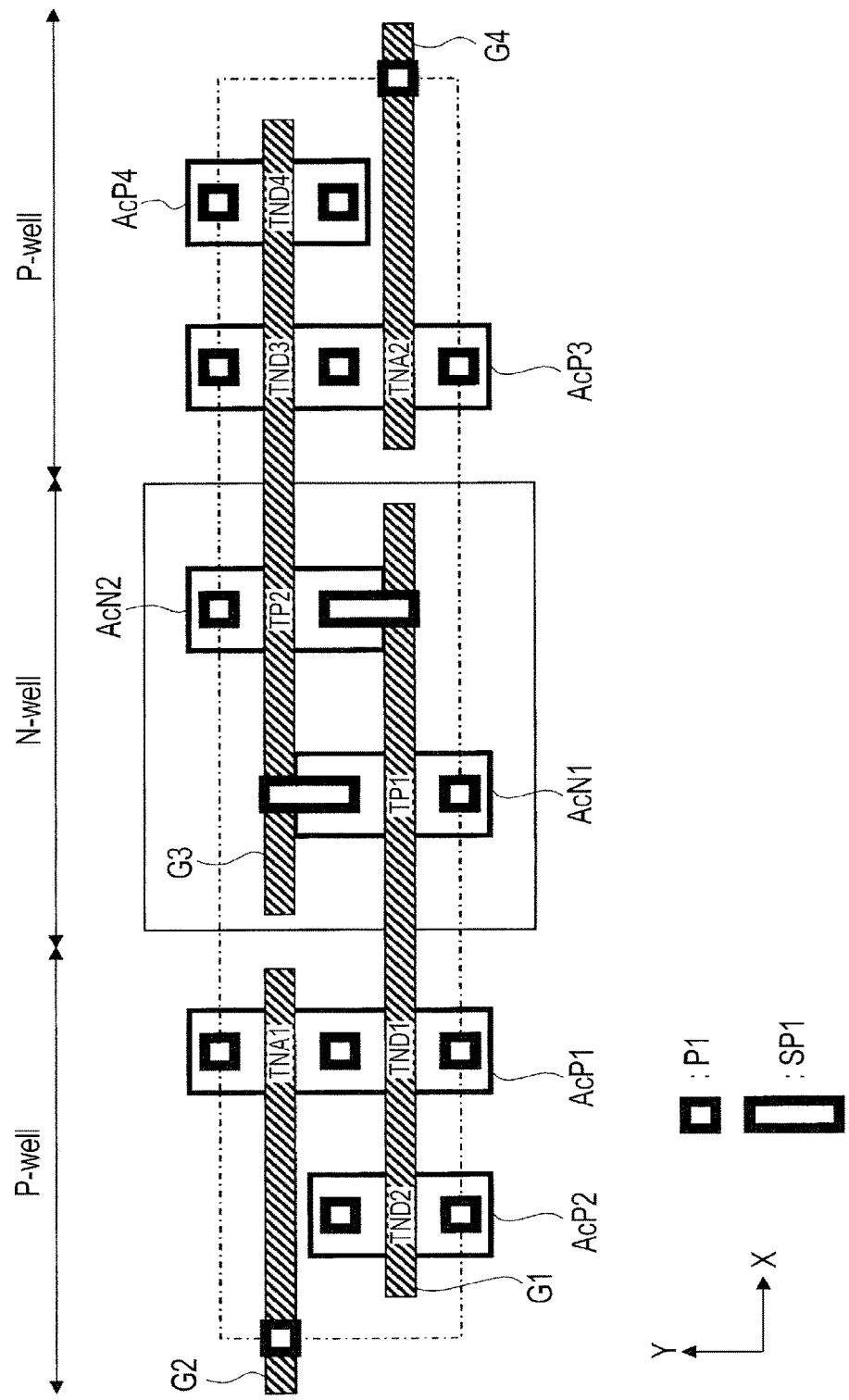
FIG. 30 is a plan view of the SRAM memory cell structure according to a fifth embodiment of the invention.
Figure 31:
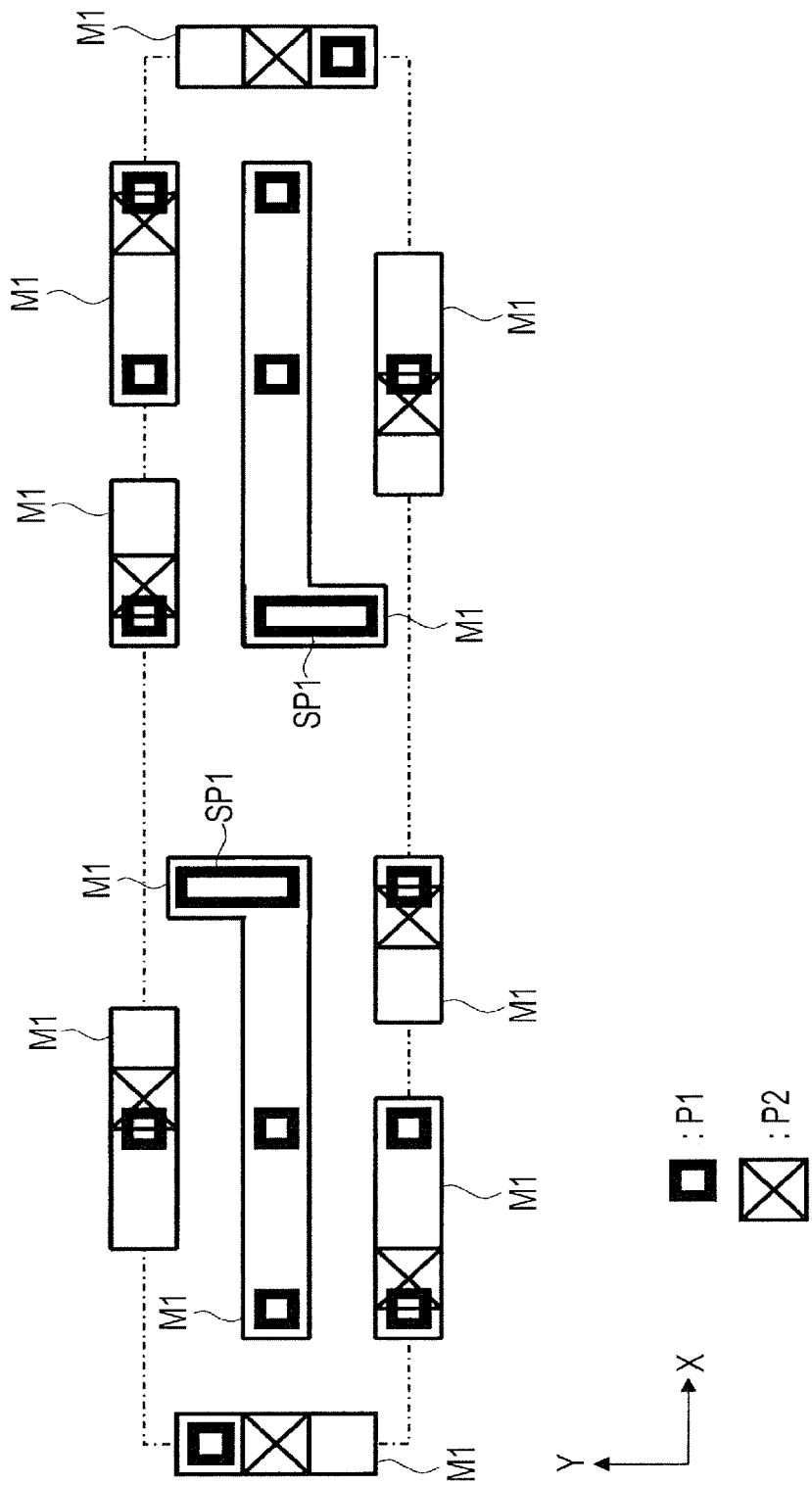
FIG. 31 is a plan view of the SRAM memory cell structure according to the fifth embodiment.
Figure 32:
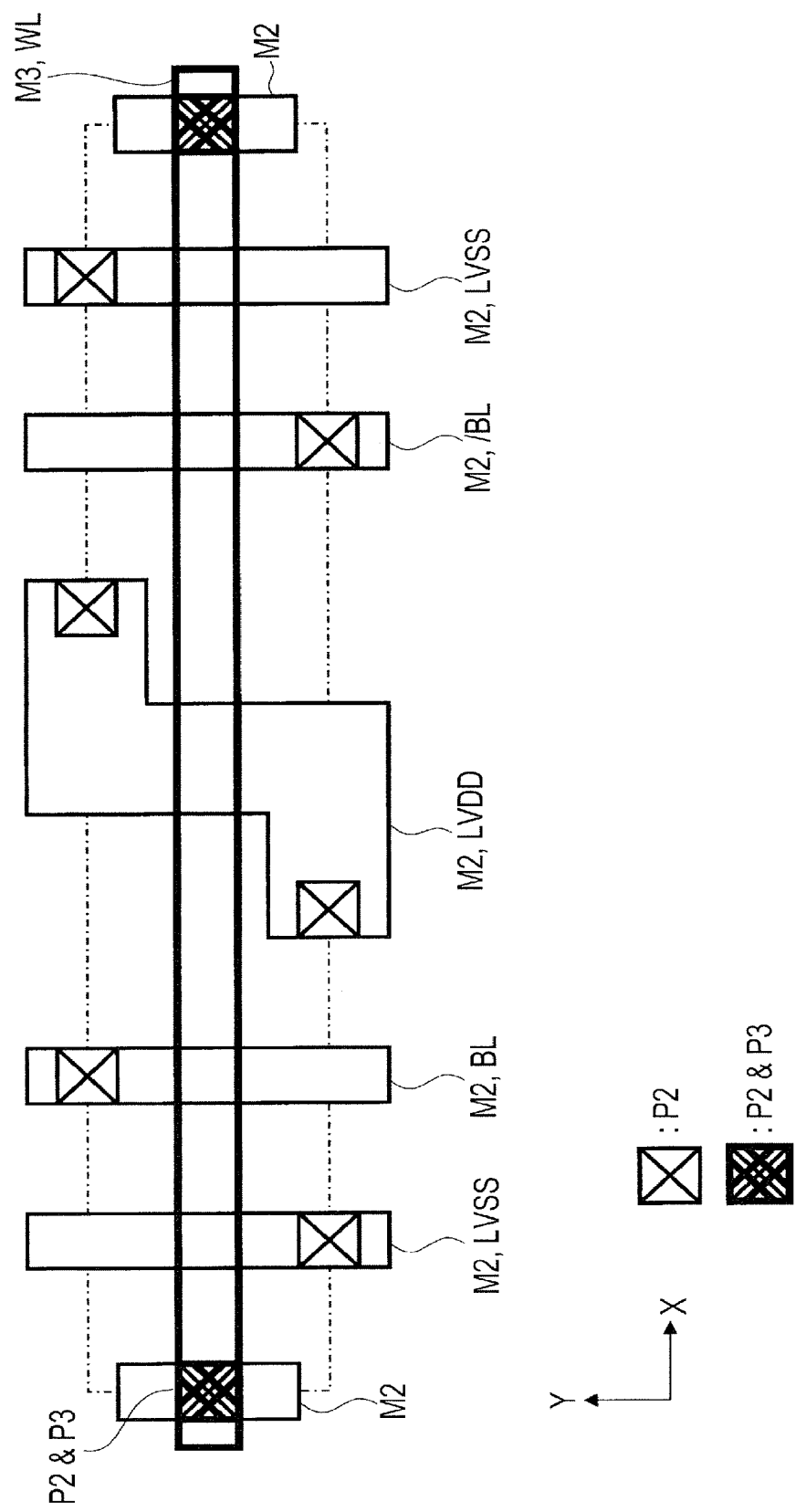
FIG. 32 is a plan view of the SRAM memory cell structure according to the fifth embodiment.

FIGS. 30 to 32 are plan views showing the SRAM memory cell structure according to a fifth embodiment. FIG. 30 shows the arrangement of active regions Ac, gate electrodes G, first plugs P1, and shared first plugs SP1. FIG. 31 shows the arrangement of the first plugs P1, shared first plugs SP1, first layer wirings M1, and second plugs P2. FIG. 32 shows the arrangement of the second plugs P2, second layer wirings M2, third plugs P3, and third layer wiring M3. When the plan views of FIGS. 30 and 31 are placed one upon the other with reference to the first plugs P1 and shared first plugs SP1, the positional relation between the patterns shown in FIGS. 30 and 31 becomes clear. When the plan views of FIGS. 31 and 32 are placed one upon the other with reference to the second plugs P2, the positional relation between the patterns shown in FIGS. 31 and 32 becomes clear. The rectangular area surrounded by the chain line in the figures denotes one memory cell region (for 1 bit).

[Memory Cell Pattern Layout]

The memory cell pattern layout according to the fifth embodiment is the same as in the first embodiment except the shared first plugs SP1, so detailed description thereof is omitted and the shared plugs SP1 and their vicinities are explained in detail below.

As shown in FIG. 30, in this embodiment, a p-type well (P-well), an n-type well (N-well), and a p-type well (P-well) are arranged side by side in the X direction as in the first embodiment. Also, six active regions (AcP2, AcP1, AcN1, AcN2, AcP3, and AcP4) are arranged side by side in the X direction. An element isolation region (STI) lies between active regions (Ac).

Gate electrodes G extend over the above six active regions (AcP2, AcP1, AcN1, AcN2, AcP3, and AcP4) through a gate insulating film (GO) in a way to cross the active regions in the X direction, as components of the eight transistors described earlier in the "Circuit Configuration" section in the description of the first embodiment.

Specifically, a common gate electrode G1 is disposed over the active regions AcP2, AcP1, and AcN1 in a way to cross them. Consequently, TND2 is disposed over the active region AcP2, TND1 is disposed over the active region AcP1, and TP1 is disposed over the active region AcN1 and their gate electrodes (G) are coupled to each other. Another gate electrode G2 is disposed over the active region AcP1 in parallel with the common gate electrode G1. Consequently, TNA1 is disposed over the active region AcP1 and a source/drain region of TNA1 and a source/drain region of TND1 are joined (into a common source/drain region).

Also, a common gate electrode G3 is disposed over the active regions AcP4, AcP3, and AcN2 in a way to cross them. Consequently, TND4 is disposed over the active region AcP4, TND3 is disposed over the active region AcP3, and TP2 is disposed over the active region AcN2 and their gate electrodes (G) are coupled to each other. Another gate electrode G4 is disposed over the active region AcP3 in parallel with the common gate electrode G3. Consequently, TNA2 is disposed over the active region AcP3 and a source/drain region of TNA2 and a source/drain region of TND3 are joined (into a common source/drain region).

The above four gate electrodes G are arranged in line on a basis of two electrodes per line. Specifically, the common gate electrode G1 overlying and crossing the active regions AcP2, AcP1, and AcN1 and the gate electrode G4 overlying the active region AcP3 are arranged in a line extending in the X direction. The common gate electrode G3 overlying and crossing the active regions AcP4, AcP3, and AcN2 and the gate electrode G2 overlying the active region AcP1 are arranged in a line extending in the X direction.

First plugs P1 are disposed over the source/drain regions of the eight transistors (TND2, TNA1, TND1, TP1, TP2, TND3, TNA2, and TND4). Also, first plugs P1 are disposed over the four gate electrodes.

A shared first plug SP1 as a continuous plug (monolithic plug) is disposed over one source/drain region of TP2 and the common gate electrode G1 of TP1, TND2, and TND1. Also, a shared first plug SP1 as a continuous plug (monolithic plug) is disposed over one source/drain region of TP1 and the common gate electrode G3 of TP2, TND3, and TND4.

The shared first plugs SP1 may be used in this way to couple a source/drain region and a gate electrode G electrically.

Since the use of the shared first plugs SP1 eliminates the need for the first plugs P1$d$ and P1$h$ shown in FIG. 2, the distance between the active regions AcN1 and AcN2 can be decreased as shown in FIG. 30. Therefore, the memory cell area can be smaller than in the first embodiment (FIG. 2).

As shown in FIGS. 31 and 32, the patterns in the layers over the first plugs P1 and shared first plugs SP1, namely the arrangements of the first layer wirings M1, second plugs P2, second layer wirings M2, third plugs P3, and third layer wiring M3, are almost the same as those in the first embodiment which have been described above referring to FIGS. 3 and 4, so detailed description thereof is omitted here.

Figure 33:
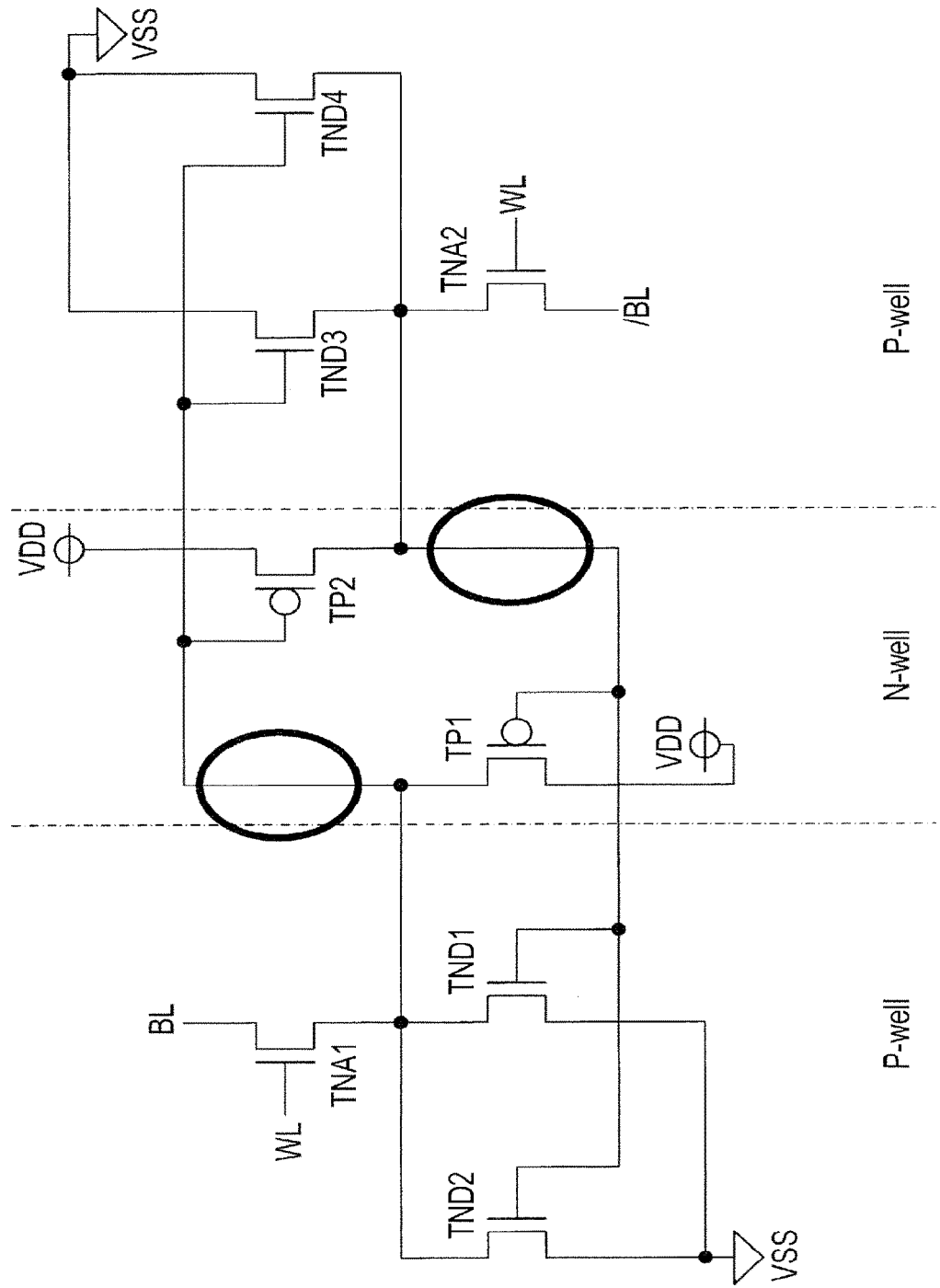
FIG. 33 is a circuit diagram showing that transistors are arranged in line with an SRAM memory cell layout according to the fifth embodiment.

For reference, FIG. 33 is a circuit diagram showing how the eight transistors (TND2, TNA1, TND1, TP1, TP2, TND3, TNA2, and TND4) are arranged and interconnected in accordance with the above "Memory Cell Pattern Layout."

In FIG. 33, the encircled areas correspond to the couplings by the shared first plugs SP1, indicating that a source/drain region and a gate electrode G are coupled using a continuous plug (shared first plug SP1).

The memory cell area can be decreased by using the shared first plugs SP1 in this way.

Therefore, this fifth embodiment brings about the above advantageous effects in addition to the same advantageous effects as those brought about by the first embodiment.

Sixth Embodiment

While in the first embodiment the length of the virtually rectangular memory cell region's side extending in the Y direction (vertical length in the relevant figures) is equivalent to the sum of lengths (heights) of two transistors as described later, in a sixth embodiment the length of the virtually rectangular memory cell region's side extending in the Y direction is equivalent to the sum of lengths of four transistors. The length of one transistor means the sum of a1 and b1 (a1+b1) where a1 denotes the width of gate electrode in the Y direction and b1 denotes the distance between gate electrodes in the Y direction. For example, in the first embodiment, the length of the side of the memory cell region in the Y direction is expressed as 2(a1+b1), or equivalent to the sum of lengths of two transistors (see FIG. 2). In this sixth embodiment, the length of the side of the memory cell region in the Y direction is expressed as 4(a1+b1).

In other words, while in the first embodiment two rows (lines) of gate electrodes G are disposed, in this embodiment four rows (lines) of gate electrodes G are disposed.

The SRAM memory cell structure and circuit operation in this embodiment are the same as those in the first embodiment which have been described referring to FIG. 1.

[Configuration of the SRAM]
[Memory Cell Structure]

Figure 34:
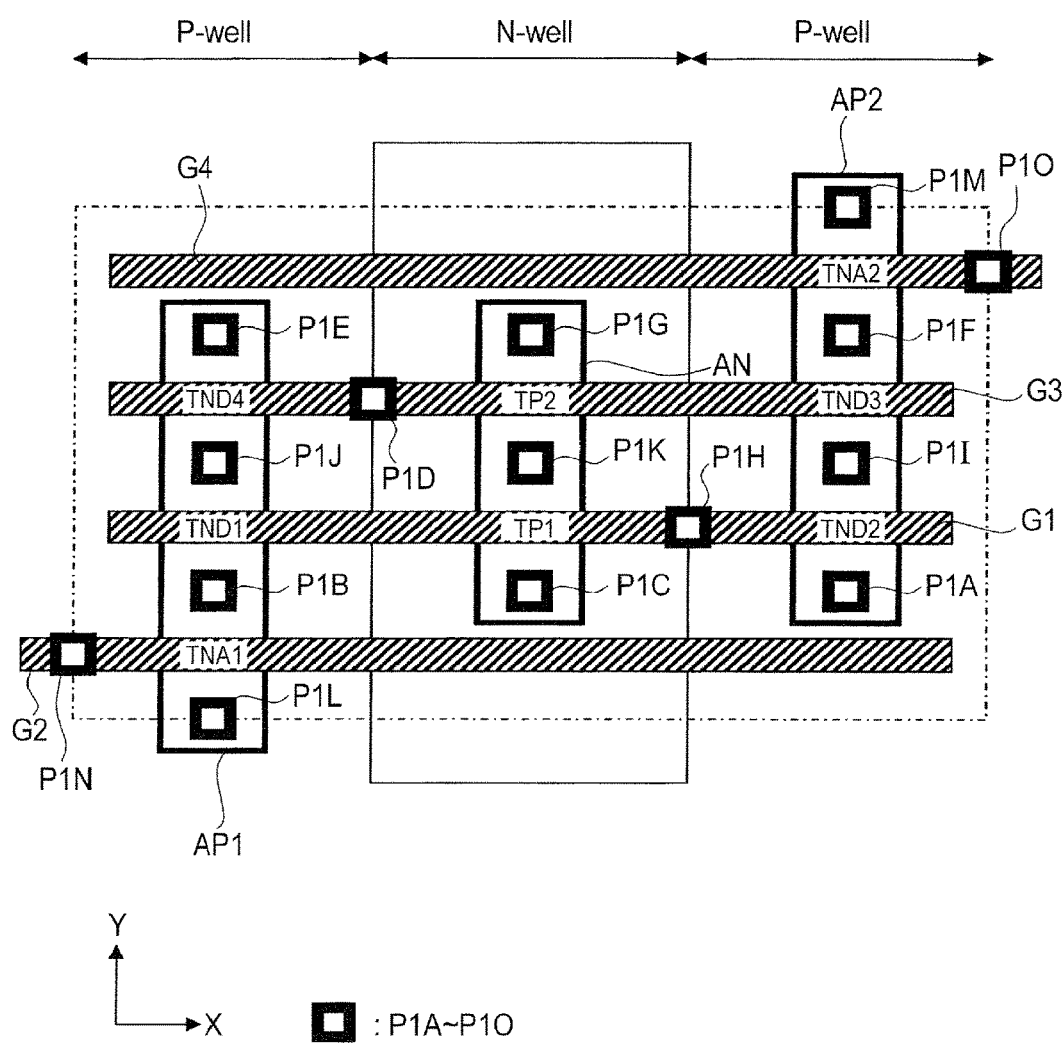
FIG. 34 is a plan view of the SRAM memory cell structure according to a sixth embodiment of the invention.
Figure 35:
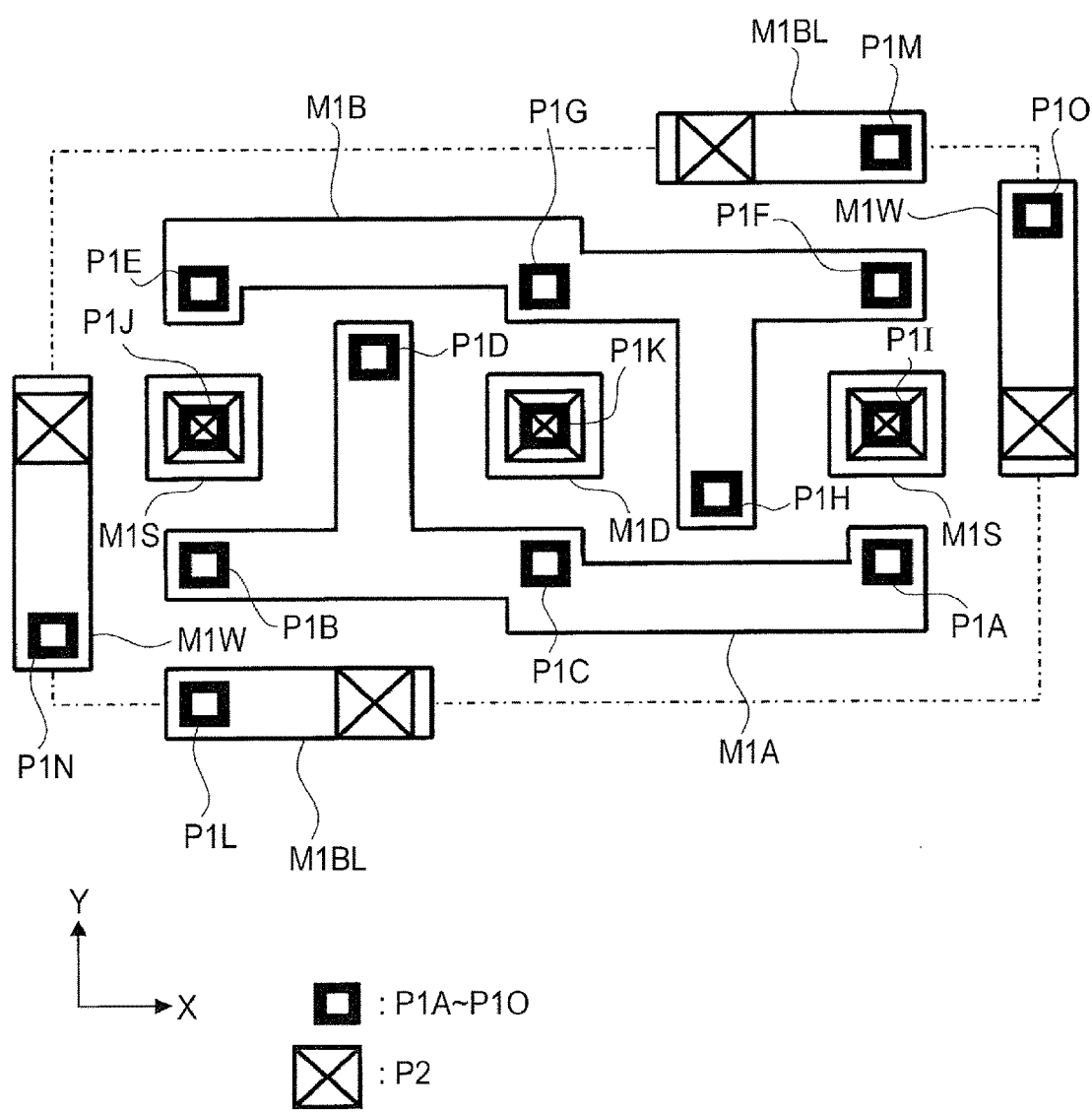
FIG. 35 is a plan view of the SRAM memory cell structure according to the sixth embodiment.
Figure 36:
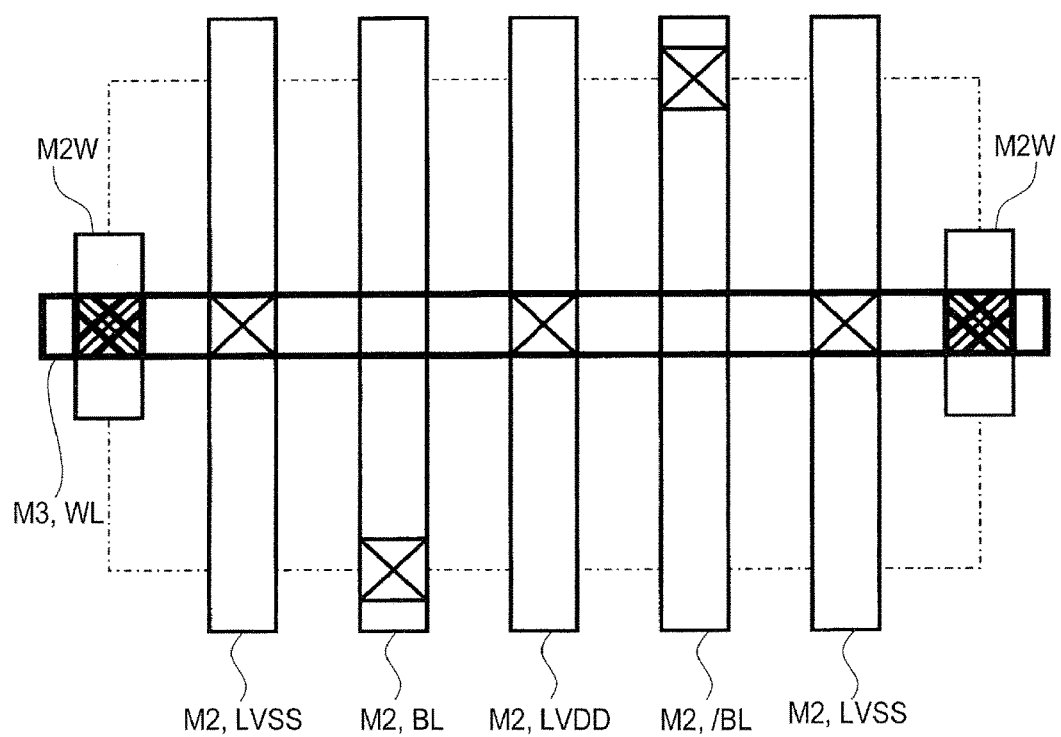
FIG. 36 is a plan view of the SRAM memory cell structure according to the sixth embodiment.

FIGS. 34 to 36 are plan views showing the SRAM memory cell structure according to the sixth embodiment. FIG. 34 shows the arrangement of active regions A, gate electrodes G, and first plugs P1. FIG. 35 shows the arrangement of the first plugs P1, first layer wirings M1, and second plugs P2. FIG. 36 shows the arrangement of the second plugs P2, second layer wirings M2, third plugs P3, and third layer wiring M3. When the plan views of FIGS. 34 and 35 are placed one upon the other with reference to the first plugs P1, the positional relation between the patterns shown in FIGS. 34 and 35 becomes clear. When the plan views of FIGS. 35 and 36 are placed one upon the other with reference to the second plugs P2, the positional relation between the patterns shown in FIGS. 35 and 36 becomes clear. The rectangular area surrounded by the chain line in the figures denotes one memory cell region (for 1 bit).

[Memory Cell Pattern Layout]
[A, G, P1]

As shown in FIG. 34, a p-type well (P-well), an n-type well (N-well), and a p-type well (P-well) are arranged side by side in the X direction over the semiconductor substrate. Although only one memory cell region (1 bit) is shown in FIG. 34, memory cells are repeatedly disposed in the X direction and Y direction (FIG. 12), so these wells (P-well, N-well, and P-well) are considered to continuously extend in the Y direction. The exposed regions of these wells are active regions (A).

Over the semiconductor substrate, three active regions (AP1, AN, AP2) are arranged side by side in the X direction. An element isolation region (STI) lies between active regions (A). In other words, the active regions (A) are marked out by the element isolation regions (STI). The wells (P-well, N-well, and P-well) are continuous with each other under the element isolation regions STI.

Specifically, the active region AP1 is an exposed region of the p-type well (P-well) which is virtually rectangular with its long side in the Y direction. Although only one memory cell region (1 bit) is shown in FIG. 34 for illustration convenience, memory cells are repeatedly disposed in the X direction and Y direction (FIG. 12) and in the memory cell array, the active region AP1 is continuous with an active region of an adjacent memory cell (in this case, a memory cell located below the memory cell region as seen in FIG. 34).

The active region AN is an exposed region of the n-type well (N-well) which is virtually rectangular with its long side in the Y direction.

The active region AP2 is an exposed region of the p-type well (P-well) which is located on the right of the n-type well as seen in the figure and virtually rectangular with its long side in the Y direction. Memory cells are repeatedly disposed in the X direction and Y direction (FIG. 12) and in the memory cell array, the active region AP2 is continuous with, an active region of an adjacent memory cell (in this case, a memory cell located above the memory cell region as seen in FIG. 34).

Gate electrodes G extend over the three active regions (AP1, AN, and AP2) through a gate insulating film (GO) in a way to cross the active regions in the X direction, as components of the eight transistors as described earlier in the "Circuit Configuration" section in the description of the first embodiment.

Specifically, two common gate electrodes (G1 and G3) are disposed over the active regions AP1, AN, and AP2 in a way to cross the active regions. Consequently TND2 and TND3 are disposed in series over the active region AP2, sharing a source/drain region and TND2 and TND3 are disposed in series over the active region P1, sharing a source/drain region, and TP1 and TP2 are disposed in series over the active region AN, sharing a source/drain region. The gate electrodes (G) of TND1, TP1, and TND2 are joined into the common gate electrode G1 and the gate electrodes (G) of TND3, TP2, and TND4 are joined into the common gate electrode G3. These two common gate electrodes (G1 and G3) extend in the X direction in parallel with each other.

A gate electrode G2 is disposed over the active region AP1 in parallel with the two common gate electrodes G (G1 and G3). Consequently, TNA1 is disposed over the active region AP1 and a source/drain region of TNA1 and a source/drain region of TND1 are joined (into a common source/drain region). Also, another gate electrode G4 is disposed over the active region AP2 in parallel with the two common gate electrodes G (G1 and G3). Consequently, TNA2 is disposed over the active region AP2 and a source/drain region of TNA2 and a source/drain region of TND3 are joined (into a common source/drain region).

As mentioned above, in this embodiment, each driver transistor is divided into two transistors (TND1 and TND2 or TND3 and TND4) and these transistors are located over different active regions (AP1 and AP2). In addition, since these active regions (AP1 and AP2) extend in the Y direction, the layout can be simplified and higher patterning accuracy can be achieved.

Therefore, as in the first embodiment, each active region (A) is not supposed to have a bent portion (stepped portion) and it is easy to make the gate width ratio between the access transistor and driver transistor 1:2.

Furthermore, since three transistors are also, disposed over each of the active regions (AP1 and AP2), the number of active regions is decreased. This permits simpler layout and contributes to reduction in memory cell region size.

Furthermore, since the active regions (A) extend in the Y direction, the gate electrodes (G) can extend in the X direction so not only the patterning accuracy of the active regions (A) but also that of the gate electrodes (G) can be improved. Particularly, as detailed in connection with the first embodiment, it is easy to adopt the multiple exposure technique in order to enhance the patterning accuracy. In addition, it is easy to create a simulation model, thereby contributing to improvement in inspection accuracy.

[P1, M1, P2]

As shown in FIG. 35, first plugs P1 are disposed over the source/drain regions of the eight transistors (TND2, TNA1, TND1, TP1, TP2, TND3, TNA2, and TND4) described above referring to FIG. 34. Also, first plugs P1 are disposed over the four gate electrodes described referring to FIG. 34.

First layer wirings M1 are disposed over the first plugs P1 for electrical couplings between first plugs P1.

Specifically, a first plug P1A over one source/drain region of TND2, a first plug P1B over the common source/drain region of TND1 and TNA1, a first plug P1C over one source/drain region of TP1, and a first plug P1D over the common gate electrode (G3) of TP2, TND3, and TND4 are coupled by a first layer wiring (first node wiring) M1A. This first layer wiring M1A corresponds to the storage node A shown in FIG. 1. In the above explanation, "one" means the lower source/drain region of each relevant transistor (TND2, TP1) as seen in FIG. 34.

A first plug P1E over one source/drain region of TND4, a first plug P1F over the common source/drain region of TND3 and TNA2, a first plug P1G over one source/drain region of TP2, and a first plug P1H over the common gate electrode (G1) of TP1, TND1, and TND2 are coupled by a first layer wiring M1B. This first layer wiring (second node wiring) M1B corresponds to the storage node B shown in FIG. 1. In the above explanation, "one" means the upper source/drain region of each relevant transistor (TND4, TP2) as seen in FIG. 34.

Also a first layer wiring (pad region) M1S is disposed over a first plug P1I over the other source/drain region of TND2. Also a first layer wiring M1S is disposed over a first plug P1J over the other source/drain region of TND1.

Also a first layer wiring (pad region) M1D is disposed over a first plug P1K over the common source/drain region of TP1 and TP2. This first layer wiring M1D corresponds to the supply voltage (VDD) in FIG. 1 and is coupled to a supply voltage line (LVDD) as described later.

First layer wirings M1BL are disposed over a first plug P1L over the other source/drain region of TNA1, and a first plug P1M over the other source/drain region of TNA2 respectively.

First layer wirings M1W are disposed over a first plug P1N over the gate electrode (G2) of TNA1, and a first plug P1O over the gate electrode (G4) of TNA2 respectively.

The couplings between first plugs P1 by the first layer wirings M1 may be modified in various ways as far as the interconnection structure shown in the circuit diagram of FIG. 1 is satisfied.

[P2, M2, P3, M3]

As shown in FIG. 36, second plugs 22 are disposed over the first layer wirings M1, among the first layer wirings M1 described above referring to FIG. 35, other than the first layer wirings M1 (M1A and M1B) corresponding to the storage nodes (A and B), and second layer wirings M2 are disposed over them.

Specifically, the first layer wiring M1W coupled to the gate electrode (G2) of TNA1 is coupled to a second layer wiring M2W through a second plug P2. The first layer wiring M1W coupled to the gate electrode (G4) of TNA2 is coupled to a second layer wiring M2W through a second plug P2. These two second layer wirings M2W extend in the Y direction at the ends of the memory cell region in the X direction. Furthermore, third plugs P3 are disposed over the two second layer wirings M2W and a third layer wiring M3 (WL) extends in the X direction so as to couple the two third plugs P3. This third layer wiring M3 (WL) is a word line.

The first layer wiring (pad region) M1S coupled to the common source/drain region (P1I) of TND2 and TND3 is coupled to a second layer wiring M2 (LVSS) through a second plug P2. This second layer wiring M2 (LVSS) is a grounding voltage line. The first layer wiring (pad region) M1S coupled to the common source/drain region (P1J) of TND1 and TND4 is coupled to a second layer wiring M2 (LVSS) through a second plug P2. This second layer wiring M2 (LVSS) is a grounding voltage line. These two grounding voltage lines extend in the Y direction between the above two second layer wirings M2 located at the ends of the memory cell region.

The first layer wiring M1BL coupled to the other source/drain region of TNA1 is coupled to a second layer wiring M2 (BL) through a second plug P2. This second layer wiring M2 (BL) is one bit line of the bit line pair. The first layer wiring M1BL coupled to the other source/drain region of TNA2 is coupled to a second layer wiring M2 (/BL) through a second plug P2. This second layer wiring M2 (/BL) is the other bit line of the bit line pair. These two bit lines (BL, /BL) extend in the Y direction between the two grounding voltage lines (LVSS).

The first layer wiring (pad region) M1D coupled to the common source/drain region (P1K) of TP1 and TP2 is coupled to a second layer wiring M2 (LVDD) through a second plug P2. This second layer wiring M2 (LVDD) is a supply voltage line.

The couplings of the second plugs P2, second layer wirings M2, third plugs P3, and third layer wiring M3 may be modified in various ways as far as the interconnection structure shown in the circuit diagram of FIG. 1 is satisfied. However, it should be noted that the layout can be simplified when the second layer wirings M2 generally extend in the Y direction and the third layer wiring M3 generally extends in the X direction as mentioned above. Although only one memory cell region (1 bit) is shown in FIGS. 34 to 36 for illustration convenience, memory cells are repeatedly disposed in the X direction and Y direction as described later, so in the memory cell array, the grounding voltage lines (LVSS), bit lines (BL, /BL) and supply voltage lines (LVDD) extend in the Y direction and the word lines (WL) extend in the X direction.

In this embodiment, since each grounding voltage line (LVSS) lies between a second layer wiring M2W (second layer wiring coupled to a word line) and a bit line (BL, /BL), interaction (crosstalk noise) between the second layer wiring M2W (second layer wiring coupled to the word line) and the bit line (BL, /BL) is reduced due to the shielding effect of the grounding voltage line (LVSS) BL, /BL).

The patterns described above referring to FIGS. 34 to 36 are symmetrical with respect to the center point of the memory cell region.

Figure 37:
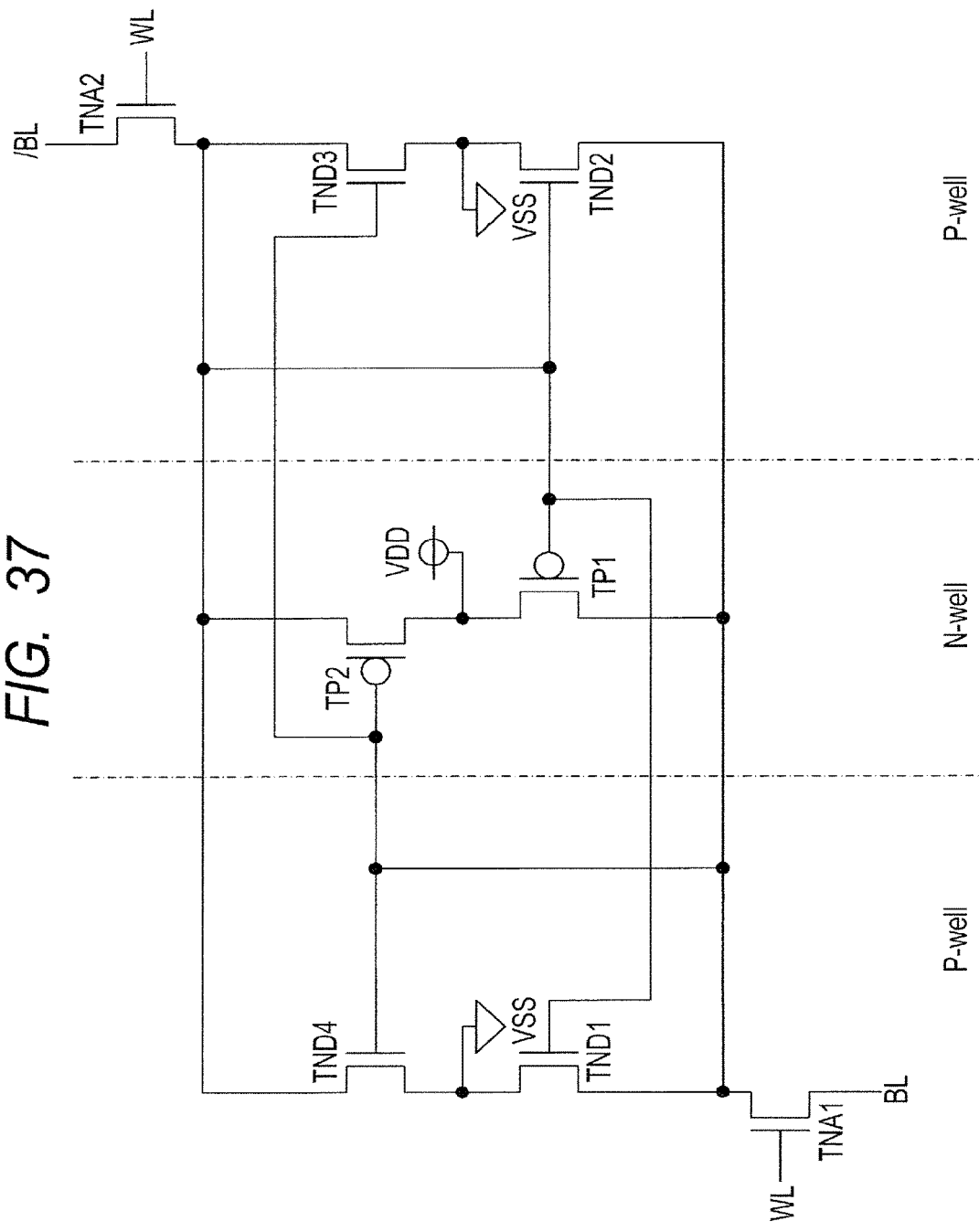
FIG. 37 is a circuit diagram showing that transistors are arranged in line with an SRAM memory cell layout according to the sixth embodiment.

For reference, FIG. 37 is a circuit diagram showing how the eight transistors (TND2, TNA1, TND1, TP1, TP2, TND3, TNA2, and TND4) are arranged and interconnected in accordance with the above "Memory Cell Pattern Layout."

[Memory Cell Array]

In the SRAM memory cell array according to this embodiment, memory cells are arranged in an array pattern as in the first embodiment. As explained earlier in connection with the first embodiment referring to FIG. 12, memory cell regions ("F") are repeatedly disposed axially symmetrically with respect to each line extending in the X direction and repeatedly disposed axially symmetrically with respect to each line extending in the Y direction.

[Tap Cell Region]

The SRAM memory cell array according to this embodiment includes tap cell regions as in the first embodiment. Prescribed voltages (for example, grounding voltage VSS and supply voltage VDD) are supplied to the wells through the tap cell regions.

Seventh Embodiment

While in the sixth embodiment a p-type well (P-well), an n-type well (N-well), and a p-type well (P-well) are arranged side by side in the X direction in the order of mention (FIG.

Figure 38:
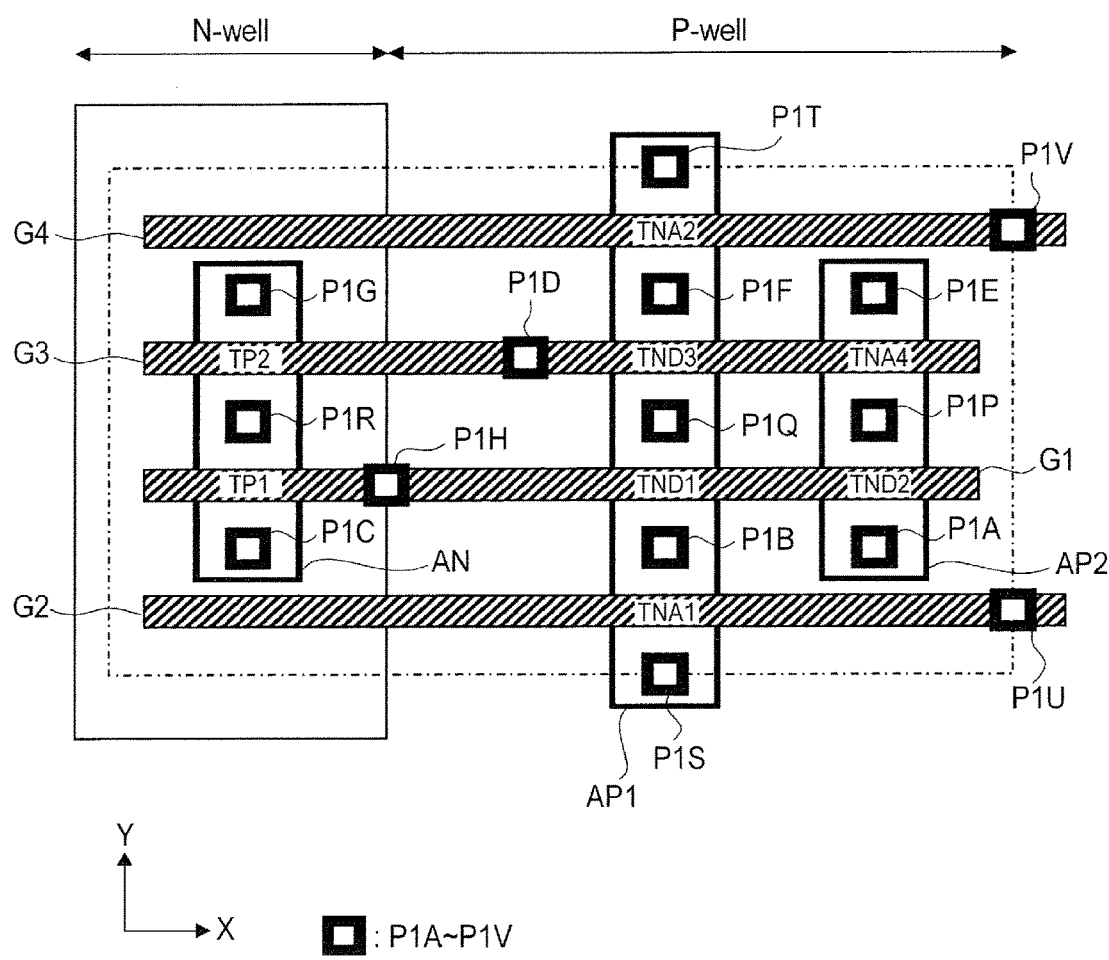
FIG. 38 is a plan view of the SRAM memory cell structure according to a seventh embodiment of the invention.

34), it is also possible that both the p-type wells (P-well) are located on one side of the n-type well (N-well) instead of being located on both sides (FIG. 38).

As in the sixth embodiment, in a seventh embodiment the length of the virtually rectangular memory cell region's side extending in the Y direction is equivalent to the sum of lengths of four transistors. In other words, four rows (lines) of gate electrodes G are disposed in this embodiment.

The SRAM memory cell structure and circuit operation in this embodiment are the same as those in the first embodiment which have been described referring to FIG. 1.

[Configuration of the SRAM]
[Memory Cell Structure]

Figure 39:
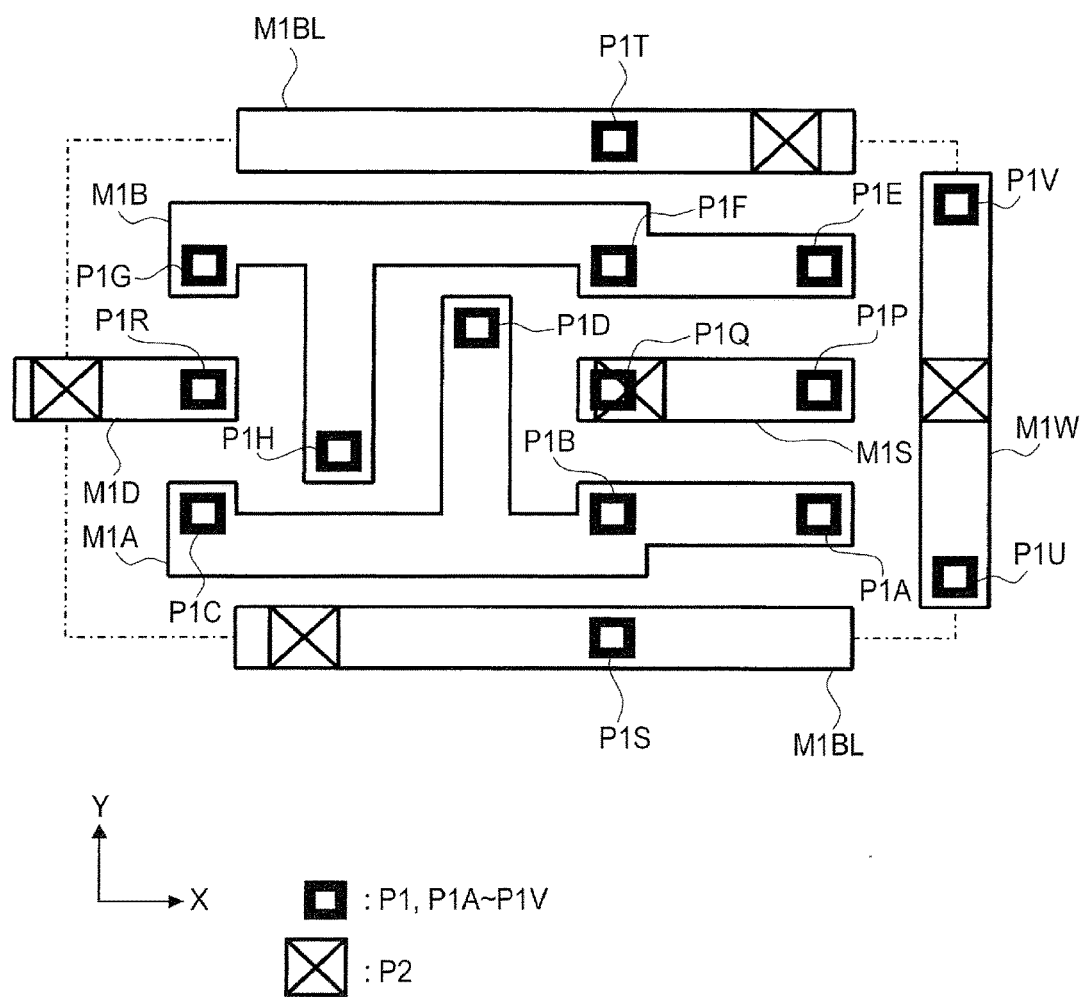
FIG. 39 is a plan view of the SRAM memory cell structure according to the seventh embodiment.
Figure 40:
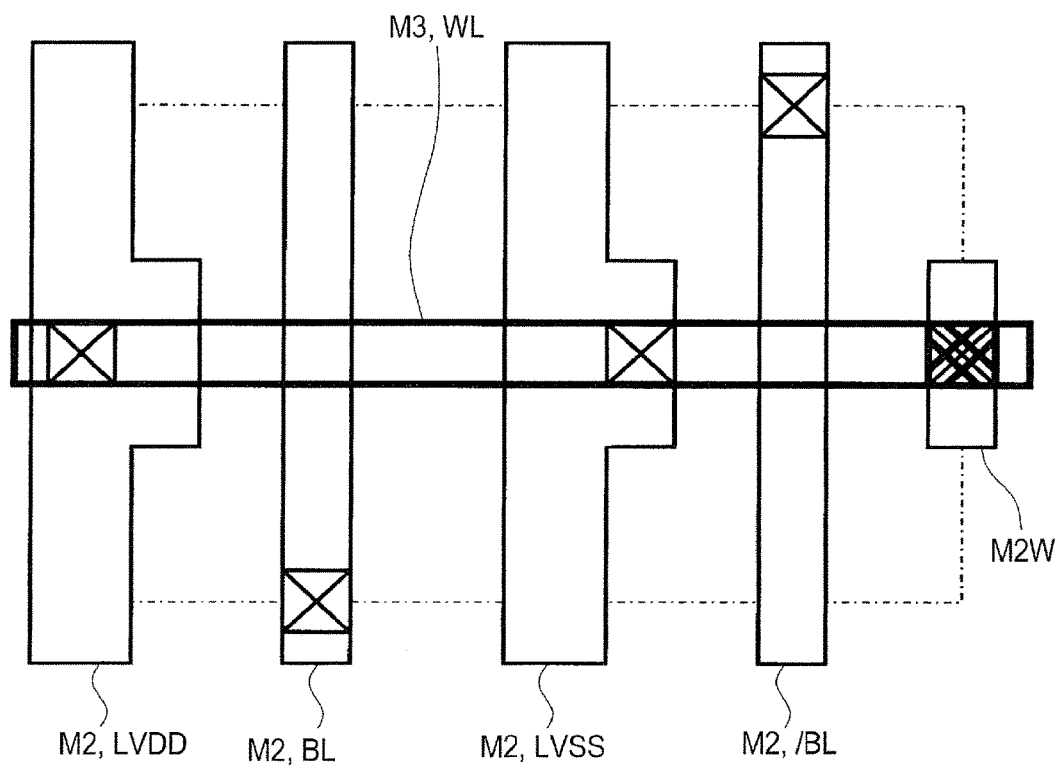
FIG. 40 is a plan view of the SRAM memory cell structure according to the seventh embodiment.

FIGS. 38 to 40 are plan views showing the SRAM memory cell structure according to the seventh embodiment. FIG. 38 shows the arrangement of active regions A, gate electrodes G, and first plugs P1. FIG. 39 shows the arrangement of the first plugs P1, first layer wirings M1, and second plugs P2. FIG. 40 shows the arrangement of the second plugs P2, second layer wirings M2, third plugs P3, and third layer wiring M3. When the plan views of FIGS. 38 and 39 are placed one upon the other with reference to the first plugs P1, the positional relation between the patterns shown in FIGS. 38 and 39 becomes clear. When the plan views of FIGS. 39 and 40 are placed one upon the other with reference to the second plugs P2, the positional relation between the patterns shown in FIGS. 39 and 40 becomes clear. The rectangular area surrounded by the chain line in the figures denotes one memory cell region (for 1 bit).

[Memory Cell Pattern Layout]
[A, G, P1]

As shown in FIG. 38, an n-type well (N-well) and a p-type well (P-well) are arranged side by side in the X direction over the semiconductor substrate. Although only one memory cell region (1 bit) is shown in FIG. 38, memory cells are repeatedly disposed in the X direction and Y direction (FIG. 12), so both the wells (N-well and P-well) are considered to continuously extend in the Y direction. The exposed regions of these wells are active regions (A).

Over the semiconductor substrate, three active regions (AN, AP1, AP2) are arranged side by side in the X direction. An element isolation region (STI) lies between active regions (A). In other words, the active regions (A) are marked out by the element isolation regions (STI). The wells (N-well and P-well) are continuous with each other under the element isolation regions STI.

Specifically, the active region AN is an exposed region of the n-type well (N-well) which is virtually rectangular with its long side in the Y direction.

The active region AP1 is an exposed region of the p-type well (P-well) located on the right of the n-type well as seen in FIG. 38 which is virtually rectangular with its long side in the Y direction. Although only one memory cell region (1 bit) is shown in FIG. 38 for illustration convenience, memory cells are repeatedly disposed in the X direction and Y direction, so in the memory cell array, the active region AP1 is considered to continuously extend in the Y direction in a linear form.

The active region AP2 is an exposed region of the p-type well (P-well) which is located next to the active region AP1 and virtually rectangular with its long side in the Y direction.

Gate electrodes G extend over the three active regions (AN, AP1, and AP2) through a gate insulating film (GO) in a way to cross the active regions in the X direction, as components of the eight transistors as described earlier in the "Circuit Configuration" section in the description of the first embodiment.

Specifically, two common gate electrodes (G1 and G3) are disposed over the active regions AN, AP1, and AP2 in a way to cross the active regions. Consequently TND2 and TND4 are disposed in series over the active region AP2, sharing a source/drain region, TND1 and TND3 are disposed in series over the active region AP1, sharing a source/drain region, and TP1 and TP2 are disposed in series over the active region AN, sharing a source/drain region. The gate electrodes (G) of TP1, TND1, and TND2 are joined into the common gate electrode G1 and the gate electrodes (G) of TP2, TND3, and TND4 are joined into the other common gate electrode G3. These two common gate electrodes G extend in parallel with each other in the X direction.

A gate electrode G2 is disposed over the active region AP1 in parallel with the two common gate electrodes G (G1 and G3). Consequently, TNA1 is disposed over the active region AP1 and a source/drain region of TNA1 and a source/drain region of TND1 are joined (into a common source/drain region). Also, another gate electrode G4 is disposed over the active region AP1 in parallel with the two common gate electrodes G. Consequently, TNA2 is disposed over the active region AP1 and a source/drain region of TNA2 and a source/drain region of TND3 are joined (into a common source/drain region).

As mentioned above, in this embodiment, each driver transistor is divided into two transistors (TND1 and TND2, and TND3 and TND4) and these transistors are located over different active regions (AP1 and AP2). In addition, since these active regions (AP1 and AP2) extend in the Y direction, the layout can be simplified and higher patterning accuracy can be achieved.

Therefore, as in the first embodiment, each active region (A) is not supposed to have a bent portion (stepped portion) and it is easy to make the gate width ratio between the access transistor and driver transistor 1:2.

Also, since the access transistors (TNA1 and TNA2) are also disposed over the active region AP1, the number of active regions is decreased. Although in this case the two access transistors (TNA1 and TNA2) are disposed over the active region AP1, instead one access transistor may be disposed over each of the active regions AP1 and AP2. In this way, other n-type transistors may be disposed in appropriate places over the active regions (AP1 and AP2 in this case) in each of which a driver transistor is located. Consequently the number of active regions can be decreased. This permits simpler layout and contributes to reduction in memory cell region size.

Furthermore, since the active regions (A) extend in the Y direction, the gate electrodes (G) can extend in the X direction so not only the patterning accuracy of the active regions (A) but also that of the gate electrodes (G) can be improved. Particularly, as detailed in connection with the first embodiment, it is easy to adopt the multiple exposure technique in order to enhance the patterning accuracy. In addition, it is easy to create a simulation model, thereby contributing to improvement in inspection accuracy.

[P1, M1, P2]

As shown in FIG. 39, first plugs P1 are disposed over the source/drain regions of the eight transistors (TND2, TNA1, TND1, TP1, TP2, TND3, TNA2, and TND4) described above referring to FIG. 38. Also, first plugs P1 are disposed over the four gate electrodes described referring to FIG. 38.

First layer wirings M1 are disposed over the first plugs P1 for electrical couplings between first plugs P1.

Specifically, a first plug P1A over one source/drain region of TND2, a first plug P1B over the common source/drain region of TND1 and TNA1, a first plug P1C over one source/drain region of TP1, and a first plug P1D over the common gate electrode (G3) of TP2, TND3, and TND4 are coupled by a first layer wiring M1A. This first layer wiring (first node wiring) M1A corresponds to the storage node A shown in FIG. 1. In the above explanation, "one" means the lower source/drain region of each relevant transistor (TND2, TP1) as seen in FIG. 38.

A first plug P1E over one source/drain region of TND4, a first plug P1F over the common source/drain region of TND3 and TNA2, a first plug P1G over one source/drain region of TP2, and a first plug P1H over the common gate electrode (G1) of TP1, TND1, and TND2 are coupled by a first layer wiring (second node wiring) M1B. This first layer wiring M1B corresponds to the storage node B shown in FIG. 1. In the above explanation, "one" means the upper source/drain region of each relevant transistor (TND4, TP2) as seen in FIG. 38.

Also a first plug P1P over the common source/drain region of TND2 and TND4 and a first plug P1Q over the common source/drain region of TND1 and TND3 are coupled by a first layer wiring M1S. This first layer wiring M1S corresponds to the grounding voltage (VSS) in FIG. 1 and is coupled to a grounding voltage line (LVSS) as described later.

Also a first layer wiring M1D is disposed over a first plug P1R over the common source/drain region of TP1 and TP2. This first layer wiring M1D corresponds to the supply voltage (VDD) in FIG. 1 and is coupled to a supply voltage line (LVDD) as described later.

First layer wirings M1BL are disposed over a first plug P1S over the other source/drain region of TNA1, and a first plug P1T over the other source/drain region of TNA2 respectively. A first plug P1U over the gate electrode (G2) of TNA1 and a first plug P1V over the gate electrode (G4) of TNA2 are coupled by a first layer wiring M1W.

The couplings between first plugs P1 by the first layer wirings M1 may be modified in various ways as far as the interconnection structure shown in the circuit diagram of FIG. 1 is satisfied.

[P2, M2, P3, M3]

As shown in FIG. 40, second plugs P2 are disposed over the first layer wirings M1, among the first layer wirings M1 described above referring to FIG. 39, other than the first layer wirings M1 (M1A and M1B) corresponding to the storage nodes (A and B), and second layer wirings M2 are disposed over them.

Specifically, the first layer wiring M1W coupled to the gate electrode (G2) of TNA1 and the gate electrode (G4) of TNA2 is coupled to a second layer wiring M2W through a second plug P2. This second layer wiring M2W extends in the Y direction at an end of the memory cell region in the X direction. Furthermore, a third plug P3 is disposed over the second layer wiring M2W and a third layer wiring M3 (WL) extending in the X direction is disposed over the third plug P3. This third layer wiring M3 (WL) is a word line.

The first layer wiring M1BL coupled to the other source/drain region (P1S) of TNA1 is coupled to a second layer wiring M2 (BL) through a second plug P2. This second layer wiring M2 (BL) is one bit line of the bit line pair.

The first layer wiring M1BL coupled to the other source/drain region (P1T) of TNA2 is coupled to a second layer wiring M2 (/BL) through a second plug P2. This second layer wiring M2 (/BL) is the other bit line of the bit line pair. These two bit lines (BL, /BL) extend in the Y direction.

The first layer wiring M1S coupled to the common source/drain region (P1P) of TND2 and TND4 and the common source/drain region (P1Q) of TND1 and TND3 is coupled to a second layer wiring M2 (LVSS) through a second plug P2. This second layer wiring M2 (LVSS) is a grounding voltage line. This grounding voltage line extends in the Y direction between the two bit lines (BL and /BL).

The first layer wiring M1D coupled to the common source/drain region (P1R) of TP1 and TP2 is coupled to a second layer wiring M2 (LVDD) through a second plug. This second layer wiring M2 (LVDD) is a supply voltage line.

The couplings of the second plugs P2, second layer wirings M2, third plugs P3, and third layer wiring M3 may be modified in various ways as far as the interconnection structure shown in the circuit diagram of FIG. 1 is satisfied. However, it should be noted that the layout can be simplified when the second layer wirings M2 generally extend in the Y direction and the third layer wiring M3 generally extends in the X direction as mentioned above. Although only one memory cell region (1 bit) is shown in FIGS. 38 to 40 for illustration convenience, memory cells are repeatedly disposed in the X direction and Y direction as described later, so in the memory cell array, the grounding voltage lines (LVSS), bit lines (BL, /BL) and supply voltage lines (LVDD) extend in the Y direction and the word lines (WL) extend in the X direction.

In this embodiment, since the grounding voltage line (LVSS) lies between the bit lines (BL, /BL), interaction (crosstalk noise) between the bit lines (BL, /BL) is reduced due to the shielding effect of the grounding voltage line (LVSS).

Furthermore, in this embodiment, since the p-type well (P-well) is located on one side of the n-type well (N-well) in the memory cell region, the number of boundaries between the n-type well (N-well) and p-type well (P-well) is smaller than in the sixth embodiment (FIG. 34) and the well proximity effect as mentioned above is reduced.

Figure 41:
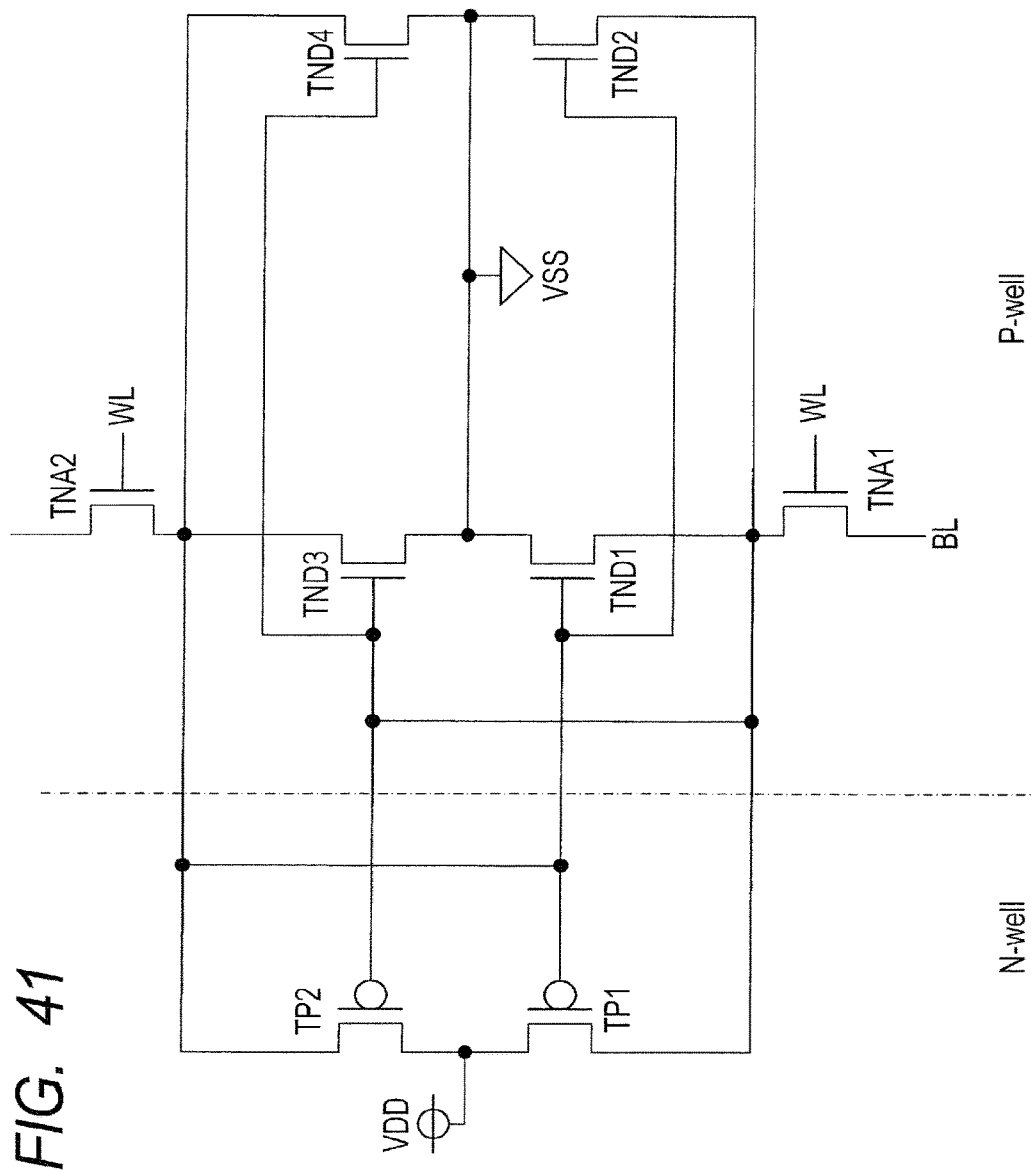
FIG. 41 is a circuit diagram showing that transistors are arranged in line with an SRAM memory cell layout according to the seventh embodiment.

For reference, FIG. 41 is a circuit diagram showing how the eight transistors (TND2, TNA1, TND1, TP1, TP2, TND3, TNA2, and TND4) are arranged and interconnected in accordance with the above "Memory Cell Pattern Layout."

[Memory Cell Array]

In the SRAM memory cell array according to this embodiment, memory cells are arranged in an array pattern as in the first embodiment. As explained earlier in connection with the first embodiment referring to FIG. 12, memory cell regions ("F") are repeatedly disposed axially symmetrically with respect to each line extending in the X direction and repeatedly disposed axially symmetrically with respect to each line extending in the Y direction.

[Tap Cell Region]

The SRAM memory cell array according to this embodiment includes tap cell regions as in the first embodiment. Prescribed voltages (for example, grounding voltage VSS and supply voltage VDD) are supplied to the wells through the tap cell regions.

The SRAM memory cell array in this embodiment includes tap cells (F') as in the first embodiment (FIG. 15). Tap cells (F') are provided on the basis of one tap cell per n memory cell regions arranged in the Y direction and repeatedly disposed in the X direction axially symmetrically with respect to each line extending in the Y direction. In FIG. 15, the tap cells arranged in X direction are each expressed by "F'."

Figure 42:
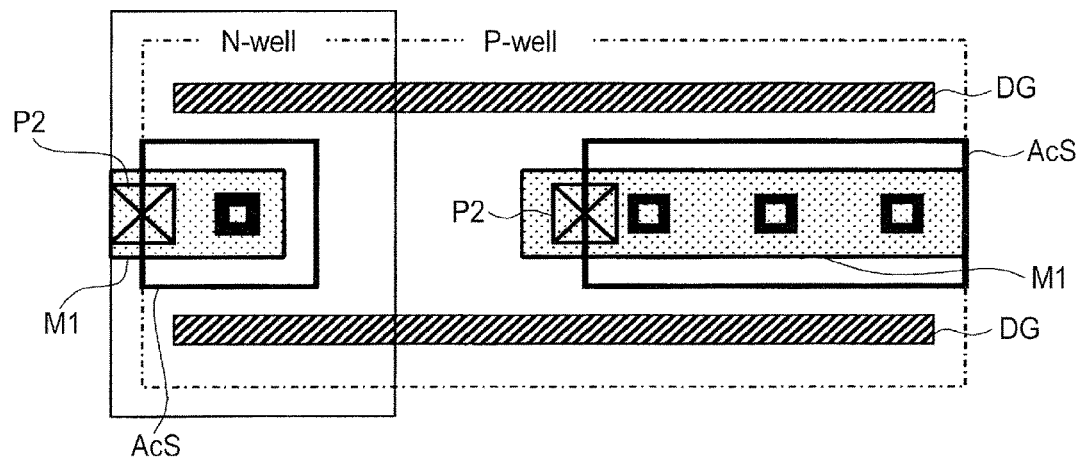
FIG. 42 is a plan view of the tap cell (F') structure of the SRAM according to the seventh embodiment.
Figure 43:
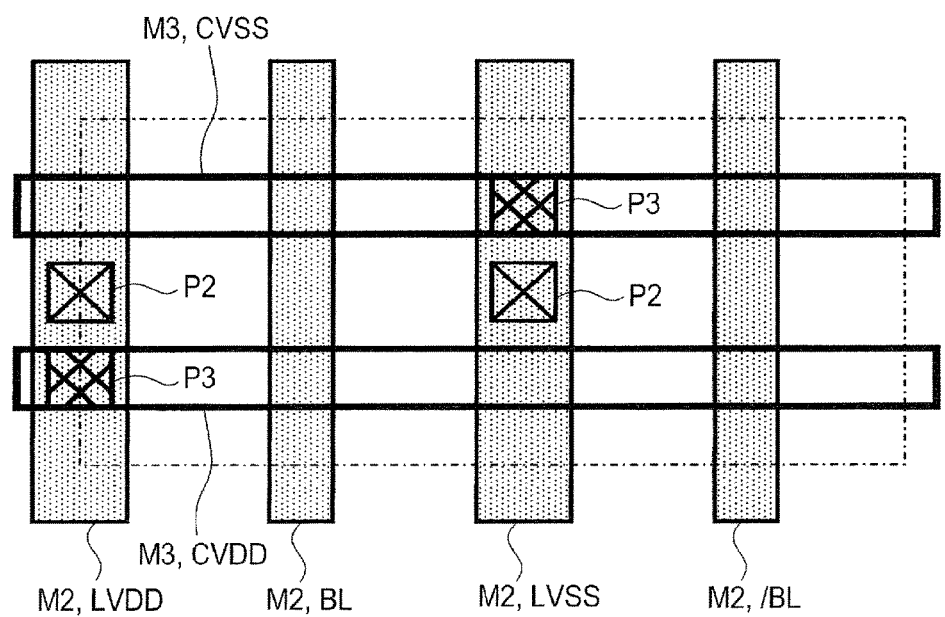
FIG. 43 is a plan view of the tap cell (F') structure of the SRAM according to the seventh embodiment.

FIGS. 42 and 43 are plan views showing the structure of the SRAM tap cell (F') according to this embodiment. FIG. 42 shows the arrangement of active regions AcS, dummy gate electrodes DG, first plugs P1, first layer wirings M1, and second plugs P2. FIG. 43 shows the arrangement of the second plugs P2, second layer wirings M2, third plugs P3, and third layer wirings M3. When the plan views of FIGS. 42 and 43 are placed one upon the other with reference to the second plugs P2, the positional relation between the patterns shown in FIGS. 42 and 43 becomes clear. The rectangular area surrounded by the chain line in the figures denotes one tap cell region which may be equal in size to a memory cell region.

As in the memory cell region in which the wells (N-well, P-well) extend in the Y direction, in the tap cell shown in FIG. 42 the wells also extend in the Y direction, in which the n-type well (N-well) and p-type well (P-well) are arranged side by side in the X direction.

In the tap cell region, two active regions AcS for power supply are arranged side by side in the X direction. The area between these active regions AcS is an element isolation region (STI).

Specifically, each active region AcS is an exposed region of a well (P-well, N-well) and in this case, it is virtually rectangular with its long side in the X direction. The two active regions AcS are arranged in a line extending in the X direction.

Over the p-type well (P-well) on the right in FIG. 42, first plugs P1 are disposed over the active region AcS and a first layer wiring M1 is disposed over the first plugs P1. A second plug P2 is disposed over the first layer wiring M1. A second layer wiring M2 (LVSS) is disposed over the second plug P2. This second layer wiring M2 (LVSS) is the grounding voltage line described above in the "Memory Cell Pattern Layout" section. Furthermore, in the tap cell region, a third plug P3 is disposed over the second layer wiring M2 (LVSS) and a third layer wiring M3 (CVSS) is disposed over it. This third layer wiring M3 (CVSS) is a common grounding voltage line which is coupled to the grounding voltage lines of the tap cells arranged in the X direction (FIG. 43).

Over the n-type well (N-well) on the left in FIG. 42, a first plug P1 is disposed over the active region AcS and a first layer wiring M1 is disposed over the first plug P1. A second plug P2 is disposed over the first layer wiring M1. A second layer wiring M2 (LVDD) is disposed over the second plug P2. This second layer wiring M2 (LVDD) is the supply voltage line described above in the "Memory Cell Pattern Layout" section. Furthermore, in the tap cell region, a third plug P3 is disposed over the second layer wiring M2 (LVDD) and a third layer wiring M3 (CVDD) is disposed over it. This third layer wiring M3 (CVDD) is a common supply voltage line which is coupled to the grounding voltage lines of the tap cells arranged in the X direction (FIG. 43).

The bit lines (second layer wiring M2 (BL) and second layer wiring M2 (/BL)) described above in the "Memory Cell Pattern Layout" section extend over the tap cell region (FIG. 43).

As shown in FIG. 42, in the tap cell region, dummy gate electrodes DG extend in the X direction over an element isolation region STI. Due to the existence of these dummy gate electrodes DG, the gate electrode convex-concave profile is regularly repeated, leading to increased layout regularity. This reduces product quality instability and improves the device characteristics.

Eighth Embodiment

According to the seventh embodiment, three active regions AN, AP1, and AP2, are arranged side by side in the X direction in the order of mention in the memory cell (FIG. 38). However, it is acceptable to exchange the positions of AP1 and AP2 (FIG. 44).

[Memory Cell Structure]
[Memory Cell Pattern Layout]

Figure 44:
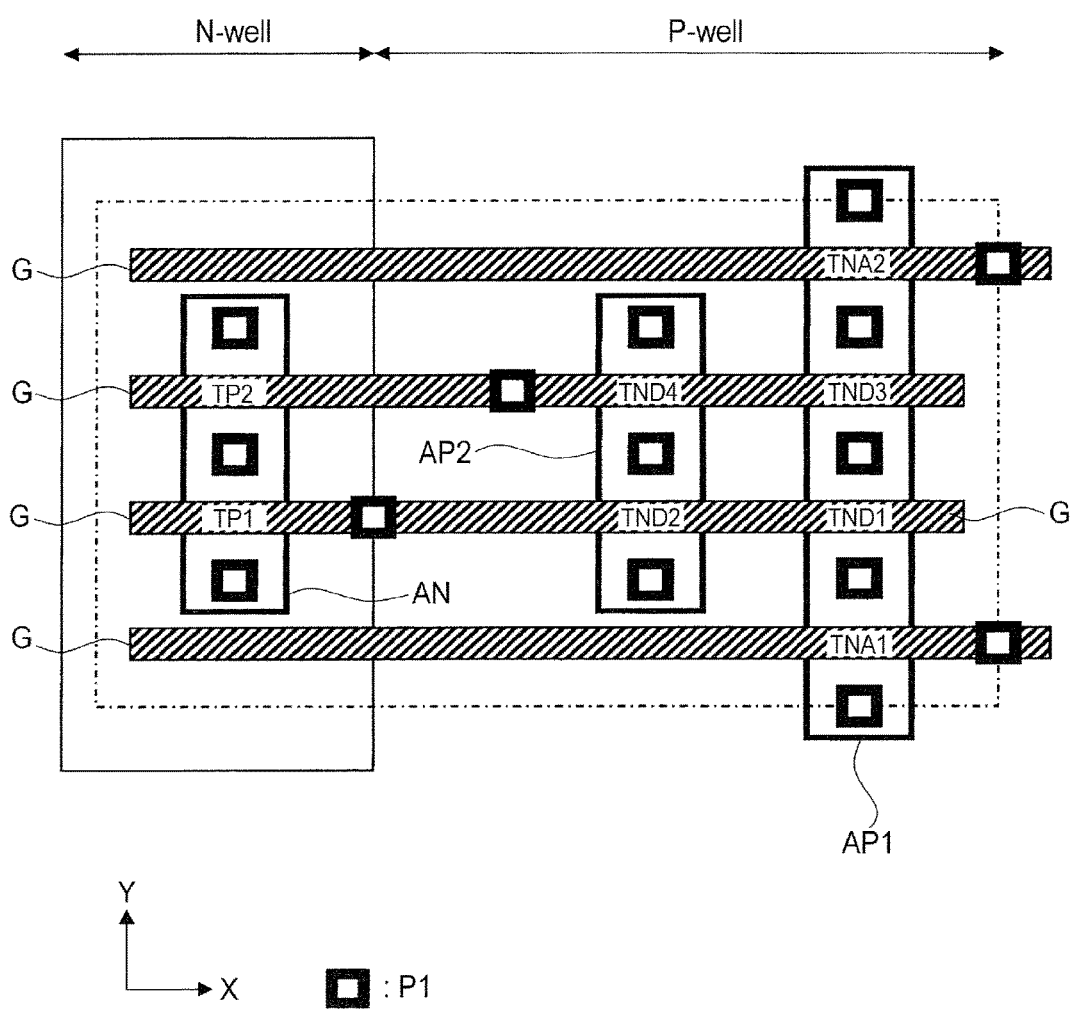
FIG. 44 is a plan view of the SRAM memory cell structure according to an eighth embodiment of the invention.
Figure 45:
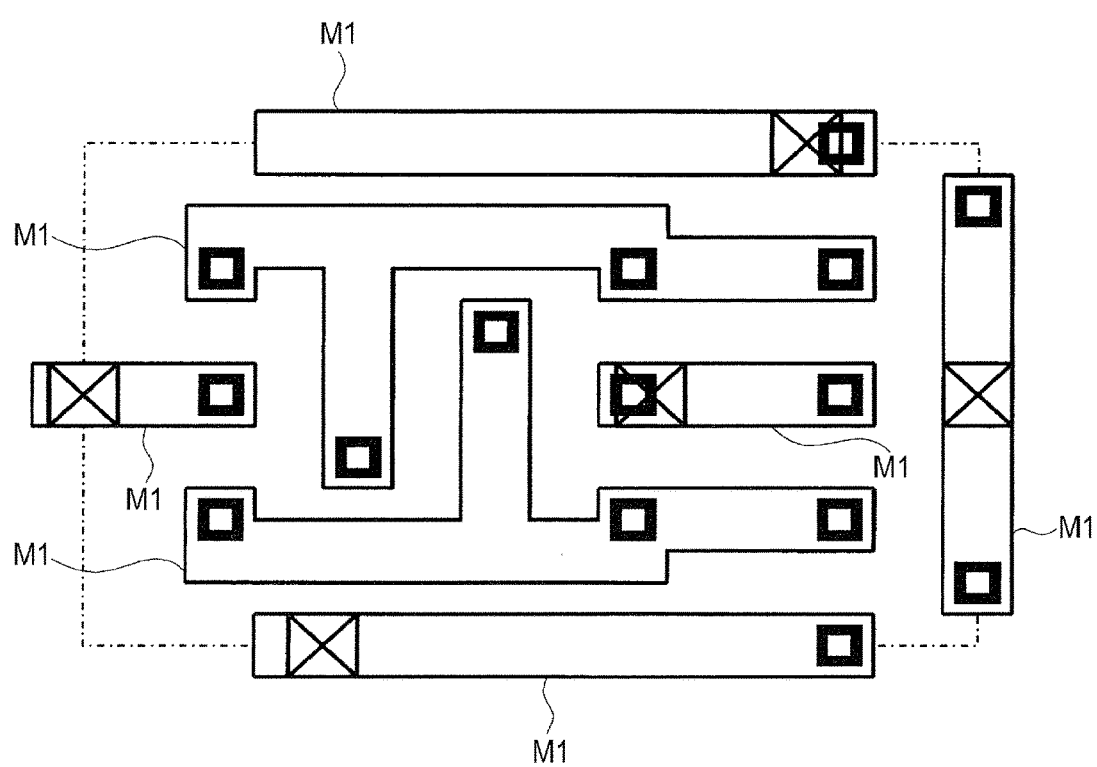
FIG. 45 is a plan view of the SRAM memory cell structure according to the eighth embodiment.
Figure 46:
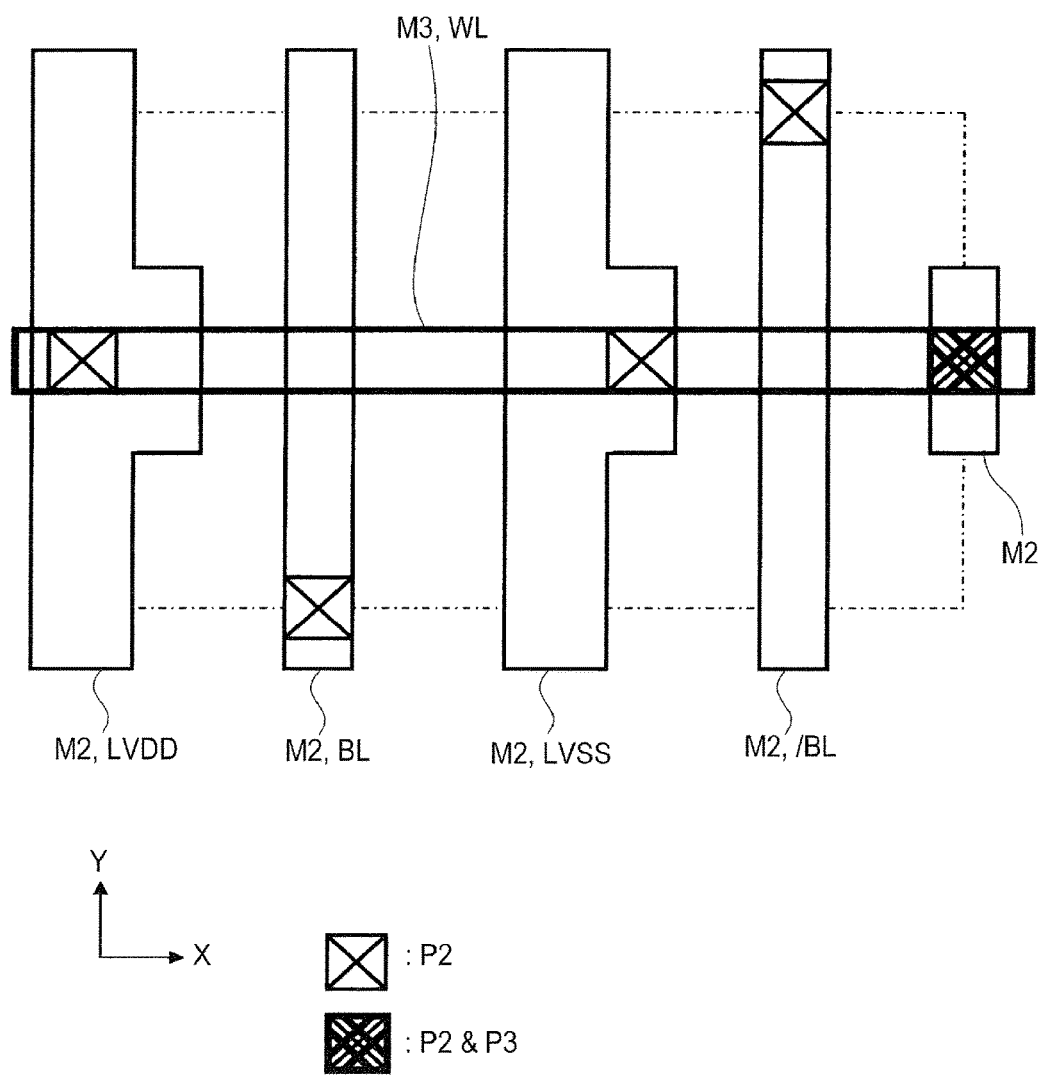
FIG. 46 is a plan view of the SRAM memory cell structure according to the eighth embodiment.

FIGS. 44 to 46 are plan views showing the SRAM memory cell structure according to an eighth embodiment. FIG. 44 shows the arrangement of active regions A, gate electrodes G, and first plugs P1. FIG. 45 shows the arrangement of the first plugs P1, first layer wirings M1, and second plugs P2. FIG. 46 shows the arrangement of the second plugs P2, second layer wirings M2, third plugs 23, and third layer wiring M3. When the plan views of FIGS. 44 and 45 are placed one upon the other with reference to the first plugs P1, the positional relation between the patterns shown in FIGS. 44 and 45 becomes clear. When the plan views of FIGS. 45 and 46 are placed one upon the other with reference to the second plugs P2, the positional relation between the patterns shown in FIGS. 45 and 46 becomes clear. The rectangular area surrounded by the chain line in the figures denotes one memory cell region (for 1 bit).

As shown in FIG. 44, an n-type well (N-well) and a p-type well (P-well) are arranged side by side in the X direction over the semiconductor substrate. Although only one memory cell region (1 bit) is shown in FIG. 44, memory cells are repeatedly disposed in the X direction and Y direction (FIG. 12) as mentioned above, so these wells (N-well and P-well) are considered to continuously extend in the Y direction. The exposed regions of these wells are active regions (A).

Over the semiconductor substrate, three active regions are arranged side by side in the X direction. Unlike the seventh embodiment, in this embodiment the active regions are arranged in the following order: AN, AP2, and AP1.

The other constituent elements (G, P1 and so on) are the same as in the seventh embodiment, so detailed description thereof is omitted. Also the arrangements of the first plugs P1, first layer wirings M1, second plugs P2, second layer wirings M2, third plugs P3, and third layer wiring M3 as shown in FIGS. 45 and 46 are the same as those in the seventh embodiment as described above referring to FIGS. 39 and 40, so detailed description thereof is omitted.

In this embodiment, the active region AP1, extending linearly in the Y direction, is remoter from the boundary between the n-type well (N-well) and p-type well (P-well) in the memory cell region. Namely, the active region in which the larger number of transistors are located are remoter from the boundary between the n-type well (N-well) and p-type well (P-well). Consequently, the distance between the active region AP1 and the boundary between the n-type well (N-well) and p-type well (P-well) is increased, so the well proximity effect as mentioned above is reduced. As a result, the transistor characteristics are improved.

Figure 47:
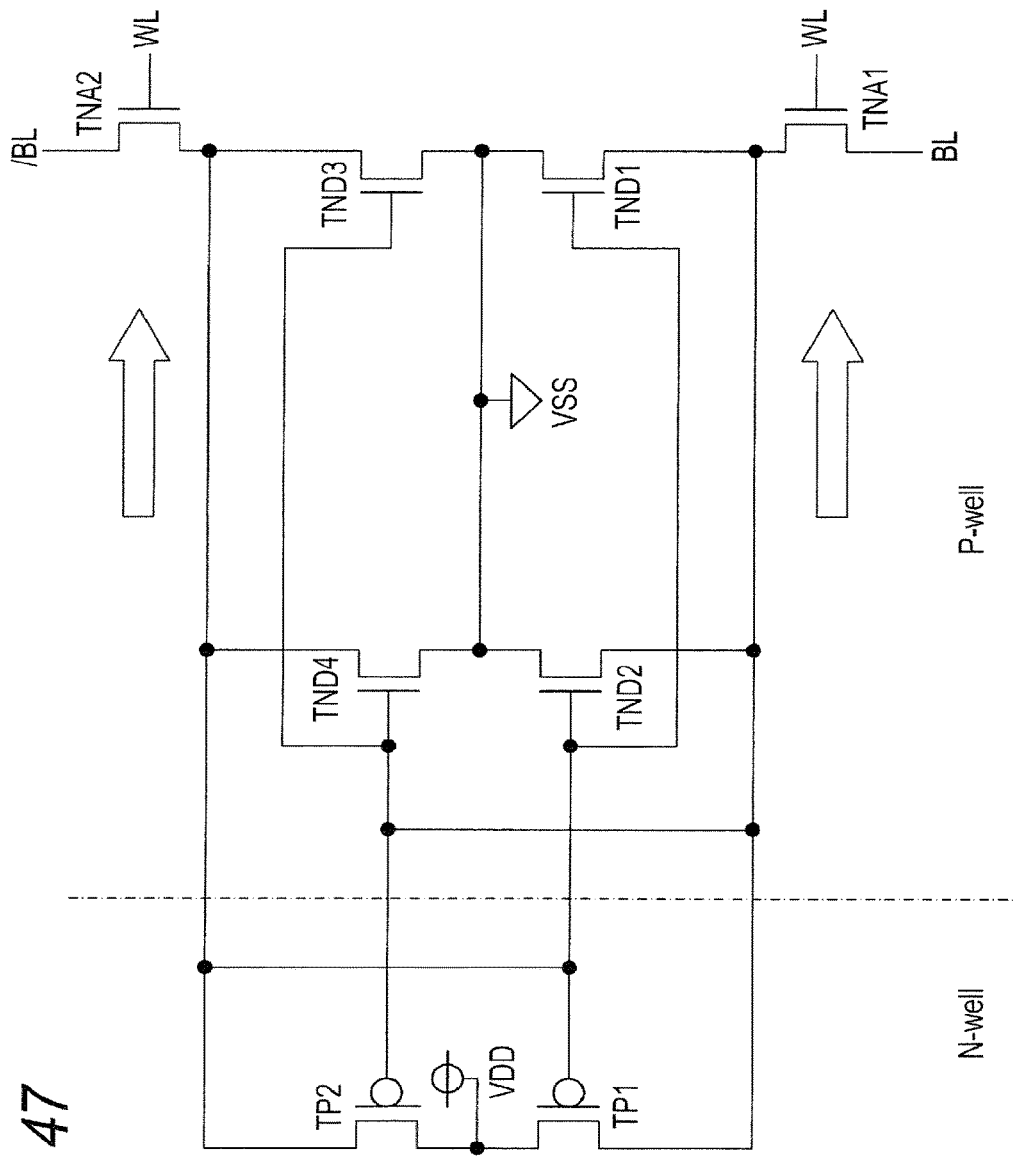
FIG. 47 is a circuit diagram showing that transistors are arranged in line with an SRAM memory cell layout according to the eighth embodiment.

For reference, FIG. 47 is a circuit diagram showing how the eight transistors (TND2, TNA1, TND1, TP1, TP2, TND3, TNA2, and TND4) are arranged and interconnected in accordance with the above "Memory Cell Pattern Layout."

As apparent from FIG. 47, the transistors TNA1 and TNA2 are remoter from the boundary between the n-type well (N-well) and p-type well (P-well) (see the arrows in FIG. 47).

This reduces the well proximity effect and improves the transistor characteristics (for example, the characteristics of TNA1 and TNA2).

This eighth embodiment brings about the above advantageous effects in addition to the same advantageous effects as those brought about by the first embodiment.

Ninth Embodiment

Figure 48:
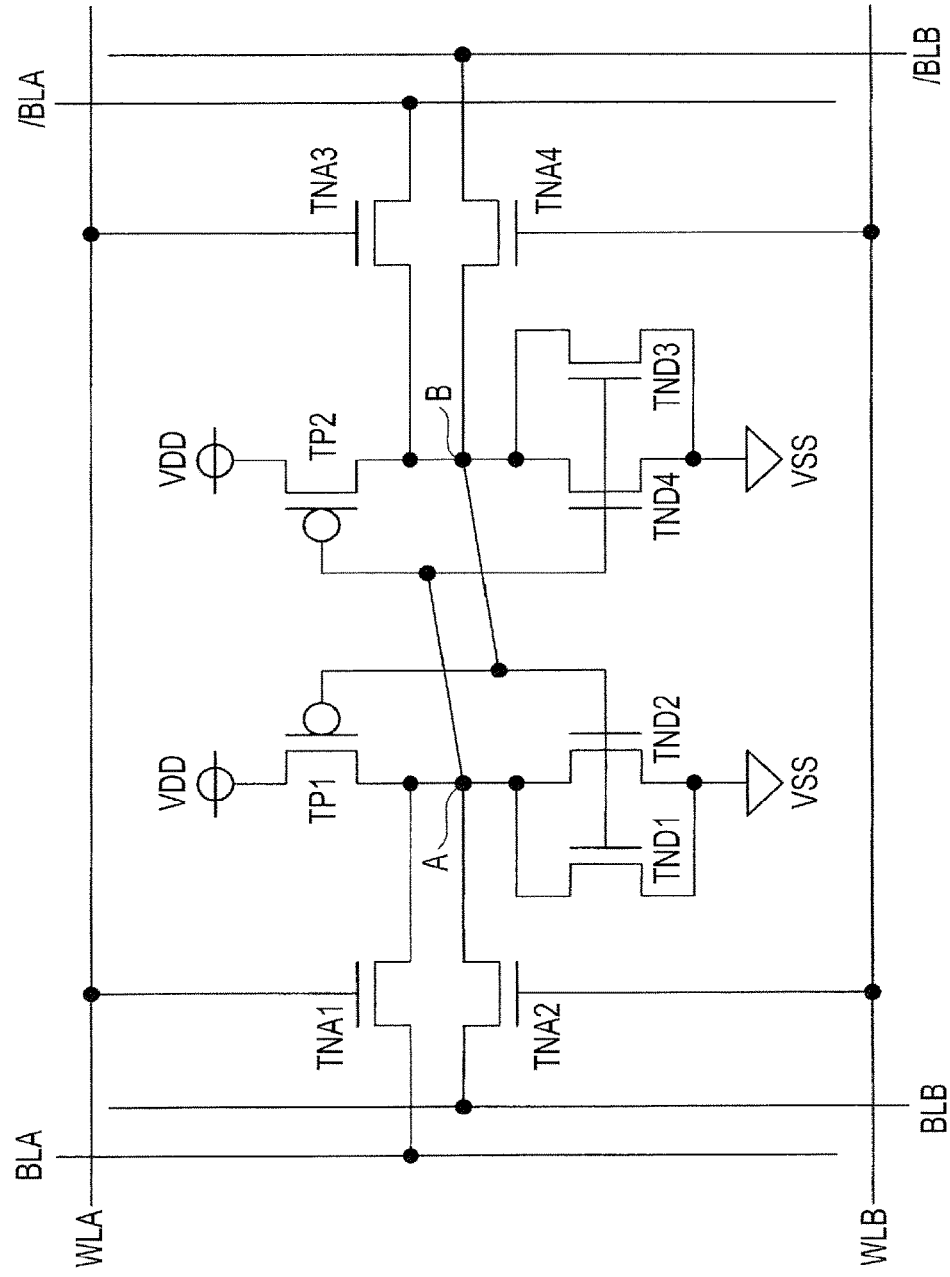
FIG. 48 is an equivalent circuit diagram showing an SRAM memory cell according to a ninth embodiment of the invention.

While the first embodiment concerns a single-port SRAM (FIG. 1), the ninth embodiment concerns a dual-port SRAM (FIG. 48).

[Circuit Configuration]

FIG. 48 is an equivalent circuit diagram showing the SRAM memory cell according to a ninth embodiment. Unlike the equivalent circuit (FIG. 1) according to the first embodiment, this equivalent circuit includes two pairs of bit lines (BLA and /BLA, BLB and /BLB) and two word lines (WLA, WLB).

As shown in FIG. 48, the memory cell is located at the intersection of the two pairs of bit lines and the two word lines. The memory cell includes a pair of load transistors (load MOSs, load transistors, or load MISFETs) TP1 and TP2, two pairs of access transistors (access MOSs, access transistors, access MISFETs, or transfer transistors) TNA1 and TNA3, TNA2 and TNA4, and a pair of driver transistors (driver MOSs or driver MISFETs) TND2 and TND4.

This embodiment has a driver transistor TND1 coupled in parallel with the driver transistor (driver MISFET) TND2. It also has a driver transistor TND3 coupled in parallel with the driver transistor (driver MISFET) TND4.

Among the transistors of the memory cell, the load transistors are p type (p-channel) transistors and the access transistors and driver transistors are n-type (n-channel) transistors.

Among the ten transistors of the memory cell, TND2 and TP1 make up a CMOS inverter and TND4 and TP2 make up another CMOS inverter. The input/output terminals (storage nodes A and B) of this pair of CMOS inverters are cross-coupled, making up a flip-flop circuit as a data memory which stores data for one bit.

In the SRAM memory cell according to this embodiment, since TND1 and TND3 are disposed in parallel with TND2 and TND4 respectively, it can be considered that TND1, TND2, and TP1 make up a CMOS inverter and TND3, TND4, and TP2 make up another CMOS inverter.

The interconnection arrangement of the ten transistors of the SRAM memory cell according to this embodiment is explained in detail below.

TP1 is coupled between the supply voltage (primary voltage) and the storage node A and TND1 and TND2 are coupled in parallel with each other between the storage node A and grounding voltage (reference voltage, secondary voltage lower than the primary voltage), and the gate electrodes of TP1, TND1, and TND2 are coupled to the storage node B.

TP2 is coupled between the supply voltage (primary voltage) and the storage node B and TND3 and TND4 are coupled in parallel with each other between the storage node B and grounding voltage (reference voltage, secondary voltage lower than the primary voltage), and the gate electrodes of TP2, TND3, and TND4 are coupled to the storage node A.

TNA1 is coupled between the bit line BLA and storage node A and TNA3 is coupled between the bit line /BLA and storage node B and the gate electrodes of TNA1 and TNA3 are coupled to a word line WLA.

TNA2 is coupled between the bit line BLB and storage node A and TNA4 is coupled between the bit line /BLB and storage node B and the gate electrodes of TNA2 and TNA4 are coupled to a word line WLB.

As mentioned above, in the SRAM memory cell according to this embodiment, each driver transistor is considered as being divided into two transistors (TND1 and TND2, or TND3 and TND4).

As mentioned above, the dual-port SRAM has two ports for data input and output signals, so while one port is used to read data, the other port can be used to write data, permitting high speed data processing.

[Configuration of the SRAM]

[Memory Cell Structure]

Figure 49:
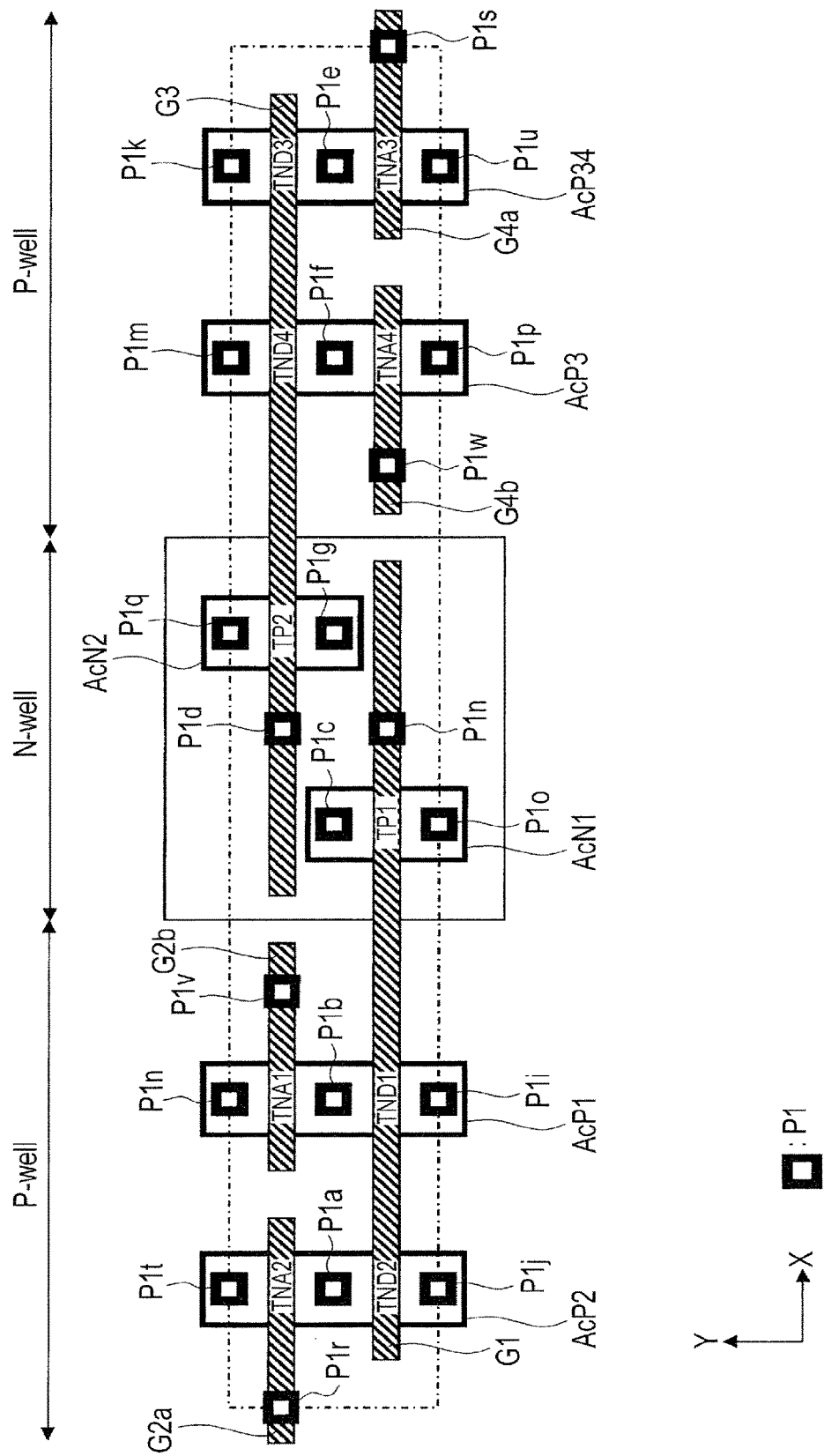
FIG. 49 is a plan view of the SRAM memory cell structure according to the ninth embodiment.
Figure 50:
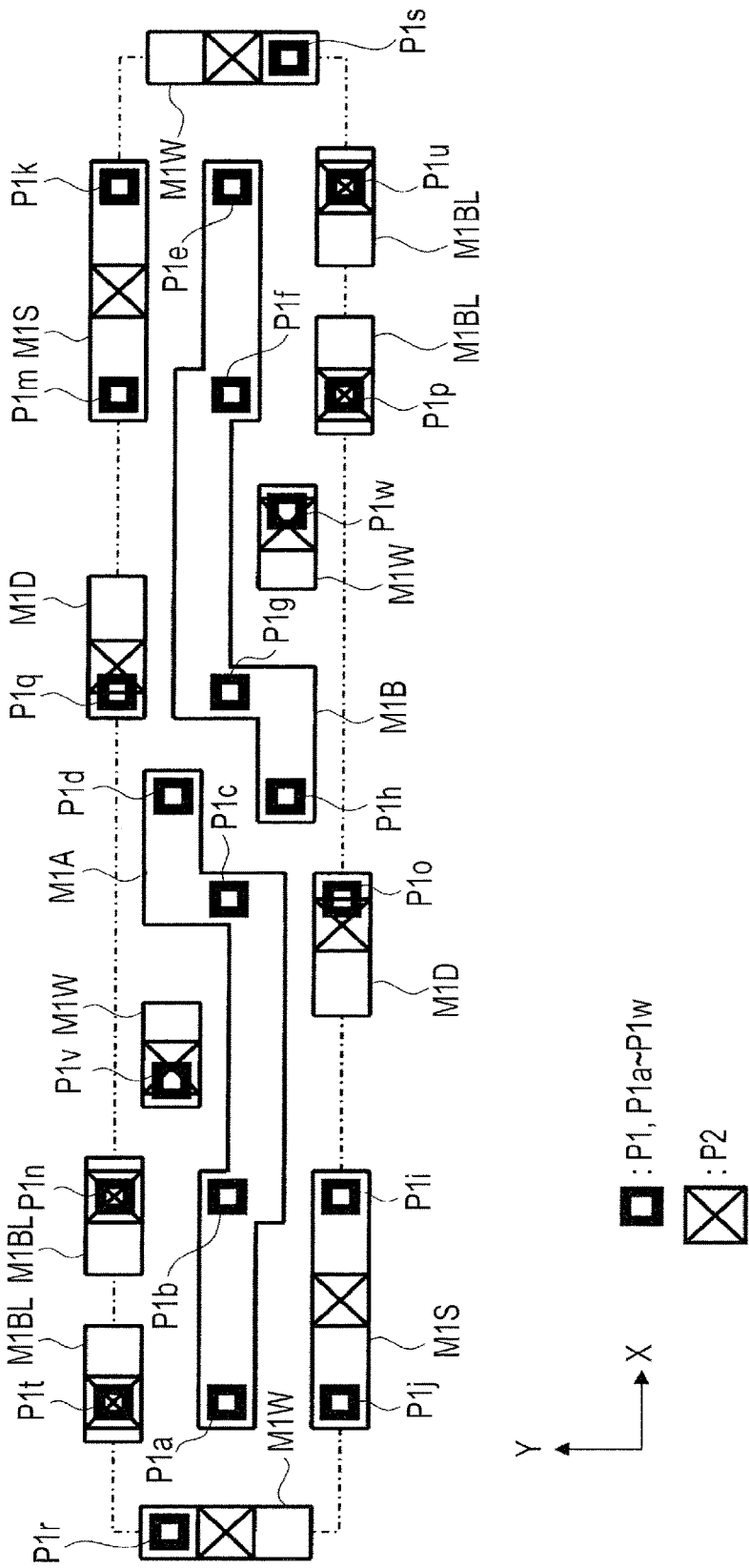
FIG. 50 is a plan view of the SRAM memory cell structure according to the ninth embodiment.
Figure 51:
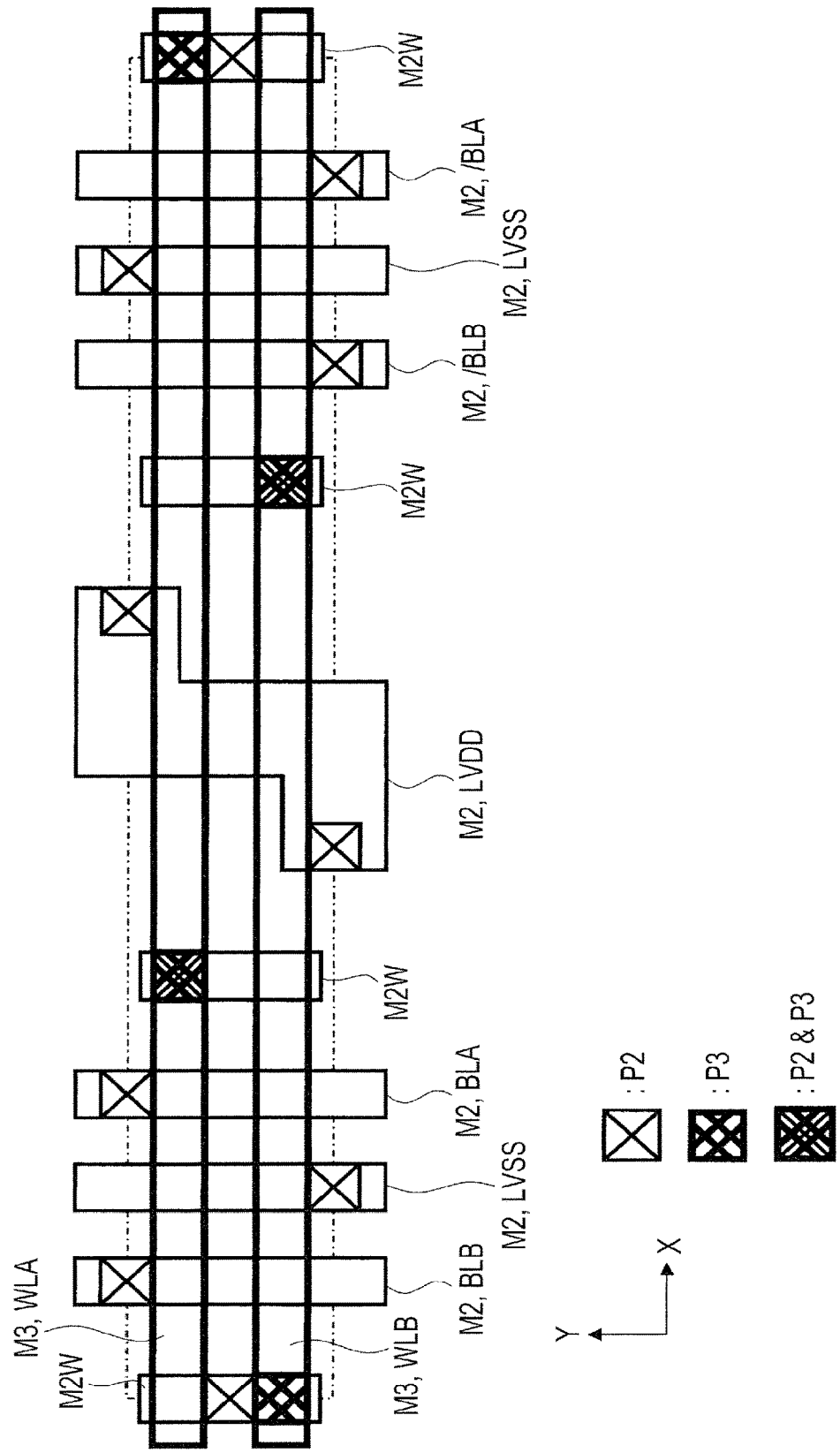
FIG. 51 is a plan view of the SRAM memory cell structure according to the ninth embodiment.

FIGS. 49 to 51 are plan views showing the SRAM memory cell structure according to the ninth embodiment. FIG. 49 shows the arrangement of active regions Ac, gate electrodes G, and first plugs P1. FIG. 50 shows the arrangement of the first plugs P1, first layer wirings M1, and second plugs P2. FIG. 51 shows the arrangement of the second plugs P2, second layer wirings M2, third plugs P3, and third layer wirings M3. When the plan views of FIGS. 49 and 50 are placed one upon the other with reference to the first plugs P1, the positional relation between the patterns shown in FIGS. 49 and 50 becomes clear. When the plan views of FIGS. 50 and 51 are placed one upon the other with reference to the second plugs P2, the positional relation between the patterns shown in FIGS. 50 and 51 becomes clear. The rectangular area surrounded by the chain line in the figures denotes one memory cell region (for 1 bit).

[Memory Cell Pattern Layout]

[Ac, G, P1]

As shown in FIG. 49, a p-type well (P-well), an n-type well (N-well), and a p-type well (P-well) are arranged side by side in the X direction over the semiconductor substrate. Although only one memory cell region (1 bit) is shown in FIG. 49, memory cells are repeatedly disposed in the X direction and Y direction (FIG. 12) as described later, so these wells (P-well, N-well and P-well) are considered to continuously extend in the Y direction. The exposed regions of these wells are active regions (Ac).

Over the semiconductor substrate, six active regions (AcP2, AcP1, AcN1, AcN2, AcP3, and AcP4) are arranged side by side in the X direction. An element isolation region (STI) lies between active regions (Ac). In other words, the active regions (Ac) are marked out by the element isolation regions (STI). The wells (P-well, N-well, and P-well) are continuous with each other under the element isolation regions STI.

Specifically, the active region AcP2 is an exposed region of the p-type well (P-well) which is virtually rectangular with its long side in the Y direction. The active region AcP1 is located next to the active region AcP2 and is an exposed region of the p-type well (P-well) which is virtually rectangular with its long side in the Y direction. Although only one memory cell region (1 bit) is shown in FIG. 49 for illustration convenience, memory cells are repeatedly disposed in the X direction and Y direction, so in the memory cell array, the active regions AcP1 and AcP2 are considered to continuously extend in the Y direction in a linear pattern.

The active region AcN1 is an exposed region of the n-type well (N-well) which is virtually rectangular with its long side in the Y direction. The active region AcN2 is an exposed region of the n-type well (N-well) which is virtually rectangular with its long side in the Y direction.

The active region AcP3 is an exposed region of the p-type well (P-well) which is located on the right of the n-type well as seen in the figure and virtually rectangular with its long side in the Y direction. The active region AcP4 is an exposed region of the p-type well (P-well) which is located next to the active region AcP3 and virtually rectangular with its long side in the Y direction. In the memory cell array, the active regions AcP3 and AcP4 extend in the Y direction linearly.

Gate electrodes G extend over the six active regions (AcP2, AcP1, AcN1, AcN2, AcP3, and AcP4) through a gate insulating film (GO) in a way to cross the active regions in the X direction, as components of the ten transistors as described above in the "Circuit Configuration" section.

Specifically, a common gate electrode G1 is located over the active regions AcP2, AcP1, and AcN1 in a way to cross them. Consequently TND2, TND1, and TP1 are disposed over the active region AcP2, AcP1, and AcN1 respectively and their gate electrodes (G) are coupled to each other. A gate electrode G2b is disposed over the active region AcP1 in parallel with the common gate electrode G1. Consequently, TNA1 is disposed over the active region AcP1 and a source/drain region of TNA1 and a source/drain region of TND1 are joined (into a common source/drain region). Also, a gate electrode G2a is disposed over the active region AcP2 in parallel with the common gate electrode G1. Consequently, TNA2 is disposed over the active region AcP2 and a source/drain region of TNA2 and a source/drain region of TND2 are joined (into a common source/drain region).

Also, a common gate electrode G3 is disposed over the active regions AcP4, AcP3, and AcN2 in a way to cross them. Consequently TND3, TND4, and TP2 are disposed over the active regions AcP4, AcP3, and AcN2 respectively and their gate electrodes (G) are coupled to each other. A common gate electrode G4b is disposed over the active region AcP3 in parallel with the common gate electrode G3. Consequently, TNA4 is disposed over the active region AcP3 and a source/drain region of TNA4 and a source/drain region of TND4 are joined (into a common source/drain region). Also, a common gate electrode G4a is disposed over the active region AcP4 in parallel with the common gate electrode G3. Consequently, TNA3 is disposed over the active region AcP4 and a source/drain region of TNA3 and a source/drain region of TND3 are joined (into a common source/drain region).

The above six gate electrodes G are arranged in line on a basis of three electrodes per line. Specifically, the common gate electrode G1 overlying and crossing the active regions AcP2, AcP1, and AcN1, the gate electrode G4b overlying the active region AcP3, and the gate electrode G4a overlying the active region AcP4 are arranged in a line extending in the X direction. The common gate electrode G3 overlying and crossing the active regions AcP4, AcP3, and AcN2, the gate electrode G2b overlying the active region AcP1, and the gate electrode G2a overlying the active region AcP2 are arranged in a line extending in the X direction.

As mentioned above, in this embodiment, each driver transistor is divided into two transistors (TND1 and TND2 or TND3 and TND4) which are located over different active regions (AcP2 and AcP1 or AcP4 and AcP3). In addition, since these active regions (AcP2 and AcP1 or AcP4 and AcP3) extend in the Y direction, the layout can be simplified and higher patterning accuracy can be achieved.

Therefore, as in the first embodiment, each active region (Ac) is not supposed to have a bent, portion (stepped portion) and it is easy to make the gate width ratio between the access transistor and driver transistor 1:2.

Also, since the access transistors (TNA1, TNA2, TNA3, and TNA4) are disposed in the active regions (AcP1, AcP2, AcP4, and AcP3) respectively, the number of active regions can be decreased. This permits simpler layout and contributes to reduction in memory cell region size.

Furthermore, since the active regions (Ac) extend in the Y direction, the gate electrodes (G) can extend in the X direction so not only the patterning accuracy of the active regions (Ac) but also that of the gate electrodes (G) can be improved. Particularly, as detailed in connection with the first embodiment, it is easy to adopt the multiple exposure technique in order to enhance the patterning accuracy. In addition, it is easy to create a simulation model, thereby contributing to improvement in inspection accuracy.

[P1, M1, P2]

As shown in FIG. 50, first plugs P1 are disposed over the source/drain regions of the ten transistors (TND2, TNA2, TNA1, TND1, TP1, TP2, TND4, TNA4, TND3, and TNA3) described above referring to FIG. 49. Also, first plugs P1 are disposed over the six gate electrodes described referring to FIG. 49.

First layer wirings M1 are disposed over the first plugs P1 for electrical couplings between first plugs P1.

Specifically, a first plug P1a over the common source/drain region of TND2 and TNA2, a first plug P1b over the common source/drain region of TND1 and TNA1, a first plug P1c over one source/drain region of TP1, and a first plug P1d over the common gate electrode G3 of TP2, TND3, and TND4 are coupled by a first layer wiring (first node wiring) M1A. This first layer wiring M1A corresponds to the storage node A shown in FIG. 48. In the above explanation, "one" means the upper, source/drain region of the relevant transistor (TP1) as seen in FIG. 49.

A first plug P1e over the common source/drain region of TND3 and TNA3, a first plug P1f over the common source/drain region of TND4 and TNA4, a first plug P1g over one source/drain region of TP2, and a first plug P1h over the common gate electrode G of TP1, TND1, and TND2 are coupled by a first layer wiring M1B. This first layer wiring M1B corresponds to the storage node B shown in FIG. 48. The first layer wiring M1 (M1A or M1B) corresponding to the storage node (A or B) generally extends in the X direction. In the above explanation, "one" means the lower source/drain region of the relevant transistor (TP2) as seen in FIG. 49.

A first plug P1j over the other source/drain region of TND2 and a first plug P1i over the other source/drain region of TND1 are coupled by a first layer wiring M1S. This first layer wiring M1S corresponds to the grounding voltage (VSS) in FIG. 48 and is coupled to a grounding voltage line (LVSS) as described later.

A first plug P1k over the other source/drain region of TND3 and a first plug P1m over the other source/drain region of TND4 are coupled by a first layer wiring M1S. This first layer wiring M1S corresponds to a grounding voltage (VSS) in FIG. 48 and is coupled to a grounding voltage line (LVSS) as described later.

Also, first layer wirings M1 (M1BL) are disposed over a first plug P1t over the other source/drain region of TNA2 and a first plug P1n over the other source/drain region of TNA1, and a first layer wiring M1 (M1D) is disposed over a first plug P1o over the other source/drain region of TP1. Also, first layer wirings M1 (M1BL) are disposed over a first plug P1u over the other source/drain region of TNA3 and a first plug P1p over the other source/drain region of TNA4 and a first layer wiring M1 (M1D) is disposed over a first plug P1q over the other source/drain region of TP2.

Also, first layer wirings M1W are disposed over a first plug P1r over the gate electrode (G2a) of TNA2, a first plug P1y over the gate electrode (G2b) of TNA1, a first plug P1w over the gate electrode (G4b) of TNA4, and a first plug P1s over the gate electrode (G4a) of TNA3 respectively.

The couplings between first plugs P1 by the first layer wirings M1 may be modified in various ways as far as the interconnection structure shown in the circuit diagram of FIG. 48 is satisfied.

[P2, M2, P3, M3]

As shown in FIG. 51, second plugs P2 are disposed over the first layer wirings M1 (M1S, M1D, M1W, and M1BL), among the first layer wirings M1 described above referring to FIG. 50, other than the first layer wirings M1 (M1A and M1B) corresponding to the storage nodes (A and B), and second layer wirings M2 are disposed over them.

Specifically, the first layer wiring M1W coupled to the gate electrode (G2a) of TNA2 is coupled to a second layer wiring M2W through a second plug P2. The first layer wiring M1W coupled to the gate electrode (G4b) of TNA4 is coupled to a second layer wiring M2W through a second plug P2. These two second layer wirings M2W extend in the Y direction in the memory cell region. Furthermore, third plugs P3 are disposed over the two second layer wirings M2W and a third layer wiring M3 (WLB) extends in the X direction so as to couple the two third plugs P3. This third layer wiring M3 (WLB) is a word line.

Specifically, the first layer wiring M1W coupled to the gate electrode (G4a) of TNA3 is coupled to a second layer wiring M2W through a second plug P2. The first layer wiring M1W coupled to the gate electrode (G2b) of TNA1 is coupled to a second layer wiring M2W through a second plug P2. These two second layer wirings M2W extend in the Y direction in the memory cell region. Furthermore, third plugs P3 are disposed over the two second layer wirings M2W and a third layer wiring M3 (WLA) extends in the X direction so as to couple the two third plugs P3. This third layer wiring M3 (WLA) is a word line.

The first layer wiring M1S coupled to the other source/drain region (P1j) of TND2 and the other source/drain region (P1i) of TND1 is coupled to a second layer wiring M2 (LVSS) through a second plug P2. This second layer wiring (LVSS) is a grounding voltage line. The first layer wiring M1S coupled to the other source/drain region (p1m) of TND4 and the other source/drain region (P1k) of TND3 is coupled to a second layer wiring M2 (LVSS) through a second plug P2. This second layer wiring (LVSS) is a grounding voltage line.

The first layer wiring M1BL coupled to the other source/drain region (P1t) of TNA2 is coupled to a second layer wiring M2 (BLB) through a second plug P2. The first layer wiring M1BL coupled to the other source/drain region (Pip) of TNA4 is coupled to a second layer wiring M2 (/BLB) through a second plug P2. These two second layer wirings M2 (bit lines BLB and /BLB) make up a bit line pair and extend in the Y direction.

The first layer wiring M1BL coupled to the other source/drain region (P1n) of TNA1 is coupled to a second layer wiring M2 (BLA) through a second plug P2. The first layer wiring M1BL coupled to the other source/drain region (p1u) of TNA3 is coupled to a second layer wiring M2 (/BLA) through a second plug P2. These two second layer wirings M2 (bit lines BLA and /BLA) make up a bit line pair and extend in the Y direction.

A second layer wiring M2 (LVDD) is disposed so as to couple the second plug P2 over the first layer wiring M1D coupled to the other source/drain region (P1o) of TP1 and the second plug P2 over the first layer wiring M1D coupled to the other source/drain region (P1q) of TP2. This second layer wiring M2 (LVDD) is a supply voltage line. This supply voltage line generally extends in the Y direction and includes a linear portion extending in the Y direction and portions which protrude from this linear portion and cover the second plugs P2.

The couplings of the second plugs P2, second layer wirings M2, third plugs P3, and third layer wiring M3 may be modified in various ways as far as the interconnection structure shown in the circuit diagram of FIG. 48 is satisfied. However, it should be noted that the layout can be simplified when the second layer wirings M2 generally extend in the Y direction and the third layer wirings M3 generally extend in the X direction as mentioned above. Although only one memory cell region (1 bit) is shown in FIGS. 49 to 51 for illustration convenience, memory cells are repeatedly disposed in the X direction and Y direction, so in the memory cell array, the grounding voltage lines (LVSS), bit lines (BLA, /BLA, BLB, /BLB) and supply voltage lines (LVDD) extend in the Y direction and the word lines (WLA, WLB) extend in the X direction.

In this embodiment, active regions are separated from each other (AcP2 and AcP1 or AcP4 and AcP3), so the area for the formation of the driver transistors (TND1 and TND2 or TND3 and TND4) is increased because of the existence of the element isolation region (STI) between the active regions. Using this area, the bit lines and grounding voltage lines (LVSS) can be disposed between the second layer wirings M2 (second layer wirings M2W coupled to the word lines) as mentioned above. Also, since each grounding voltage line LVSS is disposed between bit lines, interaction between bit lines (crosstalk noise) is reduced due to the shielding effect of the grounding voltage line (LVSS).

The patterns described above referring to FIGS. 49 to 51 are symmetrical with respect to the center point of the memory cell region.

Figure 52:
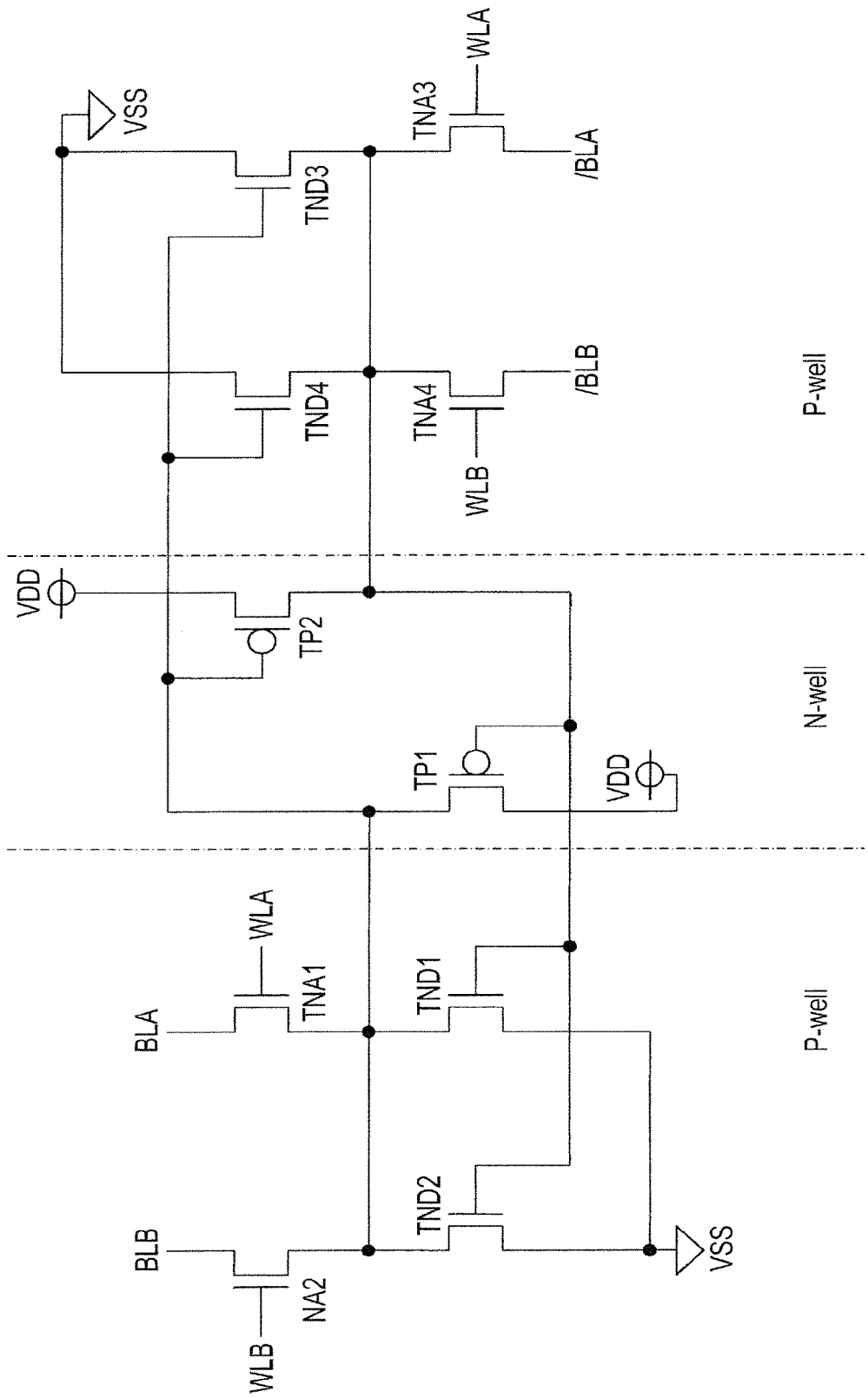
FIG. 52 is a circuit diagram showing that transistors are arranged in line with an SRAM memory cell layout according to the ninth embodiment.

For reference, FIG. 52 is a circuit diagram showing how the ten transistors (TND2, TNA2, TNA1, TND1, TP1, TP2, TND4, TNA4, TND3, and TNA3) are arranged and interconnected in accordance with the above "Memory Cell Pattern Layout."

Tenth Embodiment

Although the ninth embodiment concerns a dual-port SRAM (FIG. 48) in which the length of the virtually rectangular memory cell region's side extending in the Y direction is equivalent to the sum of lengths of two transistors, it is also possible that the length of the virtually rectangular memory cell region's side extending in the Y direction is equivalent to the sum of lengths of four transistors. A tenth embodiment concerns a dual-port SRAM (FIG. 53) in which the length of the virtually rectangular memory cell region's side extending in the Y direction is equivalent to the sum of lengths of four transistors, as explained below.

The SRAM memory cell circuit configuration in this embodiment is the same as that in the ninth embodiment which has been described referring to FIG. 48.

[Configuration of the SRAM]
[Memory Cell Structure]

Figure 53:
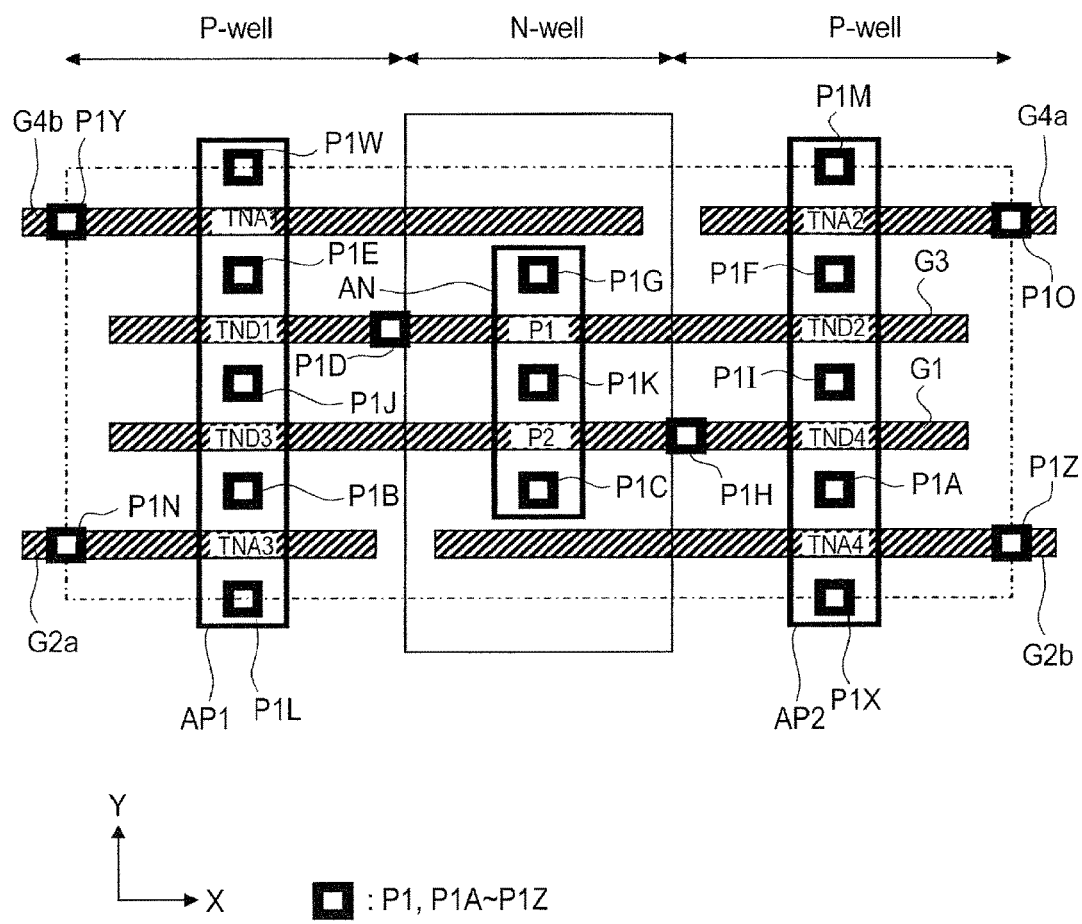
FIG. 53 is a plan view of the SRAM memory cell structure according to a tenth embodiment of the invention.
Figure 54:
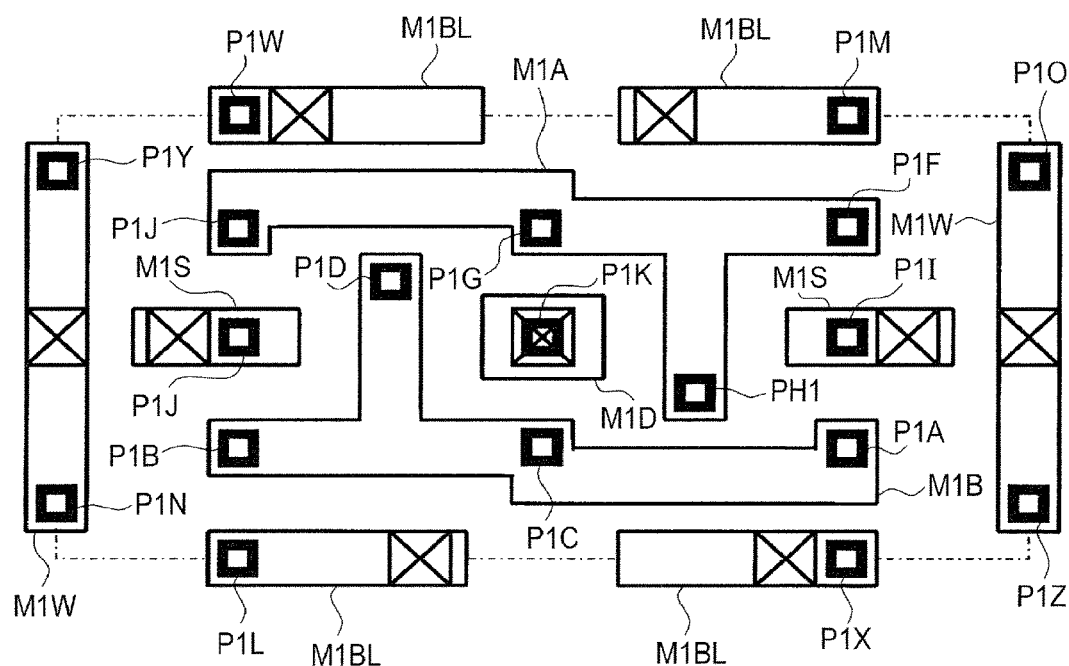
FIG. 54 is a plan view showing the SRAM memory cell structure according to the tenth embodiment.
Figure 55:
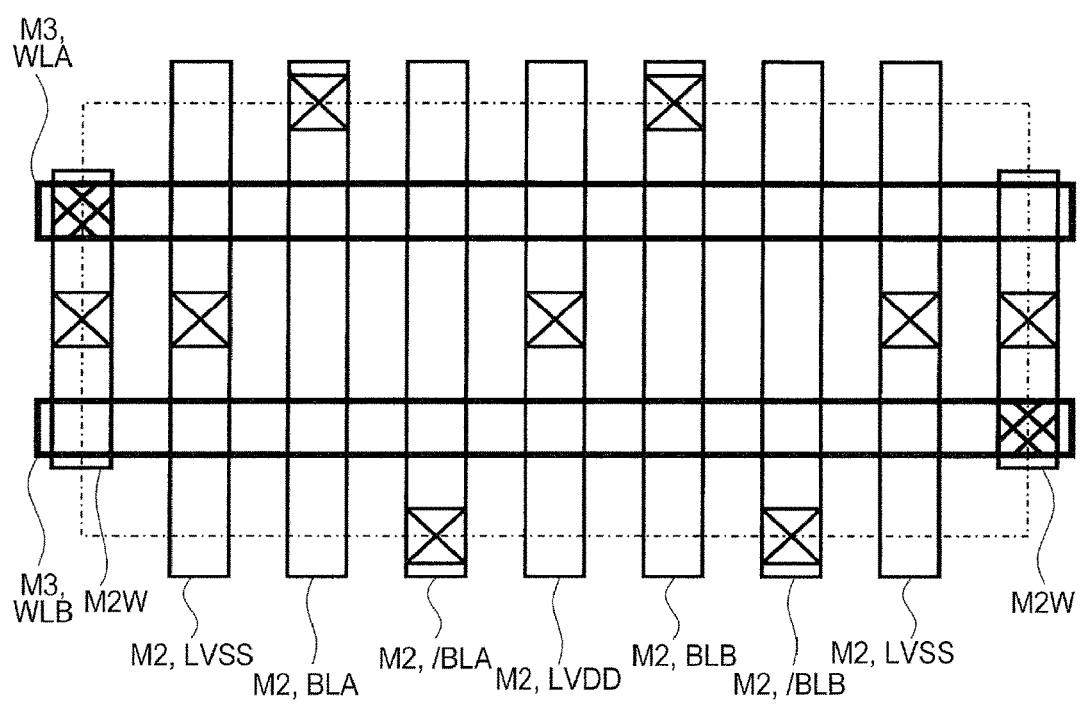
FIG. 55 is a plan view of the SRAM memory cell structure according to the tenth embodiment.

FIGS. 53 to 55 are plan views showing the SRAM memory cell structure according to the tenth embodiment. FIG. 53 shows the arrangement of active regions A, gate electrodes G, and first plugs P1. FIG. 54 shows the arrangement of the first plugs P1, first layer wirings M1, and second plugs P2. FIG. 55 shows the arrangement of the second plugs P2, second layer wirings M2, third plugs P3, and third layer wiring M3. When the plan views of FIGS. 53 and 54 are placed one upon the other with reference to the first plugs P1, the positional relation between the patterns shown in FIGS. 53 and 54 becomes clear. When the plan views of FIGS. 54 and 55 are placed one upon the other with reference to the second plugs P2, the positional relation between the patterns shown in FIGS. 54 and 55 becomes clear. The rectangular area surrounded by the chain line in the figures denotes one memory cell region (for 1 bit).

[Memory Cell Pattern Layout]
[A, G, P1]

As shown in FIG. 53, a p-type well (P-well), an n-type well (N-well) and a p-type well (P-well) are arranged side by side in the X direction over the semiconductor substrate. Although only one memory cell region (1 bit) is shown in FIG. 53, memory cells are repeatedly disposed in the X direction and Y direction (FIG. 12), so these wells (P-well, N-well and P-well) are considered to continuously extend in the Y direction. The exposed regions of these wells are active regions (A).

Over the semiconductor substrate, three active regions (AP1, AN, AP2) are arranged side by side in the X direction. An element isolation region (STI) lies between active regions (A). In other words, the active regions (A) are marked out by the element isolation regions (STI). The wells (P-well, N-well, and P-well) are continuous with each other under the element isolation regions STI.

Specifically, the active region AP1 is an exposed region of the p-type well (P-well) which is virtually rectangular with its long side in the Y direction in the memory cell region. Although only one memory cell region (1 bit) is shown in FIG. 53 for illustration convenience, memory cells are repeatedly disposed in the X direction and Y direction (FIG. 12), so in the memory cell array, the active region AP1 is considered to continuously extend in the Y direction in a linear form.

The active region AN is an exposed region of the n-type well (N-well) which is virtually rectangular with its long side in the Y direction.

The active region AP2 is an exposed region of the p-type well (P-well) which is located on the right of the n-type well as seen in FIG. 53 and virtually rectangular with its long side in the Y direction in the memory cell region. Memory cells are repeatedly disposed in the X direction and Y direction (FIG. 12), so in the memory cell array, the active region AP2 is considered to continuously extend in the Y direction in a linear form.

Gate electrodes G extend over the three active regions (AP1, AN, and AP2) through a gate insulating film (GO) in a way to cross the active regions in the X direction, as components of the ten transistors as described above in the "Circuit Configuration" section in the description of the ninth embodiment.

Specifically, two common gate electrodes (G1 and G3) are disposed over the active regions AP1, AN, and AP2 in a way to cross the active regions. Consequently TND2 (and TND4 are disposed in series over the active region AP2, sharing a source/drain region and TND1 and TND3 are disposed in series over the active region AP1, sharing a source/drain region, and TP1 and TP2 are disposed in series over the active region AN, sharing a source/drain region. The gate electrodes (G) of TND1, TP1, and TND2 are joined into the common gate electrode G3 and the gate electrodes (G) of TND3, TP2, and TND4 are joined into the common gate electrode G1. These two common gate electrodes (G1 and G3) extend in parallel with each other in the X direction.

A gate electrode G4b is disposed over the active region AP1 in parallel with the two common gate electrodes (G1 and G3). Consequently, TNA1 is disposed over the active region AP1 and a source/drain region of TNA1 and a source/drain region of TND1 are joined (into a common source/drain region). Also, another gate electrode G2a is disposed over the active region AP1 in parallel with the two common gate electrodes (G1 and G3). Consequently, TNA3 is disposed over the active region AP1 and a source/drain region of TNA3 and a source/drain region of TND3 are joined (into a common source/drain region).

A gate electrode G4a is disposed over the active region AP2 in parallel with the two common gate electrodes (G1 and G3). Consequently, TNA2 is disposed over the active region AP2 and a source/drain region of TNA2 and a source/drain region of TND2 are joined (into a common source/drain region). Also, another gate electrode G2b is disposed over the active region AP2 in parallel with the two common gate electrodes (G1 and G3). Consequently, TNA4 is disposed over the active region AP2 and a source/drain region of TNA4 and a source/drain region of TND4 are joined (into a common source/drain region).

As mentioned above, in this embodiment, each driver transistor is divided into two transistors (TND1 and TND2, or TND3 and TND4) and these transistors are located over different active regions (AP1 and AP2). In addition, since these active regions (AP1 and AP2) extend in the Y direction, the layout can be simplified and higher patterning accuracy can be achieved.

Therefore, as in the first embodiment, each active region (A) is not supposed to have a bent portion (stepped portion) and it is easy to make the gate width ratio between the access transistor and driver transistor 1:2.

Furthermore, since access transistors (TNA1, TNA2, TNA3, and TNA4) are also disposed over the active regions (AP1 and AP2), the number of active regions is decreased. This permits simpler layout and contributes to reduction in memory cell region size.

Furthermore, since the active regions (A) extend in the Y direction, the gate electrodes (G) can extend in the X direction so not only the patterning accuracy of the active regions (A) but also that of the gate electrodes (G) can be improved. Particularly, as detailed in connection with the first embodiment, it is easy to adopt the multiple exposure technique in order to enhance the patterning accuracy. In addition, it is easy to create a simulation model, thereby contributing to improvement in inspection accuracy.

[P1, M1, P2]

As shown in FIG. 54, first plugs P1 are disposed over the source/drain regions of the ten transistors (TND2, TNA2, TNA1, TND1, TP1, TP2, TND4, TNA4, TND3, and TNA3) described above referring to FIG. 53. Also, first plugs P1 are disposed over the six gate electrodes described referring to FIG. 53.

First layer wirings M1 are disposed over the first plugs P1 for electrical couplings between first plugs P1.

Specifically, a first plug P1F over the common source/drain region of TNA2 and TND2, a first plug P1E over the common source/drain region of TND1 and TNA1, a first plug P1G over one source/drain region of TP1, and a first plug P1H over the common gate electrode (G1) of TP2, TND3, and TND4 are coupled by a first layer wiring (first node wiring) M1A. This first layer wiring M1A corresponds to the storage node A shown in FIG. 48. In the above explanation, "one" means the upper source/drain region of the relevant transistor (TP1) as seen in FIG. 53.

A first plug P1B over the common source/drain region of TNA3 and TND3, a first plug P1A over the common source/drain region of TND4 and TNA4, a first plug P1C over one source/drain region of TP2, and a first plug P1D over the common gate electrode (G3) of TP1, TND1, and TND2 are coupled by a first layer wiring (second node wiring) M1B. This first layer wiring M1B corresponds to the storage node B shown in FIG. 48. In the above explanation, "one" means the lower source/drain region of the relevant transistor (TP2) as seen in FIG. 53.

A first layer wiring M1S' is disposed over a first plug P1I over the common source/drain region of TND2 and TND4. A first layer wiring M1S is disposed over a first plug P1J over the common source/drain region of TND1 and TND3. These first layer wirings M1S correspond to the grounding voltage (VSS) in FIG. 48 and are coupled to grounding voltage lines (LVSS) as described later.

Also a first layer wiring (pad region) M1D is disposed over a first plug P1K over the common source/drain region of TP1 and TP2. This first layer wiring M1D corresponds to the supply voltage (VDD) in FIG. 48 and is coupled to a supply voltage line (LVDD) as described later.

First layer wirings M1BL are disposed over a first plug P1W over the other source/drain region of TNA1, and a first plug P1M over the other source/drain region of TNA2 respectively.

First layer wirings M1BL are disposed over a first plug P1L over the other source/drain region of TNA3, and a first plug P1X over the other source/drain region of TNA4 respectively.

Also, a first layer wiring M1W is disposed to couple a first plug P1Y over the gate electrode (G4b) of TNA1 and a first plug P1N over the gate electrode (G2a) of TNA3. A first layer wiring M1W is disposed to couple a first plug P1O over the gate electrode (G4a) of TNA2 and a first plug P1Z over the gate electrode (G2b) of TNA4.

The couplings between first plugs P1 by the first layer wirings M1 may be modified in various ways as far as the interconnection structure shown in the circuit diagram of FIG. 48 is satisfied.

[P2, M2, P3, M3]

As shown in FIG. 55, second plugs P2 are disposed over the first layer wirings M1 (M1S, M1D, M1W, M1BL), among the first layer wirings M1 described above referring to FIG. 54, other than the first layer wirings M1 (M1A and M1B) corresponding to the storage nodes (A and B), and second layer wirings M2 are disposed over them.

Specifically, the first layer wiring M1W coupled to the gate electrodes (G4b, G2a) of TNA1 and TNA3 is coupled to a second layer wiring M2W through a second plug P2. A third layer wiring M3 (WLA) is disposed over the second layer wiring M2W through a third plug P3. This third layer wiring M3 (WLA) is a word line extending in the X direction. The first layer wiring M1W coupled to the gate electrodes (G4a, G2b) of TNA2 and TNA4 is coupled to a second layer wiring M2W through second plug P2. A third layer wiring M3 (WLB) is disposed over the second layer wiring M2W through a third plug P3. This third layer wiring M3 (WLB) is a word line extending in the X direction.

The first layer wiring M1S coupled to the common source/drain region (P1I) of TND2 and TND4 is coupled to a second layer wiring M2 (LVSS) through a second plug 22. This second layer wiring M2 (LVSS) is a grounding voltage line. The first layer wiring M1S coupled to the common source/drain region (P1J) of TND3 and TND1 is coupled to a second layer wiring M2 (LVSS) through a second plug P2. This second layer wiring M2 (LVSS) is a grounding voltage line. These two grounding voltage lines extend in the Y direction.

The first layer wiring M1BL coupled to the other source/drain region (P1M) of TNA2 is coupled to a second layer wiring M2 (BLB) through a second plug P2. The first layer wiring M1BL coupled to the other source/drain region (P1X) of TNA4 is coupled to a second layer wiring M2 (/BLB) through a second plug P2. These two second layer wirings M2 (bit lines BLB and /BLB) make up a bit line pair and extend in the Y direction.

The first layer wiring M1BL coupled to the other source/drain region (P1W) of TNA1 is coupled to a second layer wiring M2 (BLA) through a second plug P2. The first layer wiring M1BL coupled to the other source/drain region (P1L) of TNA3 is coupled to a second layer wiring M2 (/BLA) through a second plug P2. These two second layer wirings M2 (bit lines BLA and /BLA) make up a bit line pair and extend in the Y direction.

A second layer wiring M2 (LVDD) is disposed over the first layer wiring M1D coupled to the common source/drain region (P1K) of TP1 and TP2 through a second plug P2. This second layer wiring M2 (LVDD) is a supply voltage line extending in the Y direction.

The couplings of the second plugs P2, second layer wirings M2, third plugs P3, and third layer wiring M3 may be modified in various ways as far as the interconnection structure shown in the circuit diagram of FIG. 48 is satisfied. However, it should be noted that the layout can be simplified when the second layer wirings M2 generally extend in the Y direction and the third layer wirings M3 generally extend in the X direction as mentioned above. Although only one memory cell region (1 bit) is shown in FIGS. 53 to 55 for illustration convenience, memory cells are repeatedly disposed in the X direction and Y direction, so in the memory cell array, the grounding voltage lines (LVSS), bit lines (BLA, /BLA, BLB, /BLB) and supply voltage lines (LVDD) extend in the Y direction and the word lines (WLA, WLB) extend in the X direction.

In this embodiment, since each grounding voltage line (LVSS) lies between a second layer wiring M2W and a bit line, interaction between wirings (crosstalk noise) is reduced due to the shielding effect of the grounding voltage line.

The patterns described above referring to FIGS. 53 to 55 are symmetrical with respect to the center point of the memory cell region.

Figure 56:
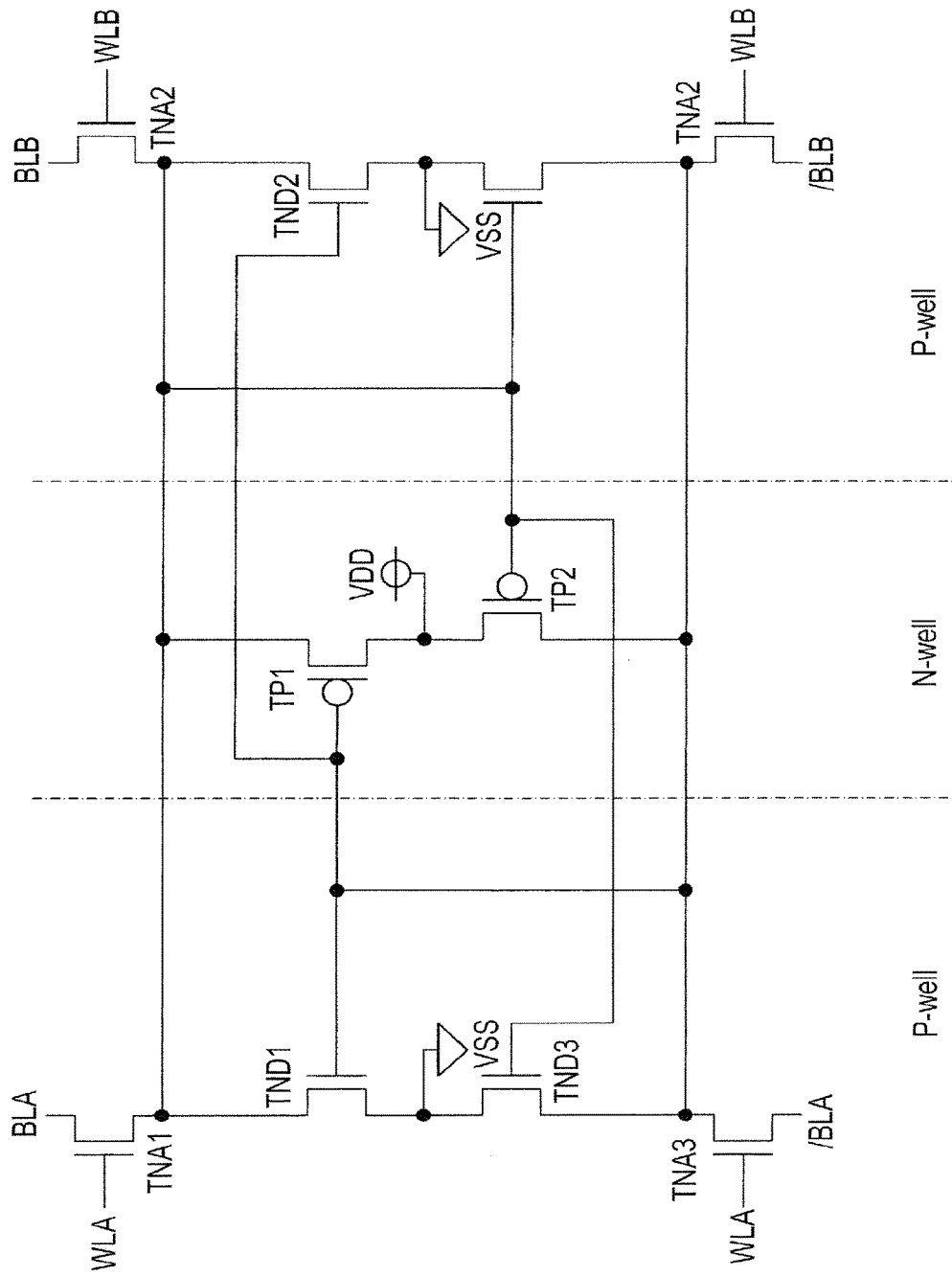
FIG. 56 is a circuit diagram showing that transistors are arranged in line with an SRAM memory cell layout according to the tenth embodiment.

For reference, FIG. 56 is a circuit diagram showing how the ten transistors (TND2, TNA2, TNA1, TND1, TP1, TP2, TND4, TNA4, TND3, and TNA3) are arranged and interconnected in accordance with the above "Memory Cell Pattern Layout."

Eleventh Embodiment

As for the SRAM structure, the conductivity type of each transistor in the circuit according to the first embodiment (FIG. 1) may be reversed. In the SRAM memory cell circuit configuration in an eleventh embodiment, the conductivity types of the transistors are opposite to those in the first embodiment.

[Circuit Configuration]

Figure 57:
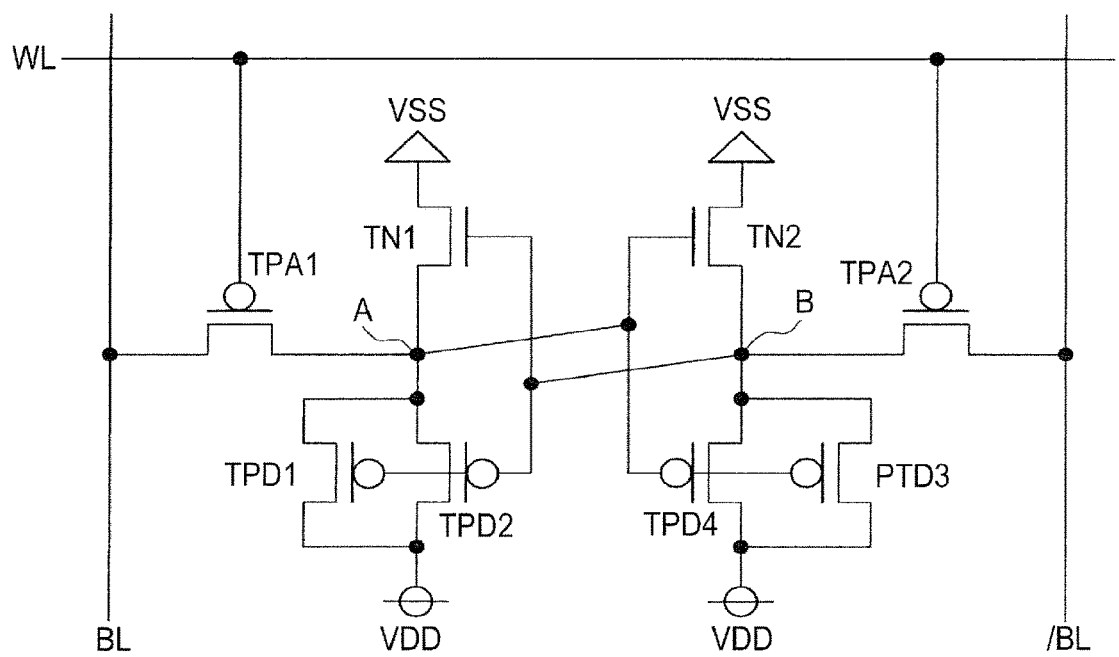
FIG. 57 is an equivalent circuit diagram showing an SRAM memory cell according to an eleventh embodiment of the invention.

FIG. 57 is an equivalent circuit diagram showing the SRAM memory cell according to the eleventh embodiment. As shown in FIG. 57, the memory cell includes eight transistors as in the first embodiment but it is different from the first embodiment in that p-type transistors (TPA1, TPA2, TPD1, TPD2, TPD3, TPD4) are employed in place of the n-type transistors (TNA1, TNA2, TND1, TND2, TND3, TND4) shown in FIG. 1. Also, n-type transistors (TN1, TN2) are employed in place of the p-type transistors (TP1, TP2) shown in FIG. 1.

In other words, the conductivity type of each transistor in this embodiment is opposite to that in the first embodiment.

The p-type (second conductivity type in this embodiment) transistors (TPA1, TPA2, TPD1, TPD2, TPD3, TPD4) are coupled to the supply voltage (VDD, secondary supply voltage, voltage different from the secondary supply voltage, or higher voltage than the secondary supply voltage in this embodiment).

The n-type (first conductivity type in this embodiment) transistors (TN1, TN2) are coupled to the grounding voltage (VSS, primary supply voltage in this embodiment).

The rest of the circuit is the same as in the circuit configuration shown in FIG. 1, so detailed description of the coupling arrangement of the transistors is omitted here.

As mentioned above, in the SRAM memory cell according to the eleventh embodiment as well, each driver transistor is divided into two transistors (TPD1 and TPD2, TPD3 and TPD4).

[Configuration of the SRAM]
[Memory Cell Structure]

Figure 58:
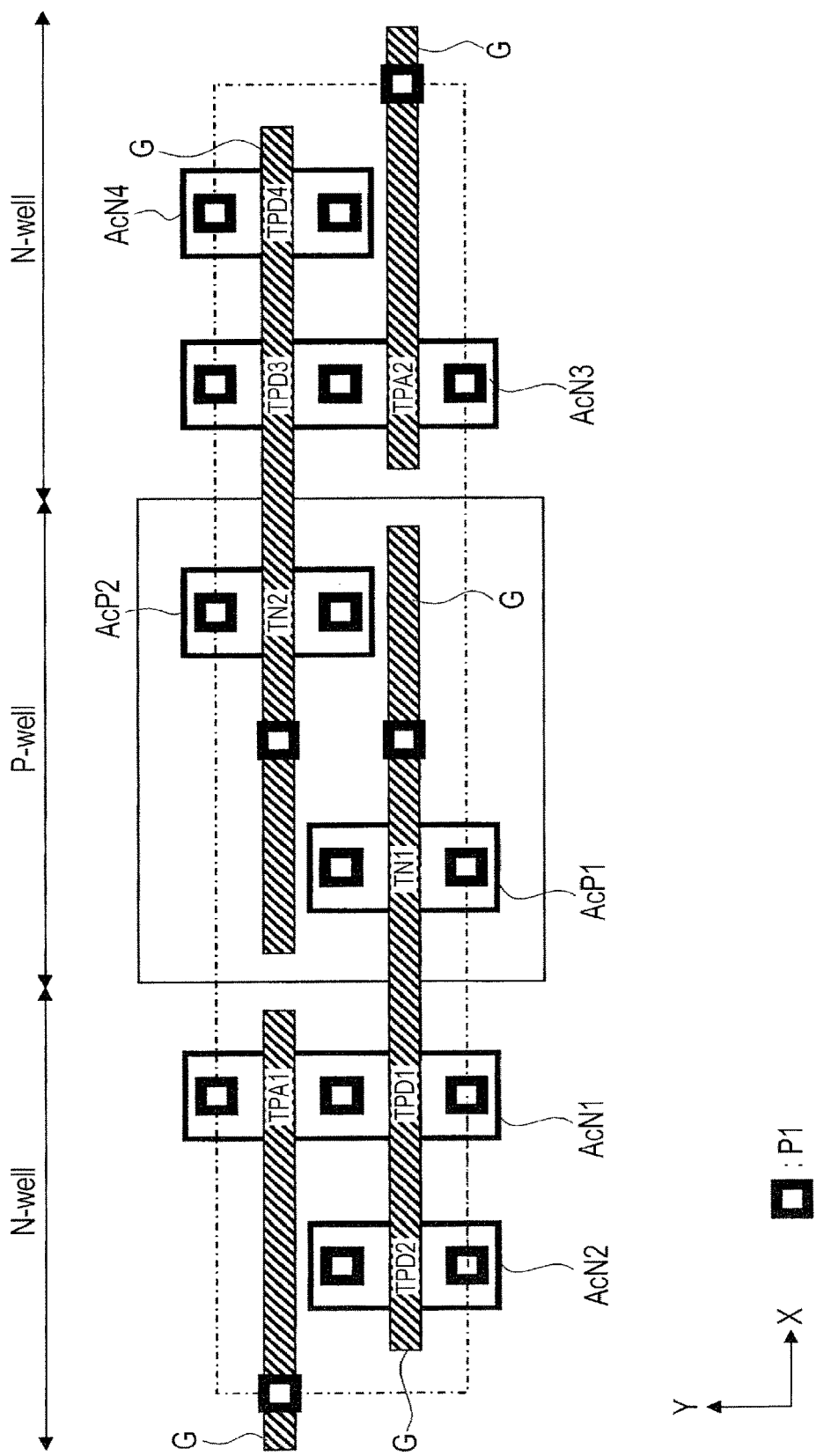
FIG. 58 is a plan view of the SRAM memory cell structure according to the eleventh embodiment.
Figure 59:
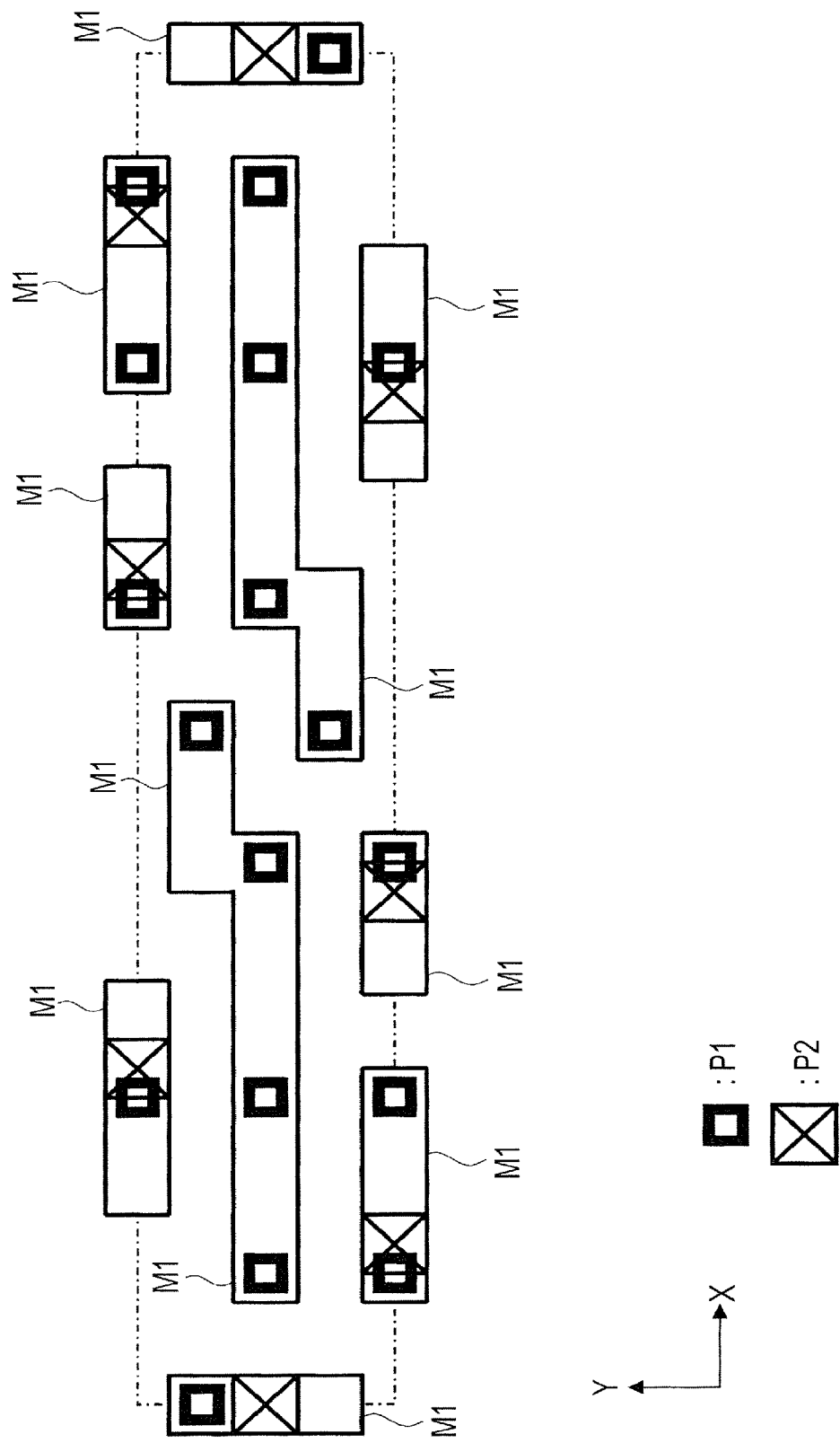
FIG. 59 is a plan view of the SRAM memory cell structure according to the eleventh embodiment.
Figure 60:
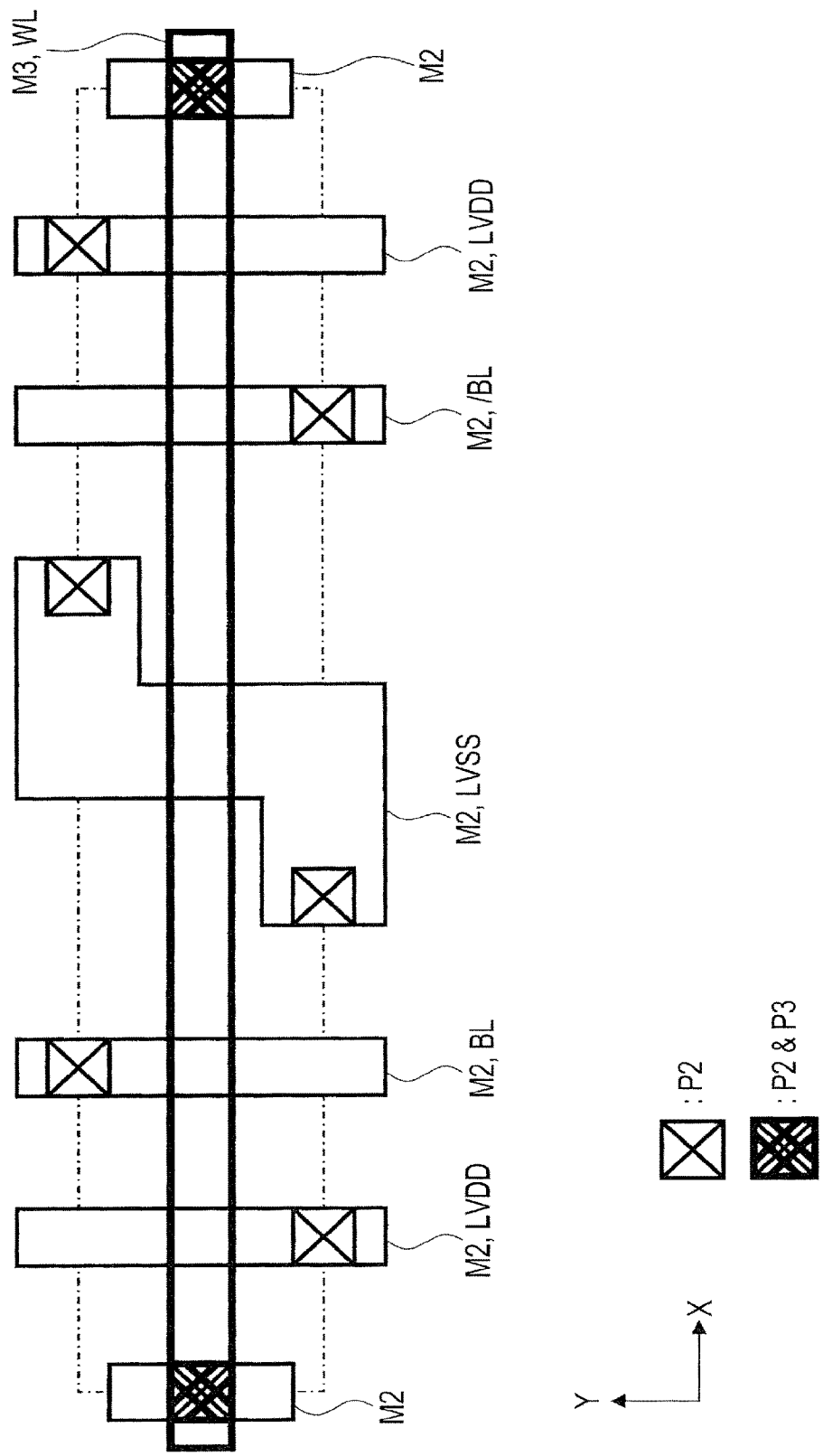
FIG. 60 is a plan view of the SRAM memory cell structure according to the eleventh embodiment.

FIGS. 58 to 60 are plan views showing the SRAM memory cell structure according to the eleventh embodiment. FIG. 58 shows the arrangement of active regions Ac, gate electrodes G, and first plugs P1. FIG. 59 shows the arrangement of the first plugs P1, first layer wirings M1, and second plugs P2. FIG. 60 shows the arrangement of the second plugs P2, second layer wirings M2, third plugs P3, and third layer wiring M3. When the plan views of FIGS. 58 and 59 are placed one upon the other with reference to the first plugs P1, the positional relation between the patterns shown in FIGS. 58 and 59 becomes clear. When the plan views of FIGS. 59 and 60 are placed one upon the other with reference to the second plugs P2, the positional relation between the patterns shown in FIGS. 59 and 60 becomes clear. The rectangular area surrounded by the chain line in the figures denotes one memory cell region (for 1 bit).

[Memory Cell Pattern Layout]

As mentioned above, the SRAM memory cell according to this embodiment includes transistors which are opposite to the transistors in the first embodiment (FIG. 1) in terms of conductivity type. Therefore, as shown in FIG. 58, the conductivity types of the wells are opposite to those of the wells in the first embodiment (FIG. 2). Six active regions (AcN2, AcN1, AcP1, AcP2, AcN3, and AcN4) are arranged side by side in the X direction. An element isolation region (STI) lies between active regions (Ac). In other words, the active regions (Ac) are marked out by the element isolation regions (STI).

The patterns in the eleventh embodiment are the same as in the first embodiment (FIG. 2) except that among the six active regions (AcN2, AcN1, AcP1, AcP2, AcN3, and AcN4), AcN2, AcN1, AcN3, and AcN4 are exposed regions of the n-type wells (N-well) and AcP1 and AcP2 are exposed regions of the p-type well (P-well). Inevitably, the conductivity types of impurities implanted into the source/drain regions of the transistors are reversed. Specifically, the source/drain regions of the active regions as the exposed regions of the n-type wells (N-well) have p-type conductivity while the source/drain regions of the active regions as the exposed regions of the p-type well (P-well) have n-type conductivity.

The arrangement of the gate electrodes G and first plugs P1 is the same as in the first embodiment (FIG. 2), so description thereof is omitted. Also, the arrangement of the first plugs P1, first layer wirings M1, and second plugs P2 as shown in FIG. 59 is the same as in the first embodiment (FIG. 3). Also, the arrangement of the second plugs P2, second layer wirings M2, third plugs P3, and third layer wirings M3 as shown in FIG. 60 is the same as in the first embodiment (FIG. 4) except that second layer wirings M2 (LVDD) are disposed in pace of the grounding voltage lines (LVSS) in the first embodiment (FIG. 4) and a second layer wiring M2 (LVSS) is disposed in place of the second layer wiring M2 (LVDD), so description thereof is omitted.

As in the first embodiment, in this embodiment, each driver transistor is divided into two transistors (TPD1 and TPD2 or TPD3 and TPD4) and these transistors are disposed over different active regions (AcN2 and AcN1 or AcN4 and AcN3). In addition, since these active regions (AcN2 and AcN1, AcN4, and AcN3) extend in the Y direction, the layout can be simplified and higher patterning accuracy can be achieved. Furthermore, since the access transistors (TPA1 and TPA2) are disposed over the active regions, the number of active regions is decreased.

In addition, it is possible to make the driving performance of the driver transistor (TPD1, TPD3) larger than that of the access transistor (TPA1, TPA2). For example, by making the ratio in width (length in the X direction) between the active regions (AcN2 and ACN1 or AcN4 and AcN3) 1:1, the gate width ratio between the access transistor and driver transistor can be made 1:2.

Since active regions are separated from each other (TPD1 and TPD2 or TPD3 and TPD4), each active region can be virtually rectangular, namely it is not supposed to have a bent portion (stepped portion) as mentioned above. Consequently, patterning accuracy is improved and the characteristics of the transistors formed over the active regions (Ac) are improved. Furthermore, product quality instability is reduced and the performance characteristics of the SRAM memory cell array are improved. Also, production yield is increased.

Also, since not only a driver transistor (TPD1 or TPD3) but also an access transistor (TPA1 or TPA2) are disposed in one of the active regions (for TPD1 and TPD2 or TPD3 and TPD4), the number of active regions is decreased. This permits simpler layout and contributes to reduction in memory cell region size.

Furthermore, since the active regions (Ac) extend in the Y direction, the gate electrodes (G) can extend in the X direction so not only the patterning accuracy of the active regions (Ac) but also that of the gate electrodes (G) can be improved. Particularly, as detailed above in connection with the first embodiment, it is possible to adopt the multiple exposure technique in order to enhance the patterning accuracy. In addition, it is easy to create a simulation model, thereby contributing to improvement in inspection accuracy.

As in the first embodiment, the second layer wirings M2 generally extend in the Y direction and the third layer wiring M3 generally extends in the X direction (FIG. 60), so the layout can be simplified.

In this embodiment, active regions are separated from each other (AcN2 and AcN1 or AcN4 and AcN3), so the area for the formation of the driver transistors (TPD1 and TPD2 or TPD3 and TPD4) is increased because of the existence of the element isolation region (STI) between the active regions. This area can be used for the supply voltage lines (LVDD).

The patterns described above referring to FIGS. 58 to 60 are symmetrical with respect to the center point of the memory cell region.

Figure 61:
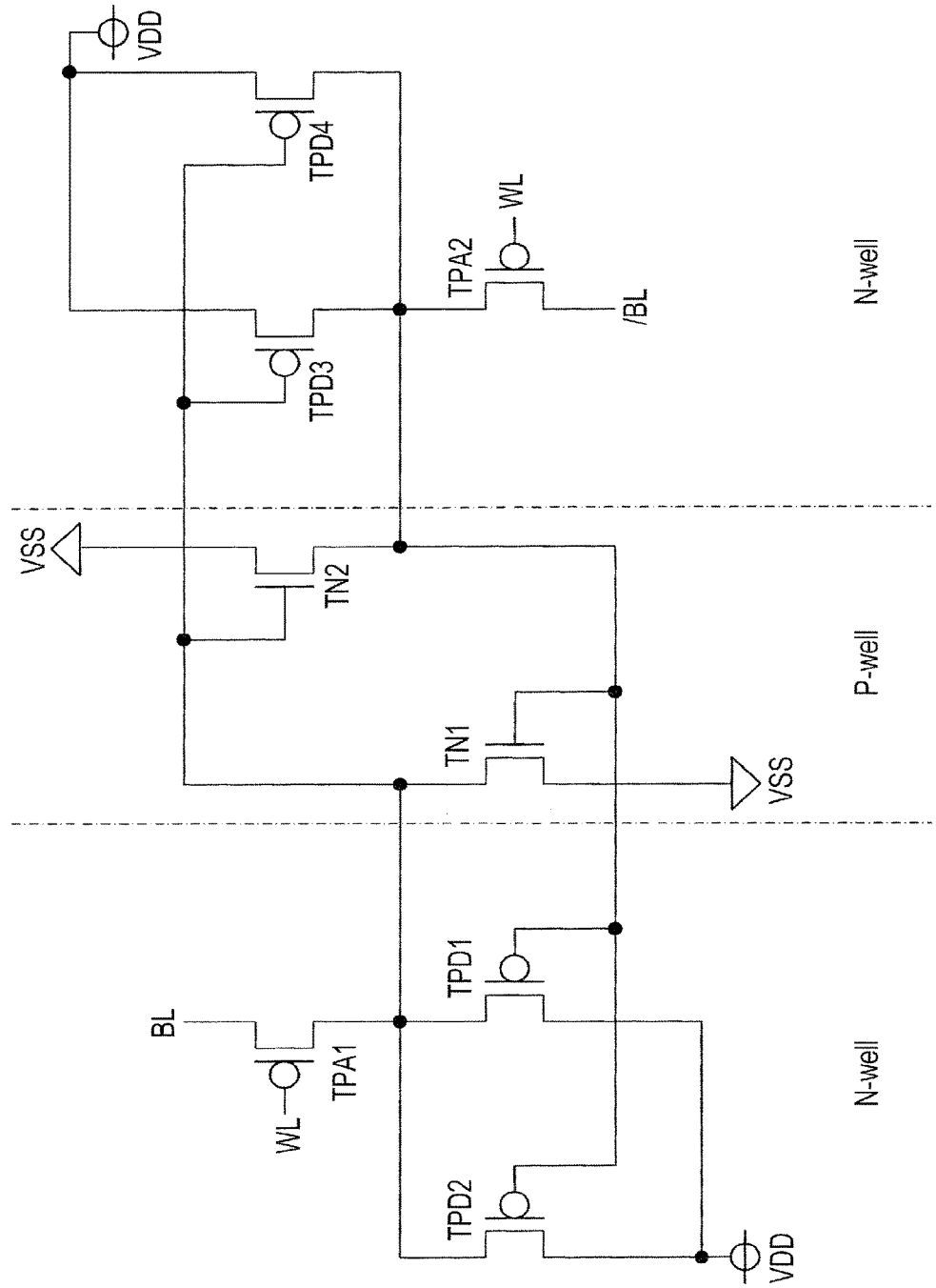
FIG. 61 is a circuit diagram showing that transistors are arranged in line with an SRAM memory cell layout according to the eleventh embodiment.

For reference, FIG. 61 is a circuit diagram showing how the eight transistors (TPD2, TPA1, TPD1, TN1, TN2, TPD3, TPA2, and TPD4) are arranged and interconnected in accordance with the above "Memory Cell Pattern Layout."

Twelfth Embodiment

Figure 62:
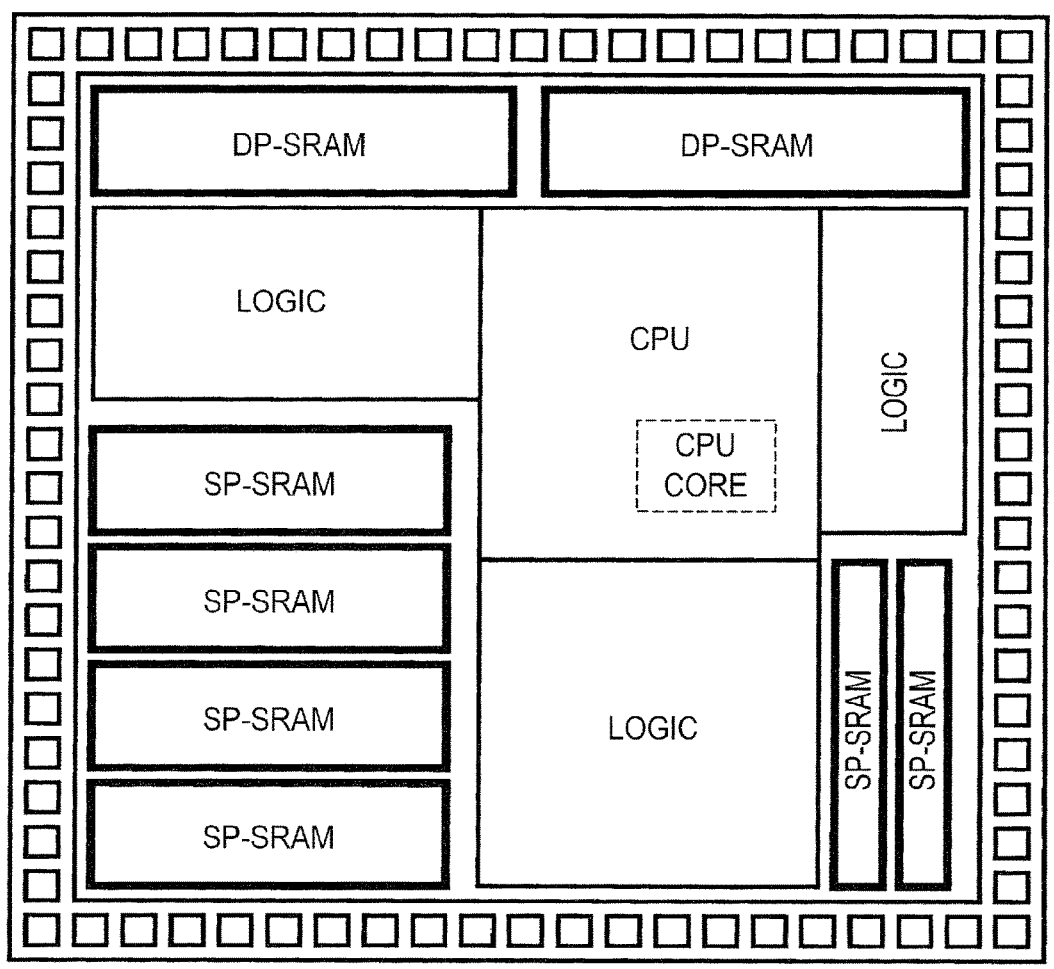
FIG. 62 shows the layout of a semiconductor chip according to a twelfth embodiment of the invention.

The SRAM which has been shown above by the detailed description of the preferred embodiments may be applied to any type of semiconductor device (including a semiconductor component and electronic equipment). For example, the SRAM can be incorporated in a semiconductor chip which has a system including an SoC (System-on-a-chip) or a microcomputer. FIG. 62 shows the layout of a semiconductor chip according to the twelfth embodiment. As shown in FIG. 62, the semiconductor chip includes a CPU (Central Processing Unit), SRAMs, and a logic circuit (LOGIC). In the chip, single-port SRAMs (SP-SRAM) and dual-port SRAMs (DP-SRAM) as mentioned above are used. In addition to the SRAMs, the chip may include another type of memory such as an EEPROM (Electrically Erasable Programmable Read Only Memory) or may incorporate an analog circuit.

A CPU, or central processing unit, is the heart of a computer. The CPU reads a command from a storage unit and interprets it and performs a variety of calculations and control functions in accordance with the command. The CPU incorporates a CPU core in which SRAMs are mounted. High-performance SRAMs are used as the SRAMs in the CPU core. The SRAMs according to the first to eleventh embodiments detailed above are suitable as such SRAMs. It is needless to say that the SRAMs according to the first to eleventh embodiments may be used for the single-port SRAMs (SP-RAM) and dual-port SRAMs (DP-SRAM) in the chip.

The characteristics of a microcomputer can be improved by mounting the SRAMs according to the first to eleventh embodiments in the microcomputer.

The invention made by the present inventors has been so far explained concretely in reference to the first to eleventh embodiments thereof. However, the invention is not limited thereto and it is obvious that these details may be modified in various ways without departing from the spirit and scope thereof.

Figure 63:
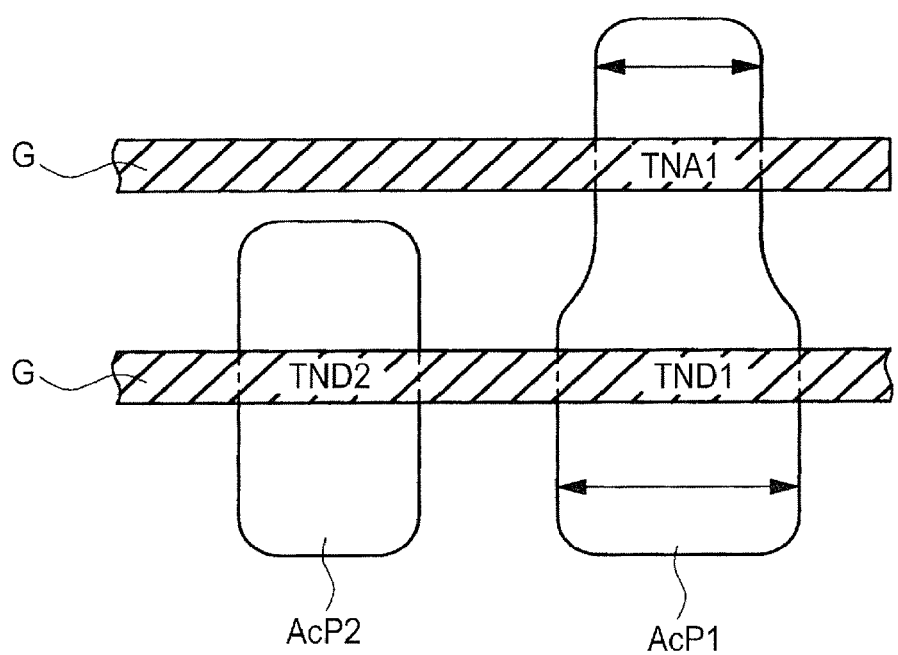
FIG. 63 is a plan view showing a structure example of one part of the SRAM memory cell according to the first embodiment.

For example, in the first embodiment and so on, the active regions (AcP1, AcP2, and so on) are defined as virtually rectangular; however, even though the shape of an active region on the reticle (exposure mask) is rectangular, the actual shape of the finished active region after exposure and etching is not limited to a rectangle. For example, the active region may have round corners as shown in FIG. 63. Also, the width of one portion of an active region may be different from the width of another portion thereof. Even if that is the case, the same advantageous effects as mentioned above are achieved, so the present invention does not exclude such active region shapes as shown in FIG. 63.

Furthermore, although the gate electrodes (G) shown in many figures (FIG. 2 and so on) are rectangular, their corners may be round in the finished form. The present invention does not exclude such corner-rounded gate electrodes.

Some of the above preferred embodiments may be combined. For example, the shared first plugs SP1 in the fifth embodiment (FIG. 30) may be applied to the pattern layout in the first embodiment (FIG. 2). Also, the n-type well (N-well) pattern in the sixth embodiment (FIG. 34) may be applied to TP1 and TP2 in the first embodiment (FIG. 2). The shared first plugs SP1 may be applied there. Also, a layout in which p-type wells (P-well) are both located on one side like the seventh embodiment (FIG. 38) may be applied to the pattern layout in the first embodiment. Also the SRAM according to the eleventh embodiment in which the conductivity types of transistors are reversed may be applied to the pattern layouts in the other embodiments. Thus, various changes may be made without departing from the spirit and scope of the present invention.

The present invention may be applied to semiconductor devices and particularly to a semiconductor device having an SRAM.

What is claimed is:

1. A semiconductor device comprising:
a memory cell including:
a first conductivity type first MIS transistor coupled between a first voltage and a first node, and including a first gate electrode having first sidewalls on both sides thereof;
a second conductivity type first MIS transistor coupled between the first node and a second voltage different from the first voltage, and including a second gate electrode having second sidewalls on both sides thereof;
a second conductivity type second MIS transistor coupled between the first node and the second voltage in parallel with the second conductivity type first MIS transistor, and including a third gate electrode having third sidewalls on both sides thereof;
a first conductivity type second MIS transistor coupled between the first voltage and a second node, and including a fourth gate electrode having fourth sidewalls on both sides thereof;
a second conductivity type third MIS transistor coupled between the second node and the second voltage, and including a fifth gate electrode having fifth sidewalls on both sides thereof;
a second conductivity type fourth MIS transistor coupled between the second node and the second voltage in parallel with the second conductivity type third MIS transistor, and including a sixth gate electrode having sixth sidewalls on both sides thereof;
a second conductivity type fifth MIS transistor coupled between the first node and a first bit line, and including a seventh gate electrode having seventh sidewalls on both sides thereof;
a second conductivity type sixth MIS transistor coupled between the second node and a second bit line, and including an eighth gate electrode having eighth sidewalls on both sides thereof;
a second conductivity type seventh transistor coupled between the first node and a third bit line, and including a ninth gate electrode having ninth sidewalls on both sides thereof; and
a second conductivity type eighth transistor coupled between the second node and a fourth bit line, and including a tenth gate electrode having tenth sidewalls on both sides thereof,
the device further comprising:
a monolithic first active region in which the second conductivity type first MIS transistor and the second conductivity type fifth MIS transistor are disposed;
a second active region separated from the first active region, in which the second conductivity type second MIS transistor is disposed;
a monolithic third active region in which the second conductivity type third MIS transistor and the second conductivity type sixth MIS transistor are disposed; and
a fourth active region separated from the third active region, in which the second conductivity type fourth MIS transistor is disposed,
wherein the first to fourth active regions are arranged side by side in a first direction and spaced from each other,
wherein a first gate wiring extends in the first direction over the first active region,
wherein a second gate wiring extends in the first direction over the first active region and the second active region, wherein a third gate wiring extends in the first direction over the third active region, wherein a fourth gate wiring extends in the first direction over the third active region and the fourth active region, wherein a fifth gate wiring extends in the first direction over the second active region, wherein a sixth gate wiring extends in the first direction over the fourth active region, wherein the seventh transistor is disposed in the second active region, wherein the eighth transistor is disposed in the fourth active region, wherein the first active region extends in a second direction intersecting with the first direction with a same first width, wherein the second active region extends in a second direction with a same second width, wherein the third active region extends in a second direction with a same third width, and wherein the fourth active region extends in the second direction with a same fourth width.

2. The semiconductor device according to claim 1, further comprising:

a plurality of wiring layers stacked one upon another including wirings, wherein the first gate wiring is coupled to a first wiring extending in the second direction, wherein one end of the second conductivity type first MIS transistor is coupled to a second wiring which is in the same layer as the first wiring, extending in the second direction, and coupled to the first voltage, wherein one end of the second conductivity type fifth MIS transistor is coupled to a third wiring which is in the same layer as the first wiring, extending in the second direction, and which becomes the first bit line, and wherein the third wiring lies between the first wiring and the second wiring.

3. The semiconductor device according to claim 2, wherein the fifth gate wiring is coupled to a fifth wiring extending in the second direction, wherein one end of the second conductivity type seventh MIS transistor is coupled to a fourth wiring which is in the same layer as the first wiring, extending in the second direction, and which becomes the second bit line, and wherein the fourth wiring lies between the second wiring and the fifth wiring.

4. The semiconductor device according to claim 1, wherein the first width, the second width, the third width and the fourth width are substantially equal.

\* \* \* \* \*